US012707904B2

(12) United States Patent
Scheideler et al.

(10) Patent No.: US 12,707,904 B2
(45) Date of Patent: Aug. 11, 2026

(54) LIQUID METAL PRINTED 2D ULTRAHIGH MOBILITY CONDUCTING OXIDE TRANSISTORS

(71) Applicant: TRUSTEES OF DARTMOUTH COLLEGE, Hanover, NH (US)

(72) Inventors: William Scheideler, West Lebanon, NH (US); Andrew Hamlin, Hanover, NH (US)

(73) Assignee: TRUSTEES OF DARTMOUTH COLLEGE, Hanover, NH (US)

( * ) Notice: Subject to any disclaimer, the term of this patent is extended or adjusted under 35 U.S.C. 154(b) by 302 days.

(21) Appl. No.: 18/579,031

(22) PCT Filed: Jul. 14, 2022

(86) PCT No.: PCT/US2022/037223

§ 371 (c)(1),
(2) Date: Jan. 12, 2024

(87) PCT Pub. No.: WO2023/288030

PCT Pub. Date: Jan. 19, 2023

(65) Prior Publication Data

US 2024/0332017 A1 Oct. 3, 2024

Related U.S. Application Data

(60) Provisional application No. 63/221,917, filed on Jul. 14, 2021.

(51) Int. Cl.
*H10P 14/26* (2026.01)
*H10D 30/67* (2025.01)
(Continued)

(52) U.S. Cl.
CPC ......... *H10P 14/26* (2026.01); *H10D 30/6755* (2025.01); *H10D 62/80* (2025.01); *H10D 99/00* (2025.01); *H10P 14/3434* (2026.01)

(58) Field of Classification Search
CPC .. H10D 30/47; H10D 30/481; H10D 30/6741; H10D 30/675; H10D 30/6755;
(Continued)

(56) References Cited

U.S. PATENT DOCUMENTS

2005/0205296 A1 9/2005 Ito
2007/0184576 A1* 8/2007 Chang ................ H10D 30/6755 427/337

(Continued)

FOREIGN PATENT DOCUMENTS

CN 104108248 A 10/2014

OTHER PUBLICATIONS

Si et al., "Scaled Atomic-Layer-Deposited Indium Oxide Nanometer Transistors With Maximum Drain Current Exceeding 2 A/mm at Drain Voltage of 0.7 V," IEEE Electron Device Letters, Feb. 2021, pp. 184-187, vol. 42, No. 2.

(Continued)

*Primary Examiner* — Cheung Lee
(74) *Attorney, Agent, or Firm* — Hodgson Russ LLP

(57) ABSTRACT

In a liquid printing method, a second workpiece is applied onto a first workpiece. A metal on the second workpiece contacts a dielectric on the first workpiece thereby forming an alloyed oxide film. This can be used to form a liquid metal printed 2D alloyed oxide film transistor. The alloyed oxide film can be $InO_x$ or other materials.

38 Claims, 36 Drawing Sheets

(51) Int. Cl.
*H10D 62/80* (2025.01)
*H10D 99/00* (2025.01)
*H10P 14/20* (2026.01)

(58) Field of Classification Search
CPC .... H10D 62/80; H10D 62/82; H10D 62/8271; H10D 62/8281; H10D 62/871; H10D 62/874; H10D 62/875; H10D 62/881; H10D 62/883; H10D 99/00; H10P 14/26; H10P 14/32; H10P 14/34; H10P 14/3434
See application file for complete search history.

(56) References Cited

U.S. PATENT DOCUMENTS

| | | | |
|---|---|---|---|
| 2008/0182349 | A1 | 7/2008 | Yamazaki et al. |
| 2011/0249229 | A1 | 10/2011 | Kubota et al. |
| 2018/0269417 | A1 | 9/2018 | Sudo et al. |
| 2020/0402815 | A1 | 12/2020 | Yamazaki et al. |

OTHER PUBLICATIONS

Lee et al., "High mobility ultra-thin crystalline indium oxide thin film transistor using atomic layer deposition," Applied Physics Letters, 2018, vol. 113.
Yeom et al., "High mobility polycrystalline indium oxide thin-film transistors by means of plasma-enhanced atomic layer deposition," Journal of Materials Chemistry C, 2016, pp. 6873-6880, vol. 4.
Han et al., "Low-Temperature, High-Performance, Solution-Processed Indium Oxide Thin-Film Transistors," Journal of the American Chemical Society, Apr. 13, 2011, pp. 5166-5169, vol. 133, Issue 14.
Tang et al., "Vacuum-Free Liquid-Metal-Printed 2D Indium-Tin Oxide Thin-Film Transistor for Oxide Inverter," ACS Nano, Feb. 22, 2022, pp. 3280-3289, vol. 16, Issue 2.
Faber et al., "Indium Oxide Thin-Film Transistors Processed at Low Temperaturevia Ultrasonic Spray Pyrolysis," ACS Applied Materials & Interfaces, Jan. 14, 2015, pp. 782-790, vol. 7, Issue 1.
Faber et al., "Heterojunction oxide thin-film transistors with unprecedented electron mobility grown from solution," Science Advances, Mar. 31, 2017, vol. 3.
Lin et al., "High Electron Mobility Thin-Film Transistors Based on Solution-Processed Semiconducting Metal Oxide Heterojunctions and Quasi-Superlattices," Advanced Science, May 26, 2015, vol. 7.
Zavabeti et al., "A liquid metal reaction environment for the room-temperature synthesis of atomically thin metal oxides," Science, Oct. 20, 2017, pp. 332-335, vol. 358, Issue 6361.
Noh et al., "Indium Oxide Thin-Film Transistors Fabricated by RF Sputtering at Room Temperature," IEEE Electron Device Letters, Jun. 2010, pp. 567-569, vol. 31, No. 6.
Zhang et al., "Enhancement of electrical performance in In2O3 thin-film transistors by improving the densification and surface morphology of channel layers," Solid-State Electronics, Apr. 2010, pp. 479-483, vol. 54, Issue 4.
Chen et al., "Low-Impurity High-Performance Solution-Processed Metal Oxide Semiconductors via a Facile Redox Reaction," Chemistry of Materials, Jul. 14, 2015, pp. 4713-4718, vol. 27, Issue 13.
Li et al., "Nanometre-thin indium tin oxide for advanced high-performance electronics," Nature Materials, Oct. 2019, vol. 18, Issue 10.
Daeneke et al., "Wafer-Scale Synthesis of Semiconducting SnO Monolayers from Interfacial Oxide Layers of Metallic Liquid Tin," ACS Nano, Nov. 28, 2017, pp. 10974-10983, vol. 11, Issue 11.
Socratous et al., "Electronic Structure of Low-Temperature Solution-Processed Amorphous Metal Oxide Semiconductors for Thin-Film Transistor Applications," Advanced Function Materials, Mar. 25, 2015, pp. 1873-1885, vol. 25.
Kelly et al., "All-printed thin-film transistors from networks of liquid-exfoliated nanosheets," Science, Apr. 7, 2017, pp. 69-73, vol. 356, Issue. 6333.
Carey et al., "Wafer-scale two-dimensional semiconductors from printed oxide skin of liquid metals," Nature Communications, Nature Communications, Mar. 22, 2017.
Bellingham et al., "Electrical and optical properties of amorphous indium oxide," Journal of Physics: Condensed Matter, 1990, pp. 6207-6221, vol. 2.
Scheideler et al., "Low-Temperature-Processed Printed Metal Oxide Transistors Based on Pure Aqueous Inks," Advanced Science News, Apr. 2017, vol. 27.
Hong et al., "Characteristics of Printed Thin Films Using Indium Tin Oxide (ITO) Ink," Materials Transactions, 2010, pp. 1905-1908, vol. 51, No. 10.
Hong et al., "Development of Ultrafine Indium Tin Oxide (ITO) Nanoparticle for Ink-Jet Printing by Low-Temperature Synthetic Method," IEEE Transactions on Nanotechnology, Mar. 2008, pp. 172-176, vol. 7, No. 2.
Kim et al., "Low-temperature fabrication of high-performance metal oxide thin-film electronics via combustion processing," Nature Materials, Apr. 17, 2011, pp. 382-388, vol. 10.
Hamlin et al., "2D transistors rapidly printed from the crystalline oxide skin of molten indium," 2D Materials and Applications, 2022, vol. 16.
Ye et al., "Continuous Liquid Metal Printed 2D Transparent Conductive Oxide Superlattices," Advanced Functional Materials, Aug. 2022, vol. 32, Issue 33.
WIPO, International Search Report for International Application No. PCT/US22/37223, Oct. 14, 2022.

* cited by examiner a b (a)

(b)

LIQUID METAL PRINTED 2D ULTRAHIGH MOBILITY CONDUCTING OXIDE TRANSISTORS

CROSS-REFERENCE TO RELATED APPLICATIONS

This application claims priority to the provisional patent application filed Jul. 14, 2021 and assigned U.S. App. No. 63/221,917, the disclosure of which is hereby incorporated by reference.

FIELD OF THE DISCLOSURE

This disclosure relates to printing conducting oxide materials.

BACKGROUND OF THE DISCLOSURE

Transparent conducting oxides (TCOs) have optoelectronic properties that are used as wide bandgap materials in a variety of applications. Their unique ability to support highly efficient electronic transport in their disordered, amorphous state is a boon for applications such as display technology, flexible electronics, and solar cells. Although used primarily for transparent electrodes due to their high conductivity, the metal oxides such as $InO_x$, $SnO_x$, InGaZnO (IGZO), and ZnO can be engineered as high mobility, transparent semiconductors for thin film electronics.

Transparent conductive oxides are used in an expanding variety of thin film optoelectronics, offering plasmonic functionality and compliant biocompatible interfaces as well the benefits of lightweight form factors for flexible high-efficiency solar cells and low-cost OLED lighting. However, the optoelectronic properties and mechanical reliability of TCOs in flexible device applications are limited by tradeoffs between thermal budget, cost, and crystallinity for films fabricated by traditional vacuum deposition methods such as sputtering. Crystallinity controls TCOs' response to bending strain, with amorphous oxides exhibiting higher flexibility, but lower conductivity. New large area processing methods are needed which can continue to drive down the cost for large area applications as well as overcome limitations on TCO material properties such as crystallinity to improve performance for flexible electronics.

Transparent conducting oxides' optoelectronic properties have traditionally made them critical electrode materials for state-of-the-art displays, photovoltaics, and smart windows. However, oxides such as $InO_x$, $SnO_x$, $InGaZnO_3$ (IGZO), and $ZnO_4$ are also promising as low-temperature processed high mobility semiconductors for driving new thin-film electronics. Emerging applications of conducting oxides to low power switching, neuromorphic computing, and biosensing can be unlocked by utilizing ultrathin, nm-scale two-dimensional (2D) layers with favorable electrostatics. Among these 2D oxides, ultrathin $InO_x$ displays a tendency toward strong surface electron accumulation, offering surprisingly high mobility transport in films just one unit cell thick (e.g., ~1 nm) with outstanding short channel performance for GHz-range circuits. Beyond switching, this high conductivity in combination with high visible range transmittance makes 2D $InO_x$ well suited, for example, as charge selective contacts for an emerging class of heterostructure photodetectors based on MXenes, graphdiyne and transition metal dichalcogenides (TMDs). The functional versatility and low-temperature processing capability of 2D oxides may be particularly interesting for heterogeneous 3D integration with low-power CMOS circuits.

The high theoretical performance of conductive binary oxides, such as $InO_x$, can be applied by utilizing quantum-confinement to fabricate ultrathin channel materials. $InO_x$ has unique properties in its 2D, quantum-confined form that differ from other 2D semiconductors. Even at a channel thickness of one unit cell (e.g., ~1 nm), 2D $InO_x$ can offer efficient electronic transport, well below the thickness of other 2D channels made from TMDs. These ultrathin metal oxide semiconductors show outstanding short channel scaling due to their low dielectric constant, wide bandgap, and low contact resistance, allowing high frequency operation (>10 GHz) and ultra-low power consumption at channel lengths down to 40 nm. Beyond its switching capabilities, $InO_x$ is a versatile platform for biosensor integration due to the ease of surface functionalization and its high electrolytic stability. These electronic properties make 2D oxides an advantageous 2D material.

Low-temperature processing of oxide semiconductors may be important for 3D heterogeneous material integration with CMOS electronics, which can require processing temperatures below 400° C. Oxide semiconductors processed at low temperatures offer pathways for integrating high voltage transistors on top of low voltage CMOS circuits or 3D integration of NAND flash memory. Emerging applications may also leverage oxide transistors in circuits for neuromorphic electronics. The low cost, flexible integration, and high performance of metal oxide electronics also make them a promising candidate for active interposers incorporating metal oxide transistors.

There are challenges, however, to applying oxides such as $InO_x$ to emerging applications in flexible and large area electronics due to its inherently high conductivity. Controlling ultrathin film depositions below 3 nm with methods such as sputtering is challenging and often requires subtractive processes which are not scalable due to the lack of an etch stop for process control. While atomic layer deposition (ALD) mitigates some of these challenges of thickness control, it remains a high capital expenditure process with low throughput and requires activation temperatures too high (225° C.) for flexible electronics.

There is a need for scalable synthesis methods that can leverage 2D oxides in large area devices for display, sensing, and energy harvesting. Although low-temperature processed sol-gels and nanoparticles are both promising routes to printed metal oxide transistors, there remains a barrier to processing within the thermal capability of polymer substrates such as polyethylene terephthalate (PET) and polyethylene naphthalate (PEN), which exhibit significant shrinkage above 200° C. The material chemistry of printed sol-gel oxides demand higher temperatures (beyond 200° C.) to reach high mobility (>10 $cm^2/Vs$) since the decomposition of the metal salt precursors is incomplete below 225° C. New flexible electronics require fabrication strategies to take advantage of the potential of these 2D oxides, particularly for fabrication below 200° C. in wearable, flex devices.

Liquid metal synthesized 2D oxides have properties unseen in nanoscale films grown by vacuum deposition methods, exhibiting unique grain structures and large crystalline domains even at low processing temperatures where ALD films would remain amorphous due to the inhibition of ultrathin film crystallization. Due to the low deposition temperatures of 2D oxides (<200° C.), they are also a vehicle for integrating metal oxides into flexible electronics that utilize the outstanding mechanical flexibility that these ultrathin oxide films possess. 2D conducting oxides can be enhanced through quantum confinement induced bandgap widening and control of the electronic degeneracy. Other unique, surface-induced properties can be achieved with 2D oxides, such as catalytic behavior of SnO.

2D conducting oxides could offer a technological advantage for large area flexible electronics due to their high bending strain tolerance, but there remains a technological need for scalable deposition of these ultrathin films. Precision vacuum-based methods such as ALD can control nm-scale thickness, but are capital intensive, relatively low-throughput, and challenging to scale to large areas for flexible devices. Large area printing technologies, on the other hand, could enable low-cost flexible device fabrication, but it has proved challenging to achieve both high uniformity and high mobility for ultrathin films. Additionally, although sol-gels and nanoparticles have been developed for printing metal oxides, there remains a barrier to processing high-performance oxides (>10 $cm^2$ $V^{-1}$ $s^{-1}$) within the thermal limits of polymer substrates, such as PET and PEN (~200° C.) as precursor decomposition is incomplete below 225° C. Low-temperature fabrication strategies are needed to take advantage of the potential of 2D oxides in low-cost, wearable devices.

Liquid metal printing of a new class of van der Waals 2D oxides could overcome these challenges to accelerate high-performance flexible electronics. Liquid metal printing is a vacuum-free route to depositing ultrathin (<5 nm) metal oxide semiconductors generated by spontaneous surface oxidation. A feature of liquid metal synthesis distinguishing it from contact-based adhesive 2D material transfer is the liquid metal's mechanical compliance, which leads to its ability to transfer continuous nanosheets at the $cm^2$ scale. Further advances are needed to allow careful tuning of the electronic properties of 2D oxides for new applications by replacing manual "touch" printing methods and utilizing lower temperatures broadly compatible with polymer substrates.

Therefore, improved printing techniques are needed.

BRIEF SUMMARY OF THE DISCLOSURE

A liquid printing method is provided in an embodiment. The method includes providing a first workpiece having a surface that includes a dielectric; providing a second workpiece that includes a metal; and applying the second workpiece onto the first workpiece at a first pressure such that the metal contacts the dielectric thereby forming an alloyed oxide film.

In an instance, the first workpiece and the second workpiece are substrates. The liquid printing can occur at a temperature of approximately 40° C. to 450° C. (e.g., 160° C. to 300° C. or 160° C. to 165° C.). The liquid printing can form a monolayer film (e.g., 2.2 nm thick or 1.9-2.5 nm thick), a bilayer film (e.g., 1.5 nm to 5 nm thick, 4.3-5.5 nm thick, or 4.8 nm thick), or a multilayer film (e.g., 6-36 nm thick or 5-10 nm thick). The alloyed oxide film can be nanocrystalline. The metal can have a purity of at least 99%.

The first pressure can be from 10 psi to 10,000 psi (e.g., at least 400 psi). A duration of the applying at the first pressure can be from 1-10 seconds (e.g., 2-5 seconds). A speed of a spreading meniscus for the metal can be from 0.1 cm/s to 60 cm/s (e.g., 1 cm/s to 60 cm/s).

The first workpiece and/or the second workpiece can be heated to above a melting point of the metal. In an instance, the first workpiece and/or the second workpiece is heated to from 100° C. to 250° C. (e.g., 160° C. to 250° C.). In another instance, the first workpiece and/or the second workpiece is heated to at least 165° C. before the applying.

The method can further include separating the first workpiece from the second workpiece after the applying and removing the metal from the first workpiece and/or the second workpiece after the applying.

The method can further include patterning the alloyed oxide film. The patterning can include etching.

The second workpiece can be a plastic film. For example, the plastic film can be a polyimide, polyethylene naphthalate, or polyethylene terephthalate.

A surface of the second workpiece further can include the dielectric. The dielectric can be $SiO_2$.

In an instance, the metal includes In and the alloyed oxide film is an $InO_x$ film. The $InO_x$ film can be from 94% to greater than 99% transmissive (e.g., at least 99% transmissive). The $InO_x$ film can have a grain size from 6 nm to 45 nm (e.g., from 30-40 nm).

In another instance, the metal includes In and the alloyed oxide film is a metal-doped $InO_x$ film. The metal-doped $InO_x$ film can be indium tin oxide (ITO).

In another instance, the metal includes Sb and the alloyed oxide film is an antimony tin oxide film.

In another instance, the metal includes Ga, Zn, or Sn. For example, the alloyed oxide film can be one of InZnO, $InGaZnO_x$, $InGaSnO_x$, $SnO_x$, $InSnO_x$, $GaSnO_x$, $SbSnO_x$, or $InGaO_x$.

For example, the dielectric can be $SiO_x$ (e.g., $SiO_2$), $AlO_x$, $YO_x$, $HfO_x$, $ZrO_x$, $LaO_x$, or a rare earth, high-k dielectric (e.g., $CeO_x$, $SrO_x$).

In another instance, the dielectric is $GaO_x$, the metal is In, and the second workpiece is a roller. The applying includes rolling the roller over the first workpiece. The liquid printing occurs at a temperature of approximately 40° C. to 300° C. (e.g., 100° C. to 300° C.). The method can further include applying a second $GaO_x$ layer to the alloyed oxide film and applying a second alloyed oxide film to the second $GaO_x$ layer. The first pressure (e.g., line pressure) using the roller can be from 0.1 N/cm of roller width to 100 N/cm of roller width. The metal and the first workpiece have a temperature from 40° C. to 450° C. during the applying.

A liquid metal printed 2D alloyed oxide film transistor can be formed using an embodiment of the liquid printing method. In an example, the alloyed oxide film is $InO_x$. The 2D alloyed oxide film transistor can have one or more arrays with a total area of at least 20 $cm^2$ (e.g., each array having a total area of at least 20 $cm^2$).

DESCRIPTION OF THE DRAWINGS

For a fuller understanding of the nature and objects of the disclosure, reference should be made to the following detailed description taken in conjunction with the accompanying drawings.

DETAILED DESCRIPTION OF THE DISCLOSURE

Figure 1:
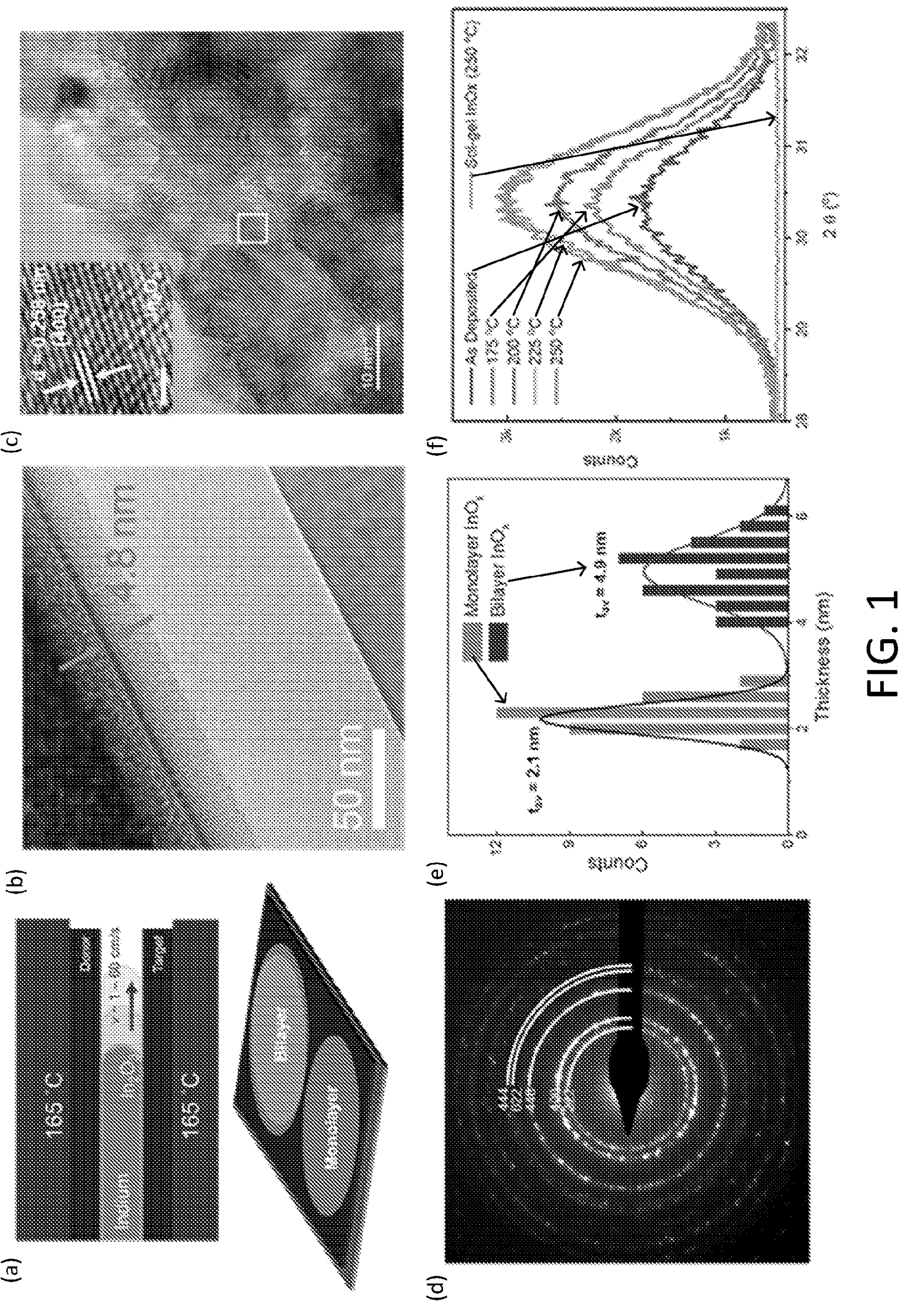
FIG. 1 shows (a) schematic for liquid metal 2D oxide deposition; (b, c) cross-sectional TEM images of 2D $InO_x$ film, wherein the inset shows a magnified view of the lattice pattern within a nanograin having a scale of 1 nm represented by the lower bar; (d) selective Area Electron Diffraction (SAED) for bilayer 2D liquid metal printed $InO_x$ films having a scale of 5 l/nm; (e) a histogram of measured thicknesses for monolayer and bilayer $InO_x$ films; and (f) X-ray diffraction (XRD) spectra for the (222) peak for 2D liquid metal printed $InO_x$ films post-annealed from 175° C. to 250° C. compared with a sol-gel processed $InO_x$ film.

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

An ultrathin metal oxide thin film transistor and method of manufacturing the ultrathin oxide channel material are disclosed. A liquid metal synthetic approach can overcome the draw backs of previous techniques to accelerate flexible oxide electronics. Liquid metal printing is a route to achieving ultrathin metal oxide semiconductor layers based on a vacuum-free, rapid process that can operate at low temperatures. A feature of this synthesis distinguishing it from traditional contact-based adhesive 2D material transfer is the liquid metal's compliance, which leads to its ability to transfer continuous nanometer scale sheets over large areas (1 $cm^2$ scale). This 2D liquid metal printing can be used for an alloyed oxide film, such as $InO_x$, that forms ultrathin films to deliver electrostatic control and provides enhancement mode operation. 2D $InO_x$ transistors demonstrating improved switching performance via a rapid and low-temperature liquid metal printing process are disclosed. The control of the density of states in these quantum-confined layers can enable precise electronic structures of 2D oxides.

In the embodiments disclosed herein, the liquid metal printing process delivers lower process temperatures (165° C.) than previous techniques by leveraging a temperature controlled dual-sided thermomechanical transfer of liquid metal derived oxide nanosheets. This process (FIG. 1(*a*)) relies on the spontaneous growth and subsequent high-speed transfer of a nanoscale solid oxide skin on a spreading droplet of liquid indium metal or other materials. Tests were performed to generate large continuous sheets of $InO_x$ at the 20 $cm^2$ scale, which were rapidly deposited via the spreading of the liquid metal meniscus at a speed of 0.1-60 cm/s, as estimated from slow-motion photography. This approach of controlling the donor and target substrate (which are examples of workpieces) temperatures allows for greater repeatability and process control to modulate the electronic properties of the transferred 2D $InO_x$ films. The printing process can be tuned to produce 2.2±0.3 nm "monolayer" sheets or 4.9±0.6 nm "bilayer" nanosheets by using donor surfaces with variable wetting of the liquid metal. Cross-section transmission electron microscopy (TEM) reveals a thickness of approximately 4.8 nm for the bilayer $InO_x$ films produced with the liquid metal printing method disclosed herein (shown in FIG. 1(*b*)). These ultrathin films are nanocrystalline for both monolayer and bilayer depositions. A top down HRTEM (FIG. 1(*c*)) reveals the morphology of the bilayer $InO_x$ films produced as the liquid metal printing process simultaneously overlays two nanosheets, exhibiting characteristic Moiré patterns. These films exhibit crystalline domains with lateral dimensions from approximately 10 nm to 20 nm, considerably larger than transferred film thickness, a property typically associated with highly ordered materials produced by methods such as pulsed laser deposition (PLD). HRTEM shows the d-spacing of 0.258 nm corresponding to the (400) plane of $In_2O_3$, which is reflected in the SAED (FIG. 1(*d*)) patterns. SAED also exhibits the (222), (400), as well as the (440) peaks in these 2D $InO_x$ films.

A low-temperature liquid-metal printing process for unlocking the ultra-high mobility of 2D $InO_x$ is disclosed. The improved performance of these 2D oxide transistors is achieved via rapid liquid metal printing, which bypasses amorphous sol-gel intermediates and avoids the need for high-temperature processing to decompose precursors. Quantum confinement and low-temperature oxidative post-annealing to control the electronic density of states of the liquid-metal synthesized 2D $InO_x$ were demonstrated, achieving transistors with ultrahigh mobility ($\mu_0$>65 $cm^2$/Vs) and low-hysteresis. Liquid-metal printed 2D $InO_x$ as an ideal low-temperature transistor technology for high-performance, large area electronics applications such as low power flexible displays, active interposers, and thin film sensors.

High-mobility, low-temperature processed ultrathin transistors derived from an oxidized surface of a liquid metal are disclosed. These embodiments can provide a method of fabrication and a structure for a metal oxide transistor with high electrical switching performance and high transparency to visible light. The liquid metal transfer printing process fabricates metal oxide semiconductor films at low temperatures, which removes post-processing steps. The ultrathin nature (e.g., <2 nm) of the liquid metal printed oxide film can provide improved semiconducting and optoelectronic properties and mechanical reliability under flexion. The ultrathin channel also can provide improved immunity to short channel effects and can induce enhanced performance in high-frequency applications due to the reduction in parasitic capacitances. The liquid metal printing method can include contact-based transfer of the metal oxide surface layer that natively forms on the liquid metal alloys (eutectic or otherwise). The metal oxide surface layer is directly transferred at an elevated temperature (e.g., 150-250° C., though other values are possible) from a liquid metal droplet located on a heated donor workpiece. The target substrate receives the metal oxide film, which can be adhered via, for example, Van der Waals attraction.

This transfer process can be performed using a three-axis robotic stage and a pneumatic hot-press to control the temperature of the donor and target workpieces.

High mobility (>20 $cm^2$/Vs) bottom gated metal oxide transistors using ultrathin (<3 nm) indium oxide and indium tin oxide alloy channel materials were deposited through a liquid metal printing method performed at, for example, 160-200° C. Similar transistors were fabricated using 95% tin, 5% antimony metal oxide. The optical properties showed an average visible range transparency of 98.6%, which can be used in applications that need high brightness like emissive displays. Unpassivated and passivated indium oxide and indium oxide alloy channel materials were demonstrated. The performance achieved is 10× better than other indium oxide channel material deposited from solution-chemistries in this temperature range.

An ultrathin nature allows the heavily-doped material to be modulated in a triode device architecture. The nature of the density of electronic states in a metal oxide semiconductor is such that degenerate materials have a greater degree of band-like conduction rather than trap-limited conduction. The high mobility that was observed corresponds well to predictions from the multiple trap and release theory.

Liquid metal printing can be performed rapidly and at scale using a liquid metal precursor. Transfer over cm-scale areas can occur in approximately 1 second or less. The liquid metal can be recycled after deposition, which enables high material utilization. For example, a squeegee and manual wiping can remove the excess liquid, though other techniques can be used.

The indium oxide-based materials can show enhancement in carrier mobility (e.g., 100-200% enhancement) and switching performance when using high-k metal oxide gate dielectric materials.

The disclosed indium oxide channels are expected to be resilient to a higher level of strain than standard thick-sputtered indium tin oxide, which fractures below 0.5% bending strain when mounted on a flexible plastic substrate. The disclosed thin films can exhibit a 10× increase in tolerance of bending strain.

Figure 6:
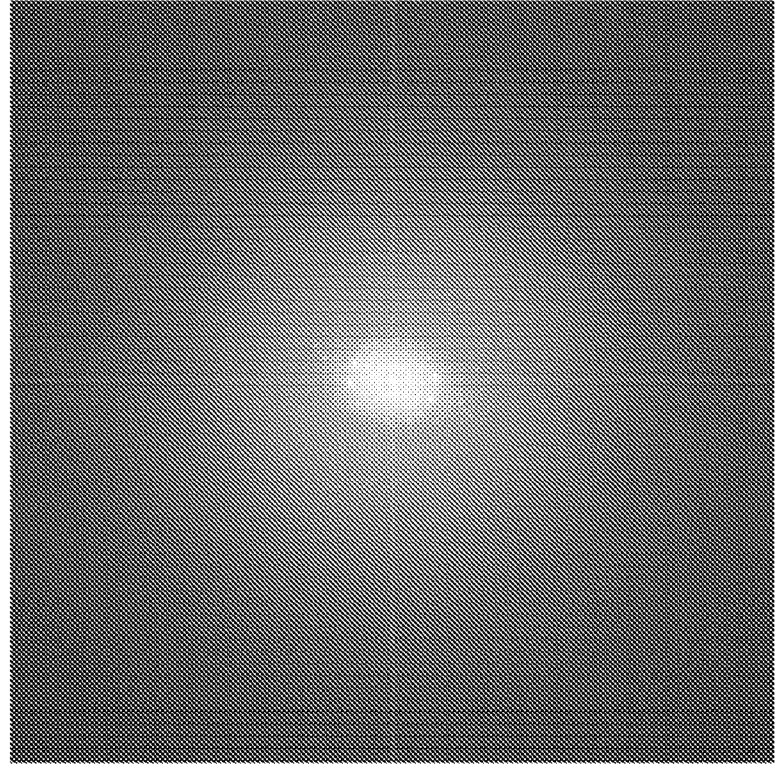
FIG. 6 shows a top down high-resolution transmission electron microscopy (HRTEM) (left) and selected area electron diffraction (SAED) (right) for unannealed 2D $InO_x$ film transferred to TEM grid.
Figure 6:
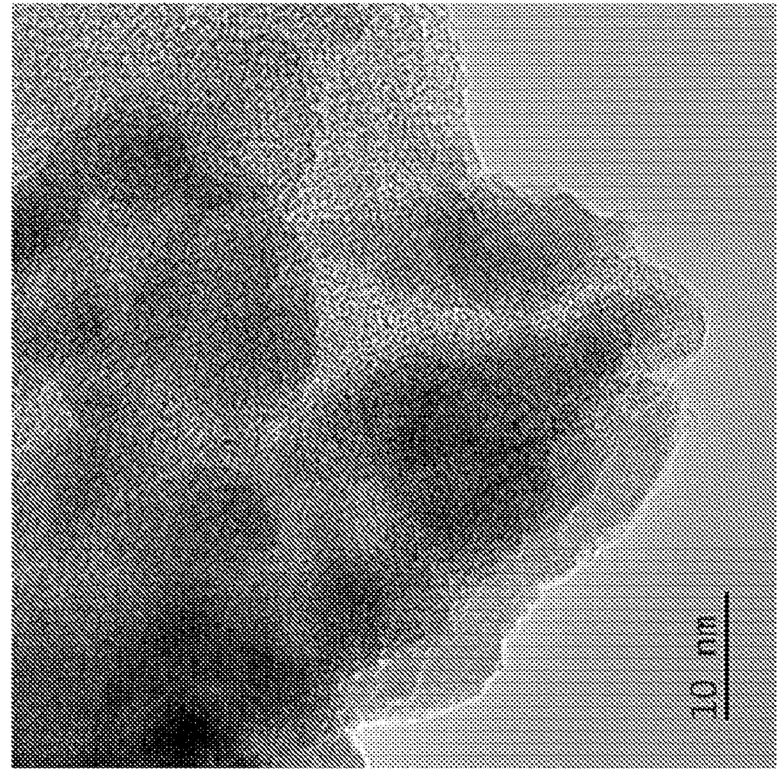
Figure 7:
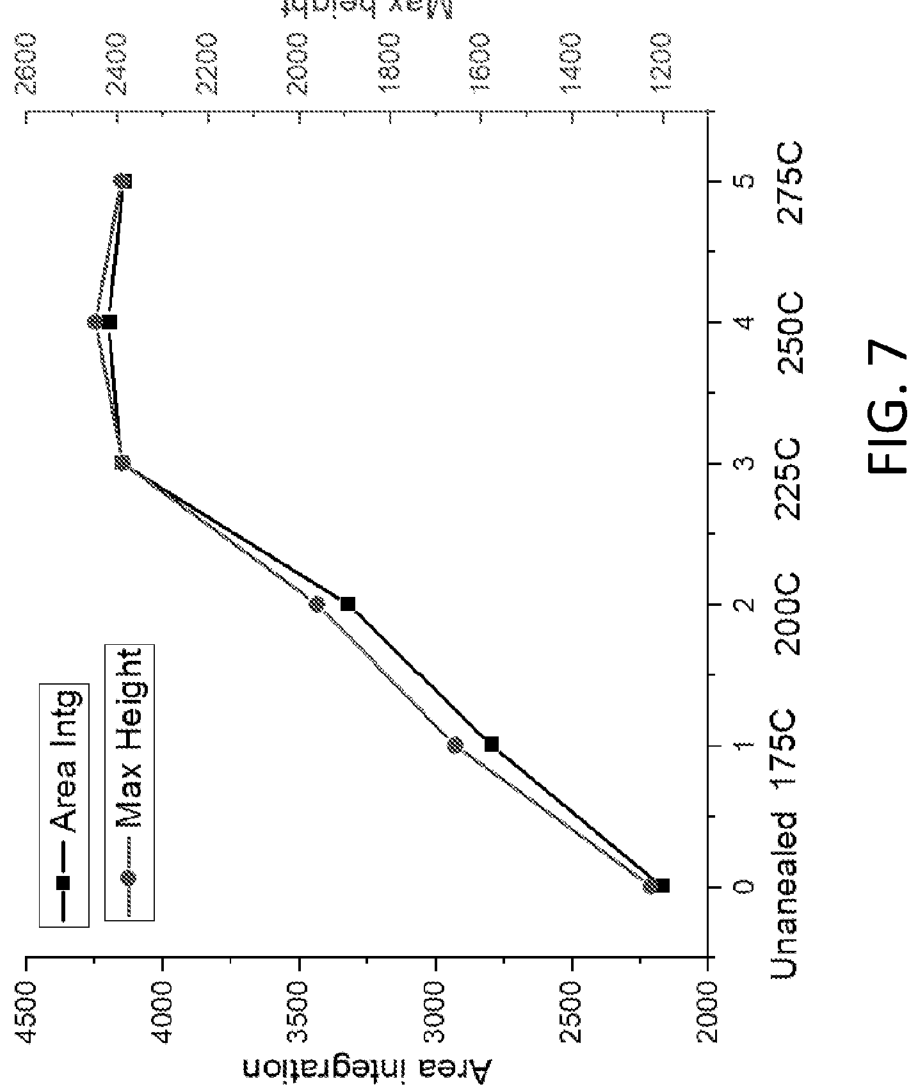
FIG. 7 shows integrated intensity and peak heights for (222) XRD peak of bilayer $InO_x$ films.
Figure 8:
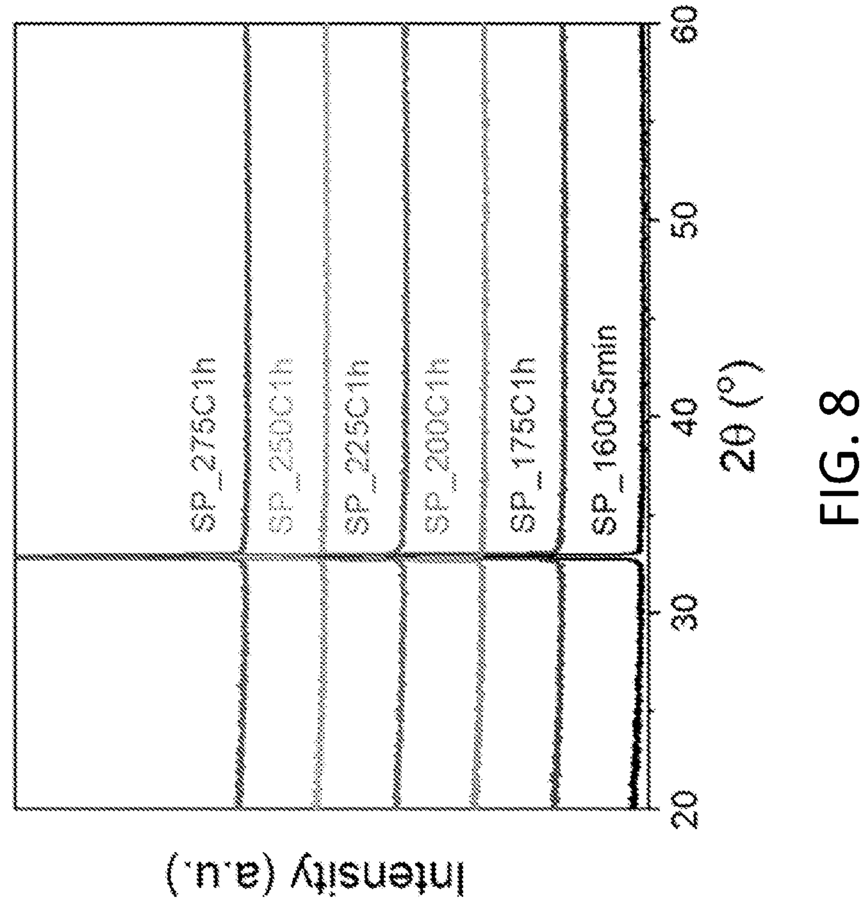
FIG. 8 shows XRD spectra for solution-processed $InO_x$ after varying post-annealing temperature that exhibit amorphous phase.

Before thermal post-annealing, the mixture of these crystalline and amorphous phases can clearly be observed in HRTEM and SAED measurements of bilayer $InO_x$ (FIG. 6). XRD spectra of these films are dominated by a single (222) peak of cubic $InO_x$, as illustrated in FIG. 1(*f*). With subsequent annealing of both monolayer and bilayer films (FIG. 1(*e*)), the $InO_x$ (222) peak increases in intensity (FIG. 7), indicating the increase in the presence of the crystalline phase compared with the amorphous phase. For comparison, a control sample with sol-gel $InO_x$ produced by spin coating was measured by XRD, showing only the amorphous phase even with thermal annealing up to 275° C. (FIG. 8).

These results indicate an advantage of liquid-metal printed 2D oxides relative to predominate sol-gel formulations is the ability to achieve crystalline films as deposited and to avoid hydroxide formation, a known acceptor type defect limiting the conductivity of $InO_x$. The lack of carbonaceous solvents or metal salt precursors in this liquid metal printing method can eliminate the requisite formation of intermediate phases dominated by metal hydroxide bonding. This can be seen in the XPS O1s peaks for spin coated sol-gel films (FIG. 7) which include 84% M-OH bonding compared with liquid metal printed films, which show minimal hydroxide content (<7% M-OH). This liquid metal printing method can provide a method to deposit these ultrathin 2D oxide semiconductors while controlling their electronic properties to achieve high mobility transport. By comparison, crystallization of ALD $InO_x$ films is inhibited for ultrathin films (<5 nm), requiring higher temperatures (e.g., 200-250° C.), which often form channel layers that cannot be effectively gated as transistors.

Figure 2:
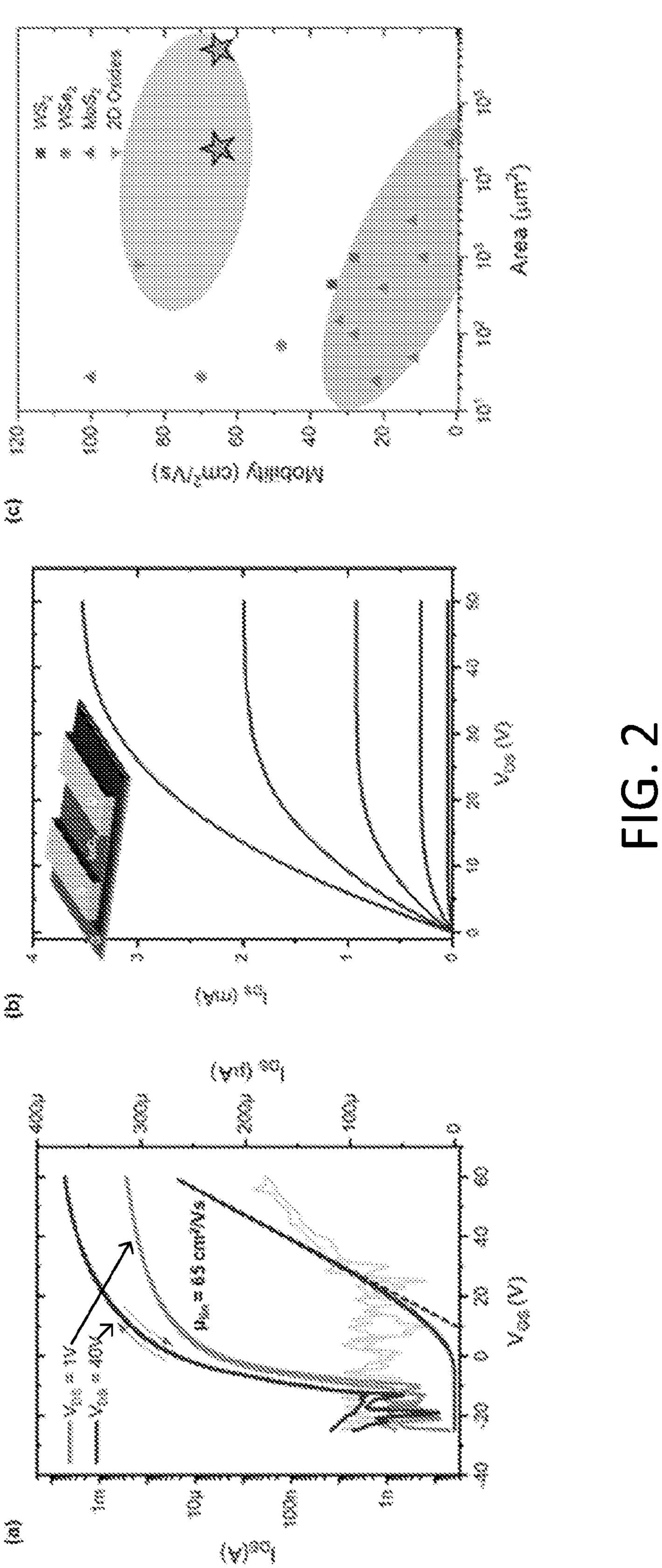
FIG. 2 shows (a) linear and saturation transfer curves for a champion 2D $InO_x$ printed transistor with 4 nm thick channel post-annealed as 250° C.; (b) output curves for the champion device with $V_{gs}$=−10 V to 40 V in 10 V steps; and (c) mobility comparison between 2D channel materials as a function of device area.

The liquid metal synthesized 2D $InO_x$ films were integrated into thin film transistors with switching performance that exceeded those of competing low-temperature solution-processed metal oxide semiconductors. FIG. 2(*a*) shows the transfer characteristics of the champion $InO_x$ transistor on a 100 nm $SiO_2$ dielectric, which exhibits extremely high electron mobility as well as minimal hysteresis for forward and reverse sweeps. The linear regime transfer curve exhibits a peak mobility reaching a value of approximately 65.0 $cm^2$/Vs with a $V_t$ of approximately 10 V. This on-state performance is complemented by ideal current saturation as shown in the output curve in FIG. 2(*b*) indicating the absence of back-channel conduction or instability in these high mobility materials. The current saturation and low hysteresis in these $InO_x$ devices differentiate them from highly conductive channels formed in liquid metal 2D oxide TFTs. The low-hysteresis and steep subthreshold slope additionally suggest the potential for the disclosed liquid-metal printed 2D $InO_x$ to be used in high-performance thin film circuits in a variety of large area electronics. FIG. 2(*c*) shows a mobility comparison between 2D channel materials as a function of device area.

TABLE 1

Performance summary for monolayer and bilayer liquid-metal printed $InO_x$ transistors

| Channel | Thickness (nm) | Anneal Temperature (° C.) | Linear Mobility, $\mu_0$ (cm$^2$/Vs) | $I_{on}/I_{off}$ | Turn on Voltage, $V_{on}$ (V) | Saturation Mobility, $\mu_{sat}$ (cm$^2$/Vs) |
|---|---|---|---|---|---|---|
| Monolayer $InO_x$ | 2.2 | 175 | 3.0 | $10^5$ | −13 | 1.6 |
| Monolayer $InO_x$ | 2.2 | 250 | 2.6 | $10^5$ | −9 | 2.0 |
| Bilayer $InO_x$ | 4.8 | 175 | 37.3 | $10^6$ | −24 | 21.3 |
| Bilayer $InO_x$ | 4.8 | 250 | 50.8 | $10^6$ | −17 | 41.7 |

The $SiO_2$ area can be from 1×1 cm, though other values are possible. $InO_x$ films from 1×1 cm to 6×10 cm were demonstrated using different workpieces and by increasing the amount of liquid. $InO_x$ films up to 1×1 m are possible with the compliance provided by the liquid metal. Heated rollers and blades can be used instead of the two workpieces illustrated herein.

Figure 3:
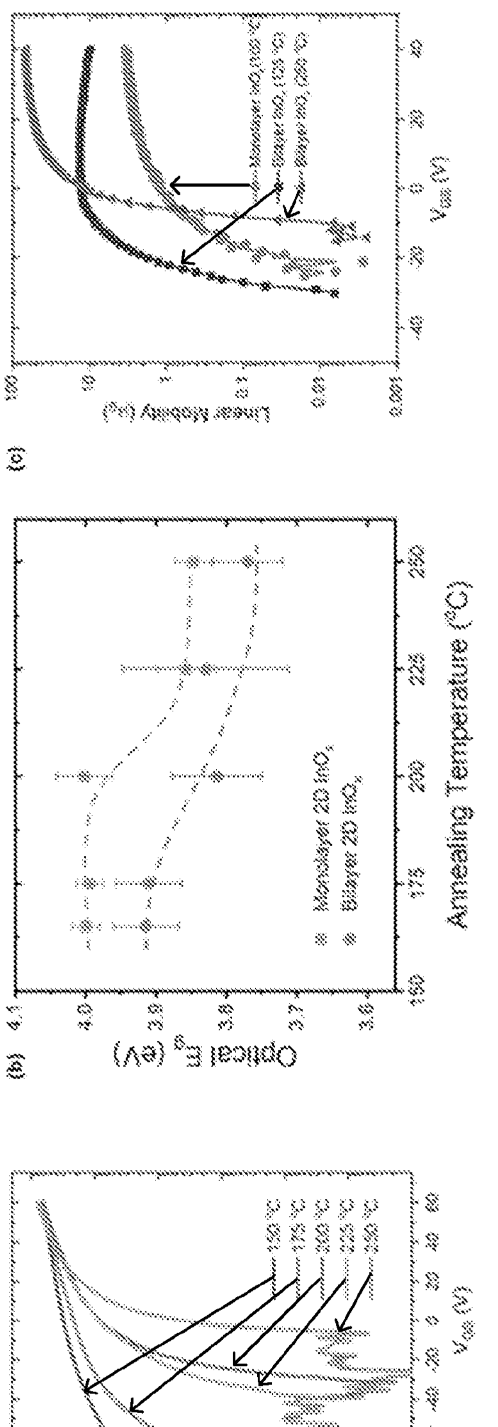
FIG. 3 shows (a) representative transfer curves for bilayer printed $InO_x$ transistors on $SiO_2$ dielectrics, post-annealed in air at temperatures from 150° C. to 250° C.; (b) optical bandgap of monolayer and bilayer 2D $InO_x$ films extracted from UV-absorption; and (c) low-field linear mobility as a function of gate voltage for monolayer and bilayer $InO_x$.

Unlike other printable 2D semiconductors such as $MoS_2$, $WS_2$, and $WSe_2$ that are typically in approximately 1-10 μm scale nanosheets, 2D oxides offer the benefit of allowing large-scale continuous films (1 mm$^2$-100 cm$^2$) suitable for flexible device integration. Nanosheet networks of TMD 2D materials can be limited by sheet-to-sheet charge transport, resulting in measured electronic mobility 10-100× lower than the single crystal mobility as the area is scaled above the area of individual nanosheets. FIG. 3(*c*) illustrates this trend of mobility vs device area for transistors with 2D material channels, showing the favorable large area scaling of 2D oxides that maintain high mobility while allowing for printing-based-integration.

Post-annealing processes after the initial 2D oxide film transfer can control electronic transport for the $InO_x$ films of varying thickness. Post-annealing in bilayer and multilayer 2D $InO_x$ films (>4 nm in thickness) can reduce the free carrier concentration and allow effective gating. FIG. 3(*a*) illustrates transfer curves for bilayer $InO_x$ transistors with various post-annealing temperatures, reaching optimal characteristics with high $I_{on}/I_{off}$ near 200° C. post annealing. Sufficient thermal post annealing was observed to shift the turn-on voltage from a depletion mode operation to enhancement mode.

Thermal post-annealing enhances the electronic mobility of the $InO_x$ transistors (FIG. 3(*c*)), which is consistent with the higher crystalline fraction of annealed samples compared with the as-deposited thin films. Similar to the crystallinity, the mobility begins to reach its peak at 200-225° C.

Measurements of the optical absorption of the 2D $InO_x$ films reveal the role of quantum confinement in modulating the electronic structure of 2D $InO_x$ films. A quantum shift in the optical bandgap ($\Delta E_g$) for the thinnest 2D $InO_x$ films was observed, with an offset of approximately 90 meV between monolayer (2 nm) and bilayer (4.8 nm) $InO_x$. Post-annealing of these materials lowers the optical bandgap, consistent with a diminishing Burstein-Moss effect and a lower carrier concentration. FIG. 3(*b*) illustrates this trend of $E_g$ versus post annealing, as extracted from fits of the Tauc plots, showing the downward shift after post-annealing for both monolayer and bilayer films.

Variable temperature Hall measurements were performed to characterize the electronic transport in large area 2D $InO_x$ films of approximately 7×7 mm (FIG. 8). Measurements of temperature-dependent resistivity (FIG. 4(*a*)) illustrate the low activation energy of the highly conductive bilayer $InO_x$ films, consistent with a trap-neutral level in proximity to the conduction band energy and the observed carrier concentration of approximately $1\cdot10^{19}$ cm$^{-3}$. Hall measurements of these films show room-temperature mobility of approximately 12.9 cm$^2$/Vs, consistent with the measured field-effect mobility of 13.4 cm$^2$/Vs for these bilayer films with no post-annealing.

Figure 4:
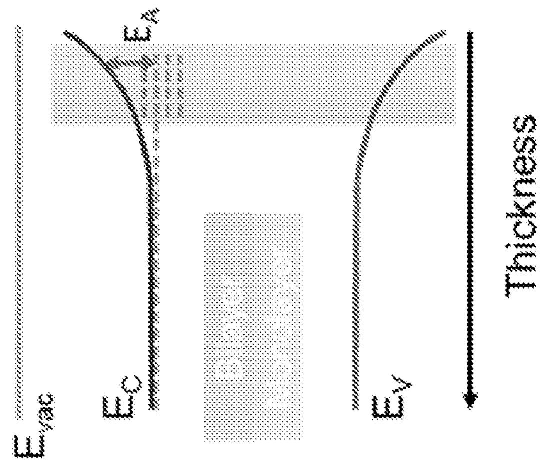
FIG. 4 shows (a) temperature-dependent carrier concentration, Hall mobility, and resistivity of liquid metal printed bilayer $InO_x$ films; (b) measured electronic density of states (eDOS) for 2D printed $InO_x$; and (c) band diagram illustrating quantum confinement in 2D $InO_x$.
Figure 4:
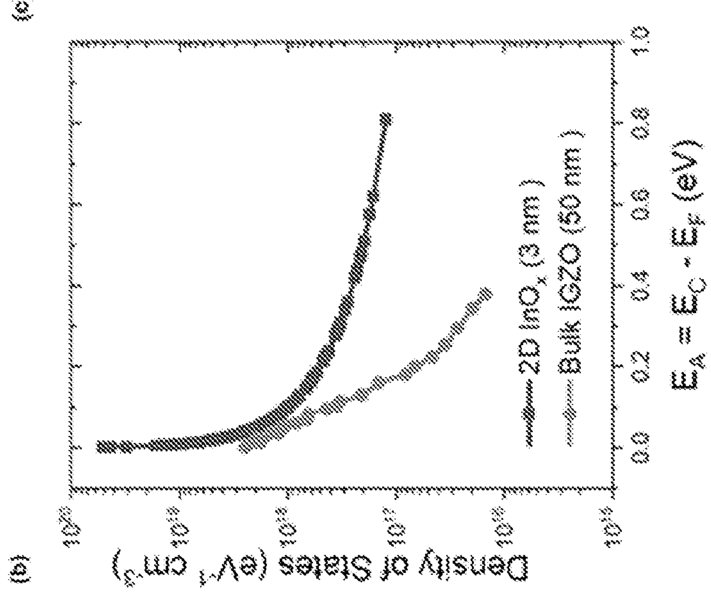
Figure 4:
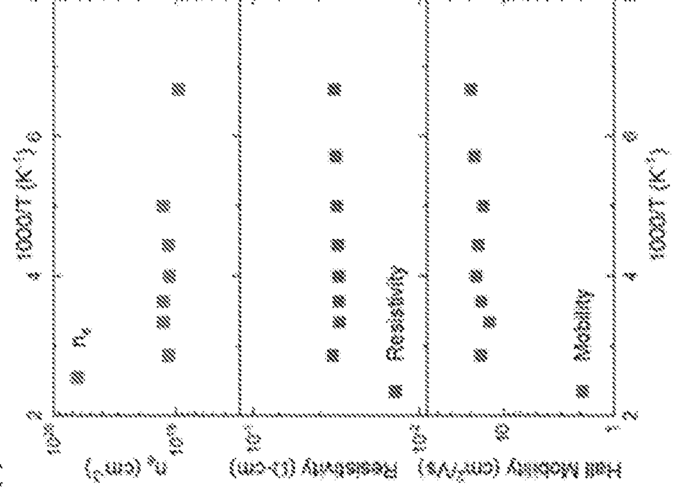

To understand the impact of post-annealing and quantum confinement on transport in the liquid-metal printed 2D $InO_x$, the electronic density of states (eDOS) was extracted using temperature-dependent transfer measurements of monolayer and bilayer thin film transistors from 20 to 100° C. The temperature dependent measurements allowed for an extraction of the eDOS (FIG. 4(*b*)) based on the thermally activated low-field drain conductance. Monolayer and bilayer films show differences, with bilayer films exhibiting higher band tail slope but lower band edge concentration of $4\cdot10^{19}$ cm$^{-3}$ for bilayer versus $1.4\cdot10^{20}$ cm$^{-3}$ for monolayer $InO_x$. These characteristics and the lower deep state concentration for bilayers are consistent with their higher mobility and improved subthreshold slope. A comparison of the printed 2D $InO_x$ eDOS also shows a higher band edge concentration $5\cdot10^{20}$ cm$^{-3}$ after 250° C. annealing, compared with $4\cdot10^{19}$ cm$^{-3}$ for the sample annealed at 175° C. Similarly, the more 2D $InO_x$ channels annealed at 250° C. exhibit a steeper band tail slope consistent with their transition from the amorphous to a nanocrystalline morphology. FIG. 4(*c*) shows a band diagram illustrating quantum confinement in 2D $InO_x$.

The liquid metal printed 2D oxide transistors disclosed herein demonstrate ultrahigh performance leveraging control of the electronic structure of nanoscale $InO_x$ films as seen through the extracted electronic density of states (eDOS). The 2D transistors disclosed herein demonstrate improved performance for low-temperature vacuum-free processed $InO_x$ suitable for flexible electronics applications as well as high-performance circuits in active interposers. Combined with the ultratransparency and mechanical flexibility of these films, their electronic performance can enable potential applications with wearable sensors, neuromorphic computing devices, and displays. Integration with high-speed printing technologies can allow manufacture of high-performance flexible electronics.

For example, flexible electronics can be manufactured on plastics. This can include displays (e.g., large area displays, transparent displays), smart windows, wearable sensors, imaging devices, or tools for imaging high-energy particles.

The transfer to different dielectric materials can be used to fabricate transistors in different configurations, such as a top gate, bottom gate, etc.

As shown in FIG. 1(*a*), a first workpiece includes a dielectric (e.g., $SiO_x$, $AlO_x$, $YO_x$, $HfO_x$, $ZrO_x$, $LaO_x$, or a rare earth, high-k dielectric). The dielectric on the first workpiece is referred to as the "target." A second workpiece (e.g., a plastic film like polyimide, polyethylene naphthalate, or polyethylene terephthalate) includes a metal (e.g., In, Sb, Ga, Zn, or Sn). The metal can have a purity of at least 99% in an instance. The metal on the second workpiece is referred to as the "donor." The first workpiece and second workpiece can be substrates.

The second workpiece is applied to the first workpiece at a first pressure such that the metal contacts the dielectric thereby forming an intrinsically doped binary oxide. The first pressure can be, for example, 10 psi to 10,000 psi (e.g., at least 400 psi). In an example, the first pressure is applied for a duration from 1-10 seconds (e.g., 2-5 seconds). These pressures and durations can provide the desired film performance. The resulting alloyed oxide film (e.g., an intrinsically doped binary oxide film or extrinsically doped binary oxide film) can be nanocrystalline. The meniscus for the metal can spread at a speed from 0.1 cm/s to 60 cm/s (e.g., from 1 cm/s to 60 cm/s).

The liquid printing can occur at a temperature of approximately 40° C. to 450° C. For example, the temperature can be from approximately 160° C. to 300° C., from 165° C. to 240° C., or from approximately 160° C. to 165° C. A temperature of 165° C. is shown in FIG. 1(*a*), but other temperatures are possible. For example, the temperature can be at least 165° C. These temperatures can provide the desired film performance.

The first workpiece and/or second workpiece can be heated to above a melting point of the metal. For example, first workpiece and/or second workpiece can be heated to from 100° C. to 250° C. before the applying step (e.g., 160° C. to 250° C. or at least 165° C.). As shown in FIG. 1(*a*), a monolayer or bilayer film can be formed. A multilayer film also can be formed. A monolayer film can be, for example, 2.2 nm thick or from 1.9 to 2.5 nm thick. A bilayer film can be, for example, from 1.5 nm to 5 nm thick, from 4.3 to 5.5 nm thick, or 4.8 nm thick. A multilayer film can be, for example, from 6 to 36 nm thick or from 5 to 10 nm thick.

The first workpiece can be separated from the second workpiece after the applying step. Metal can be removed from the first workpiece and/or the second workpiece after the applying or after the separating.

The alloyed oxide film can be patterned after formation, such as by etching.

A surface of the second workpiece also can include the dielectric. For example, the dielectric can be $SiO_2$.

The alloyed oxide film can be one of InZnO, $InGaZnO_x$, $InGaSnO_x$, $SnO_x$, $InSnO_x$, $GaSnO_x$, $SbSnO_x$, or $InGaO_x$. Other materials are possible using the embodiments disclosed herein.

In an instance, the metal includes In and the alloyed oxide film is an $InO_x$ film. The $InO_x$ film can be from 94% to greater than 99% transmissive (e.g., at least 99% transmissive). The $InO_x$ film can have a grain size from 6 nm to 45 nm. For example, the grain sizes can be from 30 to 40 nm, though other grain sizes are possible. The film also can be an amorphous film when there is alloying. Alloying with $InGaO_x$, InGaZnO, etc. can result in amorphous films without grains.

In another instance, the metal includes In and the alloyed oxide film is a metal-doped $InO_x$ film. For example, the metal-doped $InO_x$ film can be indium tin oxide (ITO).

In another instance, the metal includes Sb and the alloyed oxide film is an antimony tin oxide film.

Figure 5:
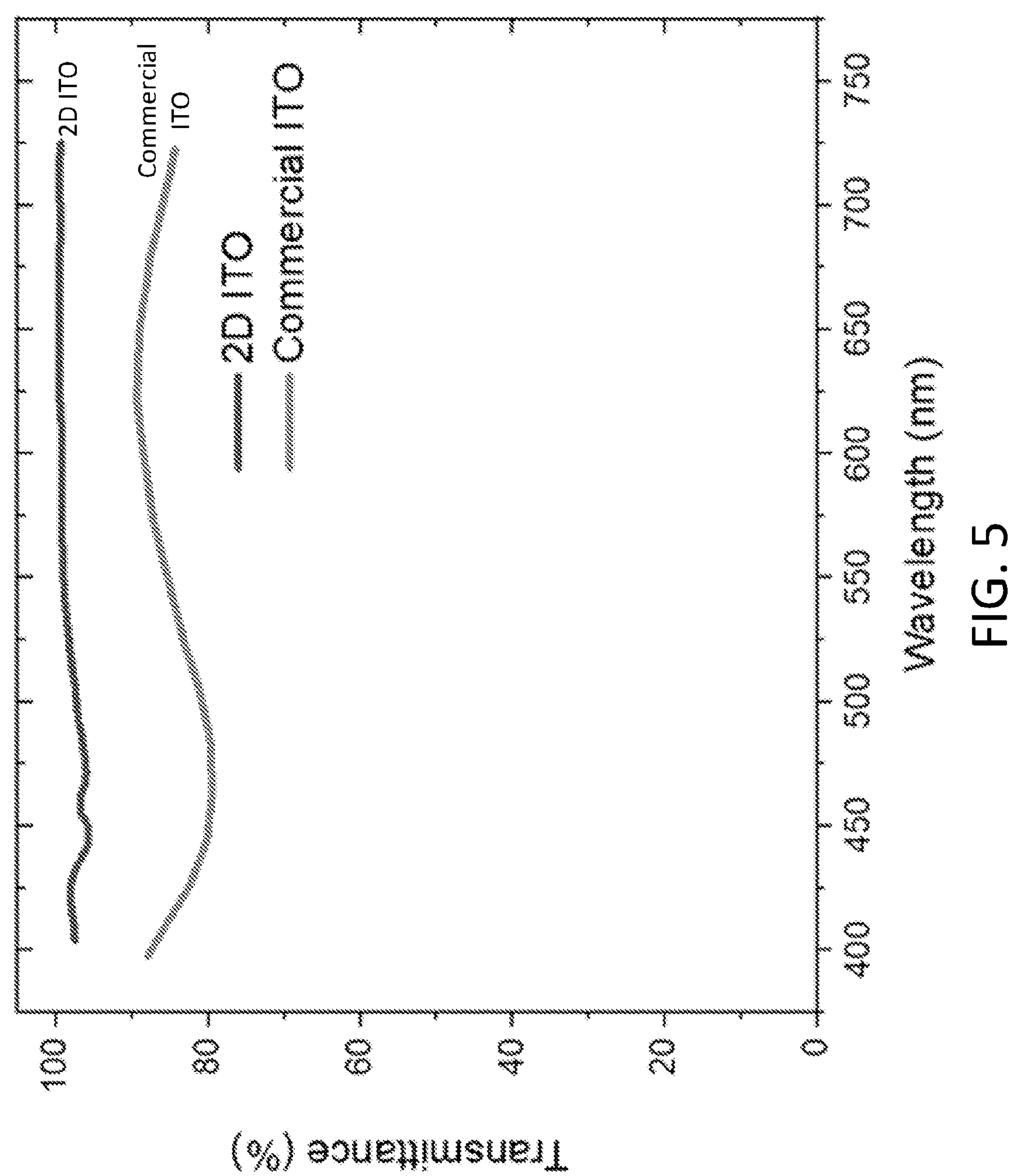
FIG. 5 compares transmittance versus wavelength for various ITO devices.
Figure 9:
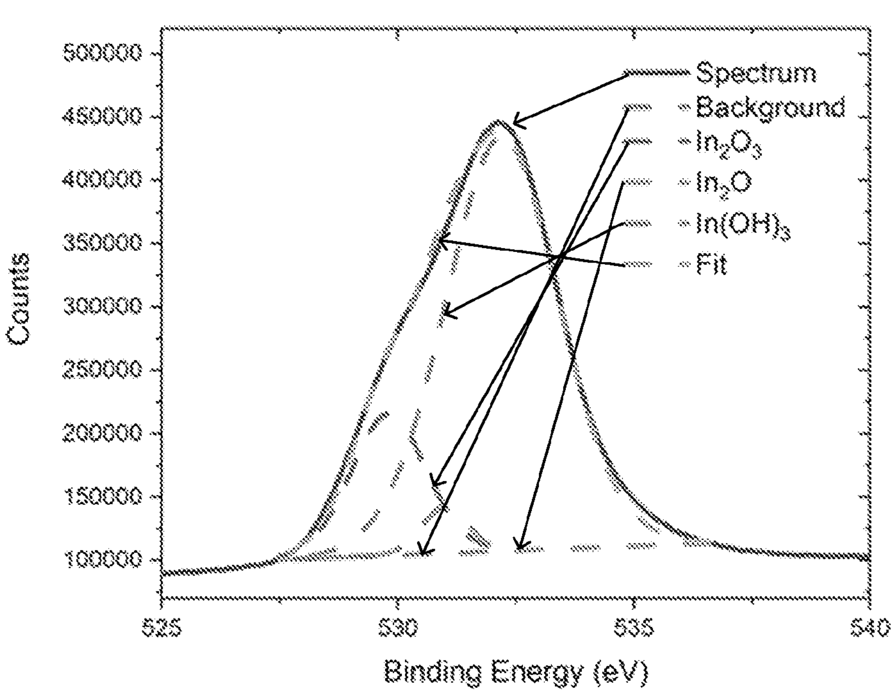
FIG. 9 shows (a) X-ray spectroscopy (XPS) O1s peak for sol-gel $InO_x$ film (5% Sn doping) processed at 200° C. from metal nitrate precursors and (b) XPS O1s peak for liquid-metal printed $InO_x$ (5% Sn doping) at 200° C.
Figure 9:
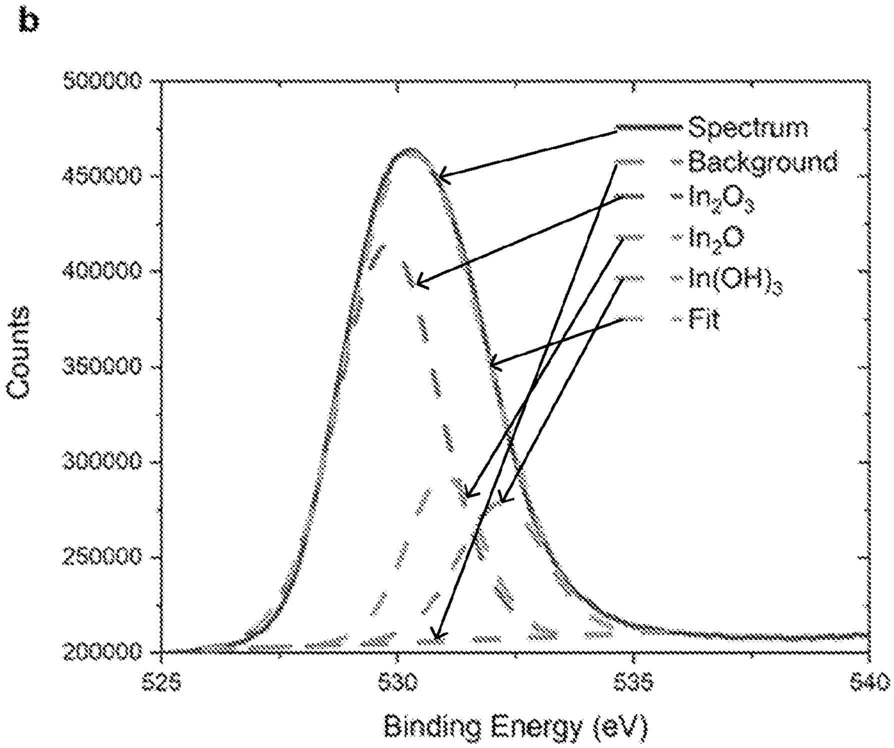
Figure 10:
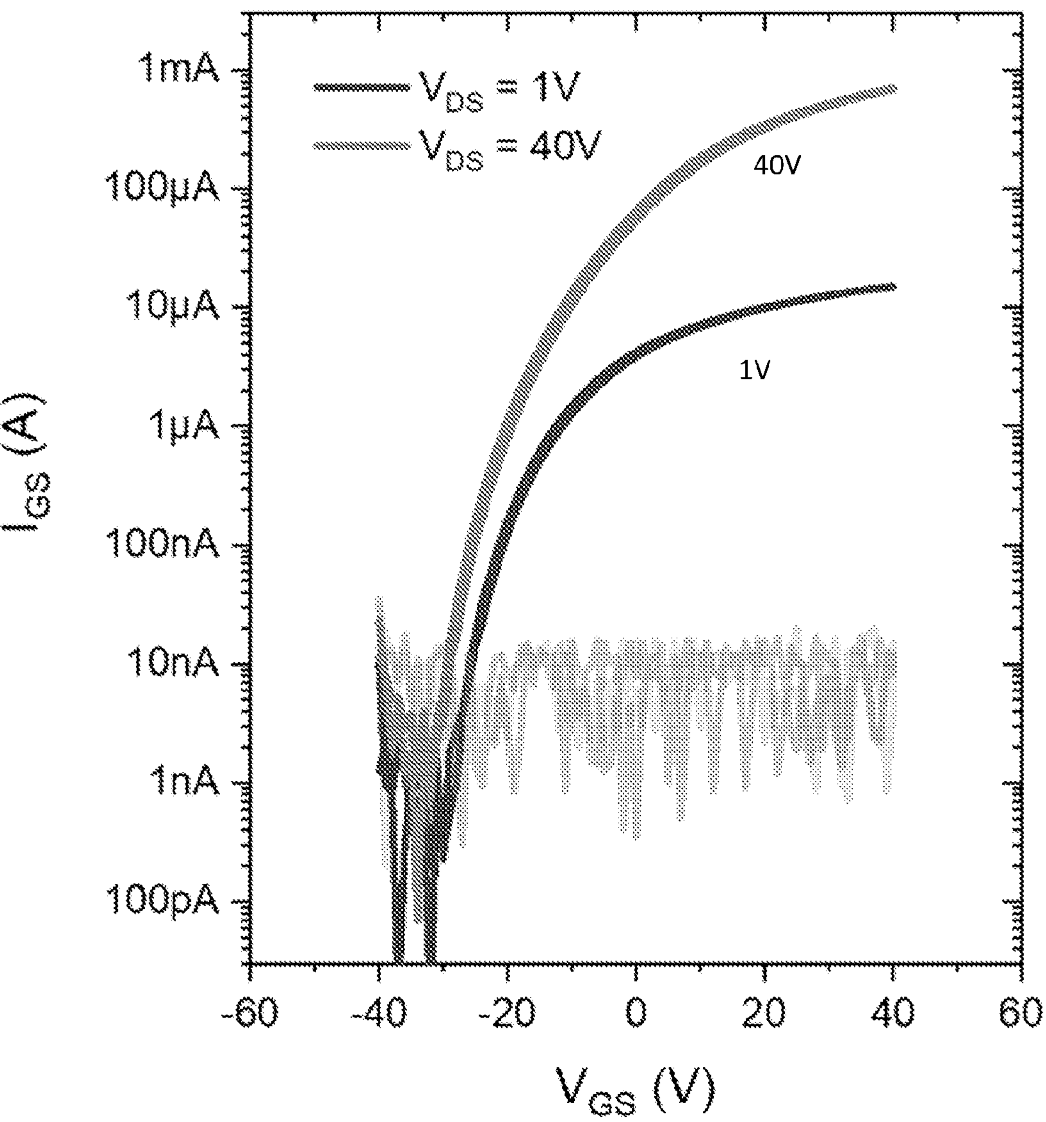
FIG. 10 shows transfer curves for bilayer transistor fabricated with 165° C. deposition temperature and 125° C. post-annealing.
Figure 11:
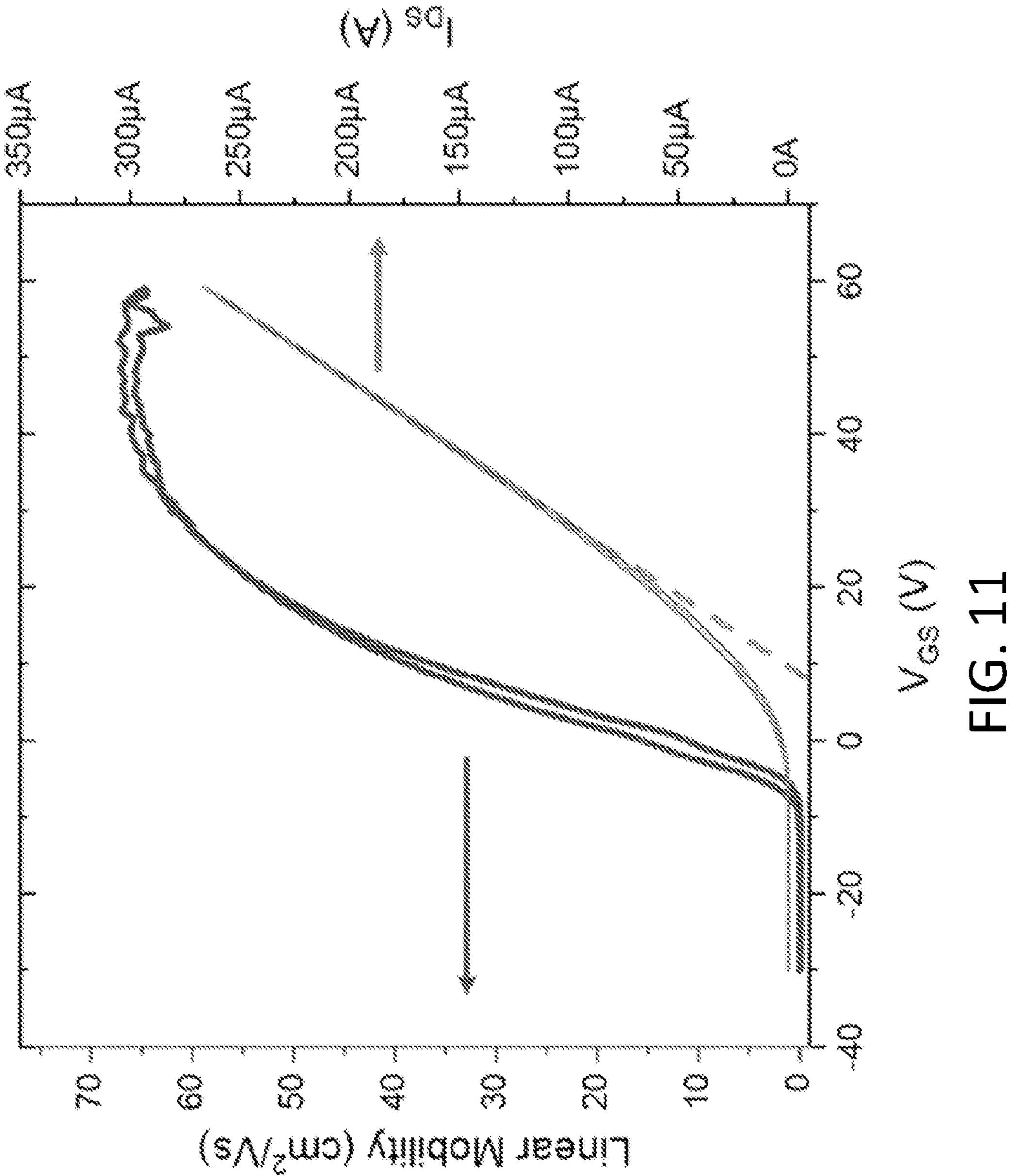
FIG. 11 shows incremental linear low-field mobility for bilayer $InO_x$ transistor post-annealed at 250° C.
Figure 12:
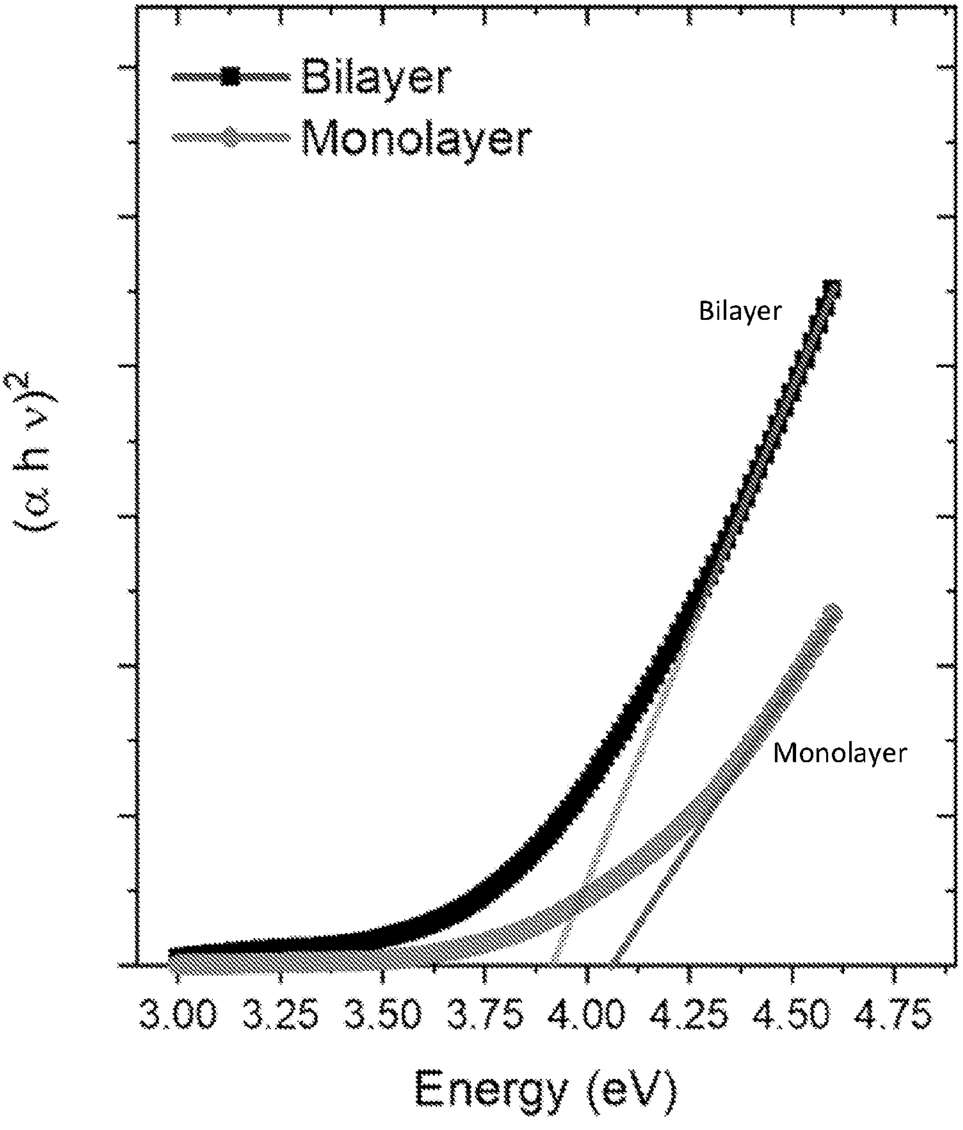
FIG. 12 shows a Tauc plot fits for monolayer and bilayer $InO_x$ films without post-annealing.
Figure 13:
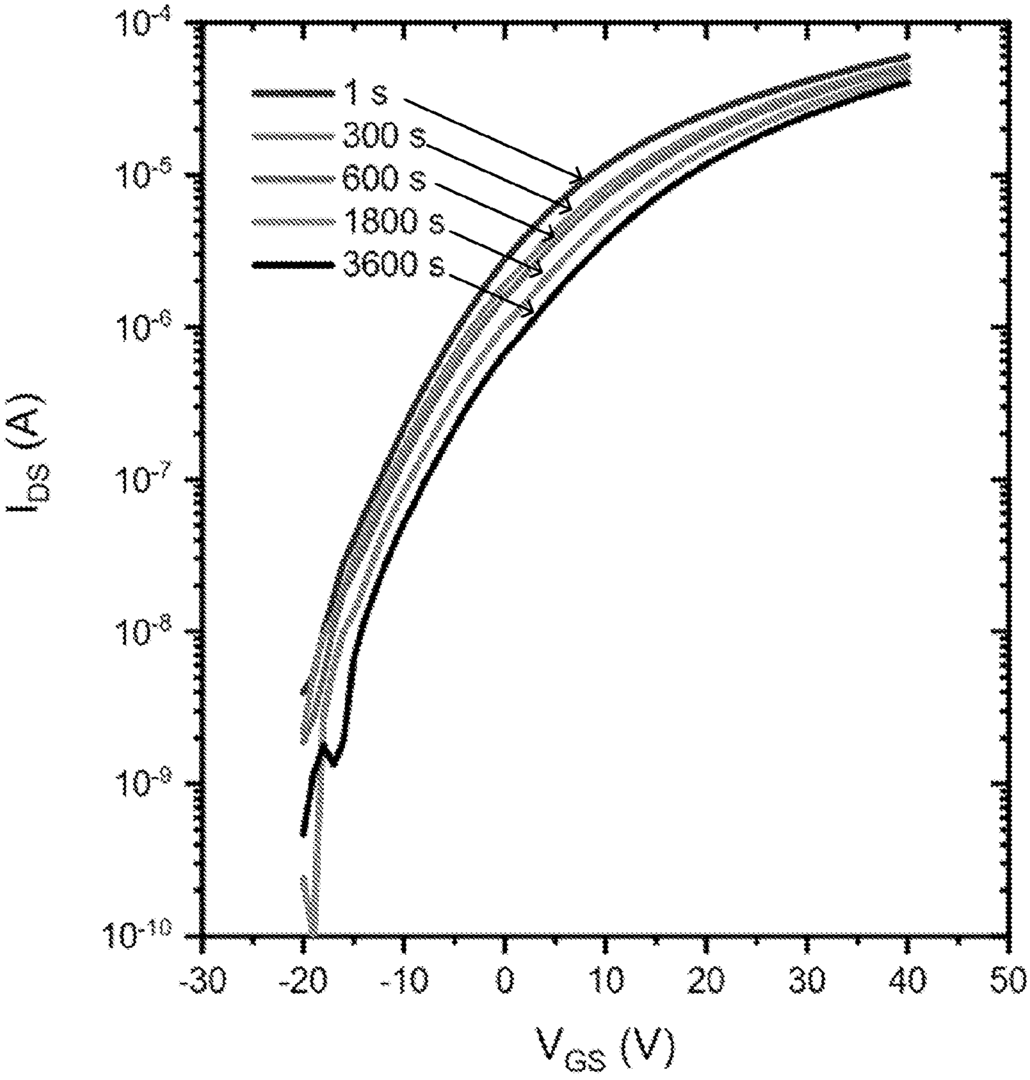
FIG. 13 shows transfer curves after positive bias stress at 40 V VGS applied to bilayer $InO_x$ TFT.
Figure 14:
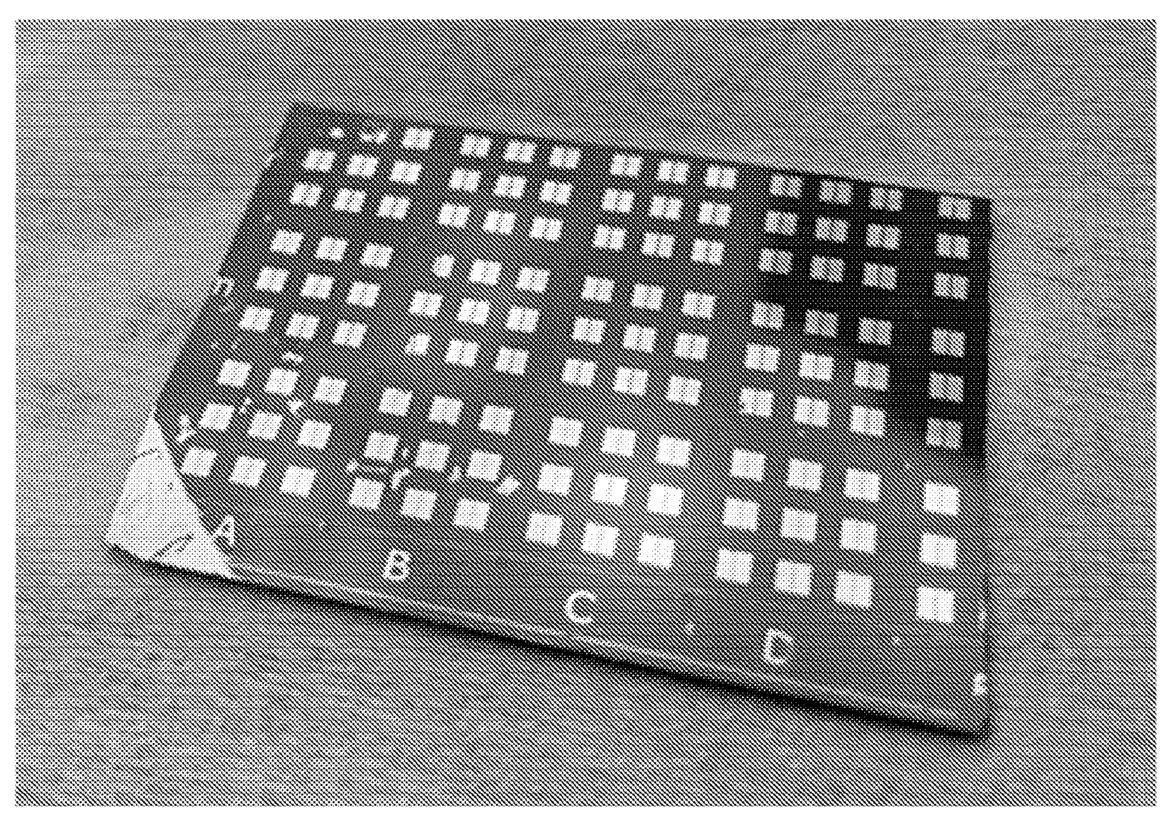
FIG. 14 is an exemplary patterned array of $InO_x$ monolayer devices.

To illustrate the embodiments above, FIG. 5 compares transmittance versus wavelength for various ITO devices. FIG. 9 shows (a) XPS O1s peak for sol-gel $InO_x$ film (5% Sn doping) processed at 200° C. from metal nitrate precursors and (b) XPS O1s peak for liquid-metal printed $InO_x$ (5% Sn doping) at 200° C. FIG. 10 shows transfer curves for bilayer transistor fabricated with 165° C. deposition temperature and 125° C. post-annealing. FIG. 11 shows incremental linear low-field mobility for bilayer $InO_x$ transistor post-annealed at 250° C. FIG. 12 shows a Tauc plot fits for monolayer and bilayer $InO_x$ films without post-annealing. FIG. 13 shows transfer curves after positive bias stress at 40 V VGS applied to bilayer $InO_x$ TFT. FIG. 14 is an exemplary patterned array of $InO_x$ monolayer devices.

In an instance, the dielectric is $GaO_x$, the metal is In, and the second workpiece is a roller. The applying in this instance includes rolling the roller over the first workpiece. The liquid printing can occur at a temperature of approximately 100° C. to 300° C. In an instance, a second $GaO_x$ layer can be applied to the alloyed oxide film and a second alloyed oxide film can be applied to the second $GaO_x$ layer using a similar technique as the first alloyed oxide film. A pressure (e.g., a line pressure) on the first workpiece from 0.1 to 100 N/cm can be used with the roller. These pressures can provide the desired film performance. Application time of the roller can be less than 0.1 seconds if the linear speed is high and the roller diameter is small.

The roller can be polymer (e.g., silicone rubber, butyl rubber, or polyethylene) or stainless steel. In an embodiment, a rigid roller (e.g., stainless steel) can be used with flexible substrates whereas rigid substrates can be used with a flexible roller (e.g., polymer). This can provide uniform contact pressure from the compliance of the softer component. However, a rigid roller can be used with a rigid substrate and a flexible roller can be used with a flexible substrate.

The temperature when using the roller can be from approximately room temperature (e.g., 40° C.) to 450° C. These temperatures can provide the desired film performance. The temperature refers to the substrate temperature (e.g., dielectric workpiece) and the temperature of the liquid metal droplet. The roller itself can be preheated to reach equilibrium with the substrate temperature, which can improve uniformity.

Plasma treatments (e.g., air plasma) can be applied to the surface of one or both workpieces to promote adhesion of the multilayer films. This can improve uniformity and performance of the resulting films when using the roller.

The following examples are provided for illustrative purposes and are not intended to be limiting.

First Example

A 2D $InO_x$ transistors with improved switching performance is fabricated via a rapid pneumatic liquid metal printing process at low temperatures (165° C.). Liquid metal printing is a good match for an intrinsically conductive oxide, such as $InO_x$ that requires forming ultrathin films to deliver electrostatic control. These devices illustrate the advantages of liquid metal printing (LMP) for forming crystalline and highly conducting films as deposited, avoiding insulating intermediate phases and eliminating the thermodynamic barriers posed by precursor decomposition. Leveraging this process, these distinctive nanocrystalline morphologies of 2D $InO_x$ lead to its improved electronic transport characteristics. The electronic structure can be engineered for high-performance thin-film transistors.

Figure 15:
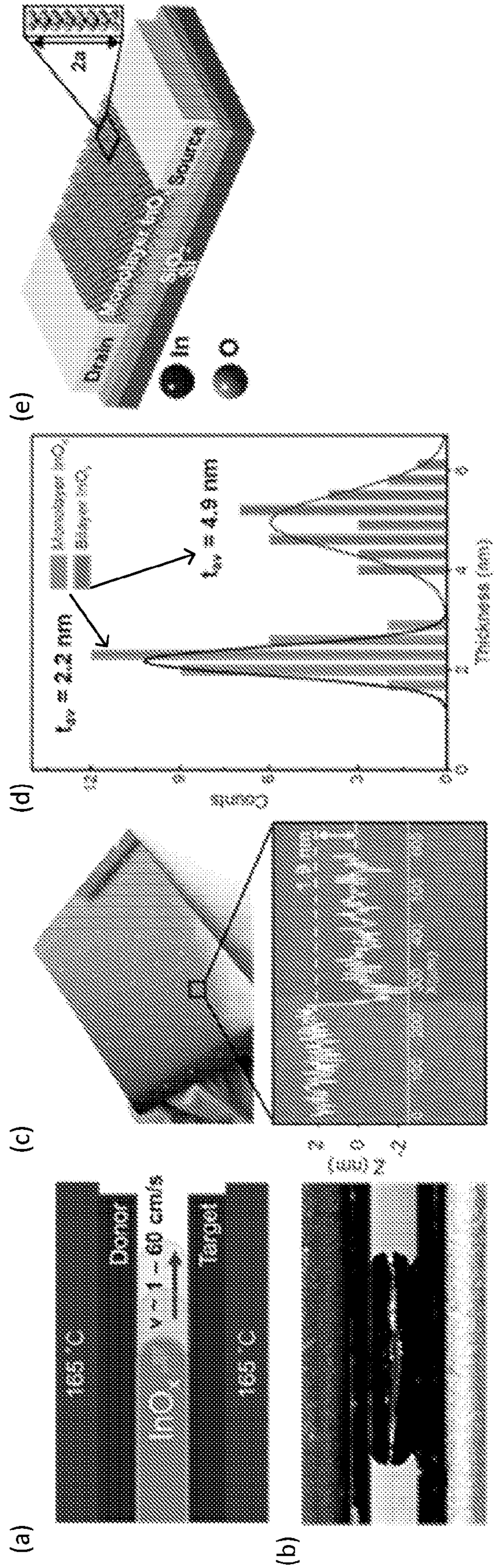
FIG. 15 shows (a) a schematic for liquid metal 2D oxide deposition; (b) a photograph of a liquid metal droplet during pneumatic pressing process; (c) a large-area (30 $cm^2$) array of 2D $InO_x$ semiconductors (top) with height map (bottom) with line scan for a monolayer film; (d) a histogram of measured thicknesses for monolayer and bilayer $InO_x$ films; and (e) an atomic-scale illustration of monolayer $InO_x$ channel transistor two unit cells thick.

The disclosed liquid metal printing process delivers lower process temperatures (165° C.) by leveraging a temperature-controlled dual-sided thermomechanical transfer of liquid metal-derived oxide nanosheets. This process (FIG. 15(*a*)) relies on the spontaneous growth and subsequent high-speed transfer of a nanoscale solid oxide skin on a spreading droplet of liquid indium metal. This process is applied to generate large continuous sheets of $InO_x$ at the 20 $cm^2$ scale, which are rapidly deposited via the spreading of the liquid metal meniscus (FIG. 15(*b*)) at a speed of 0.1-60 cm $s^{-1}$, as estimated by slow-motion photography. Controlling the donor and target substrate temperatures allows for uniform deposition of arrays over large areas (FIG. 15(*c*)) and for process control to modulate the electronic properties of the transferred 2D $InO_x$ films. The printing process can be tuned to produce 2.2±0.3 nm monolayer or 4.9±0.6 nm bilayer nanosheets (FIG. 15(*d*)) by utilizing variable donor surfaces with plastic donors transferring bilayers and smoother $SiO_2$ donor surfaces transferring monolayer films. FIG. 15(*e*) illustrates a nanoscale view of thin-film transistors incorporating these 2D semiconducting channels composed of just two unit cells of $InO_x$. Cross-section of the bilayer specimen was also observed via transmission electron microscopy (TEM), which reveals a thickness of approximately 4.8 nm for the bilayer $InO_x$ films produced with the liquid metal printing method, as shown in FIG. 1(*b*).

Figure 19:
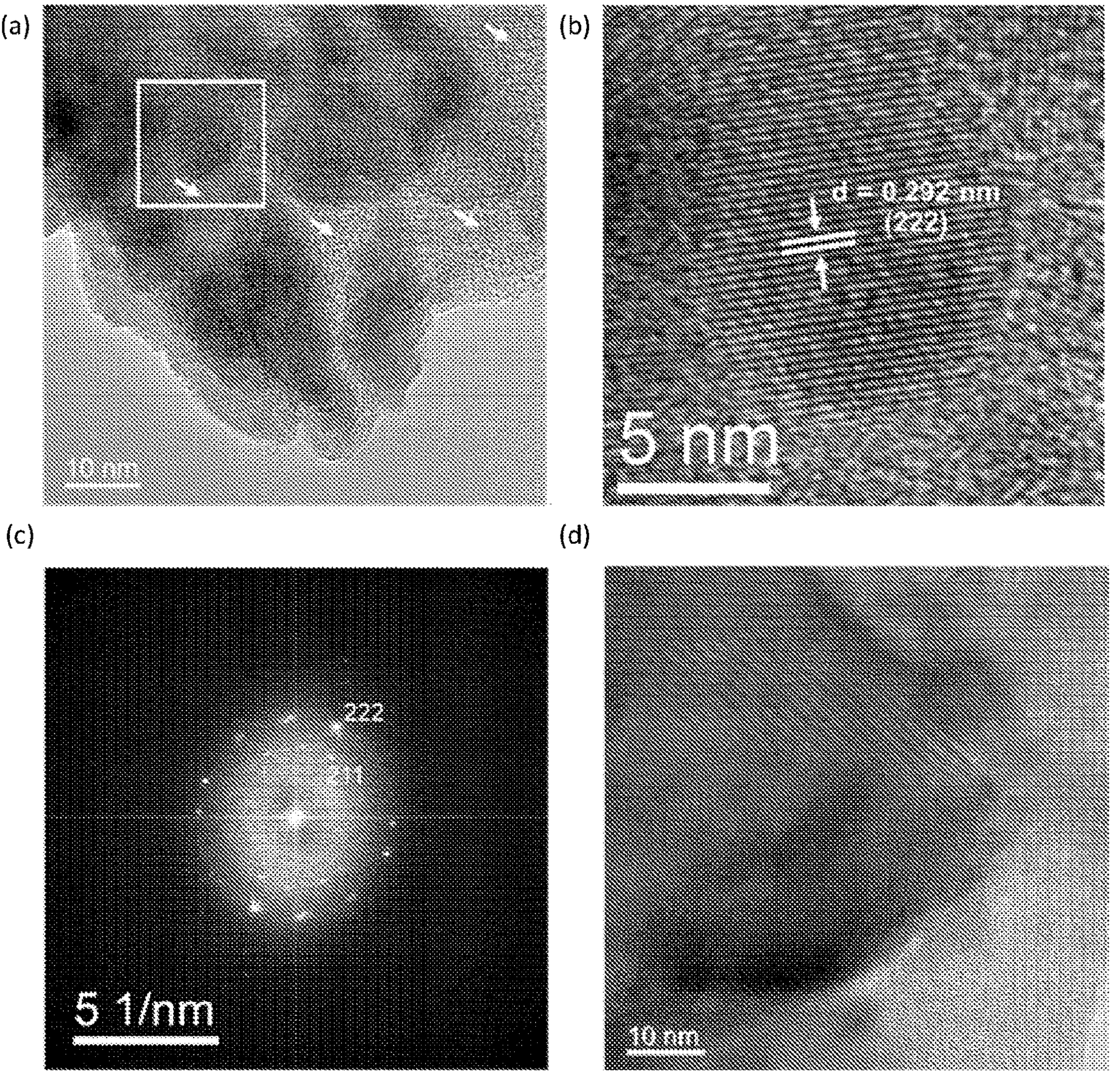
FIG. 19 shows (a) HRTEM image of the unannealed $InO_x$ nanosheet wherein the arrows show an amorphous region; (b) an enlarged view of a crystalline region and amorphous region below it; (c) the fast Fourier transform (FFT) image of the region highlighted in (a); and (d) Moiré fringes observed by HRTEM in bilayer $InO_x$.
Figure 20:
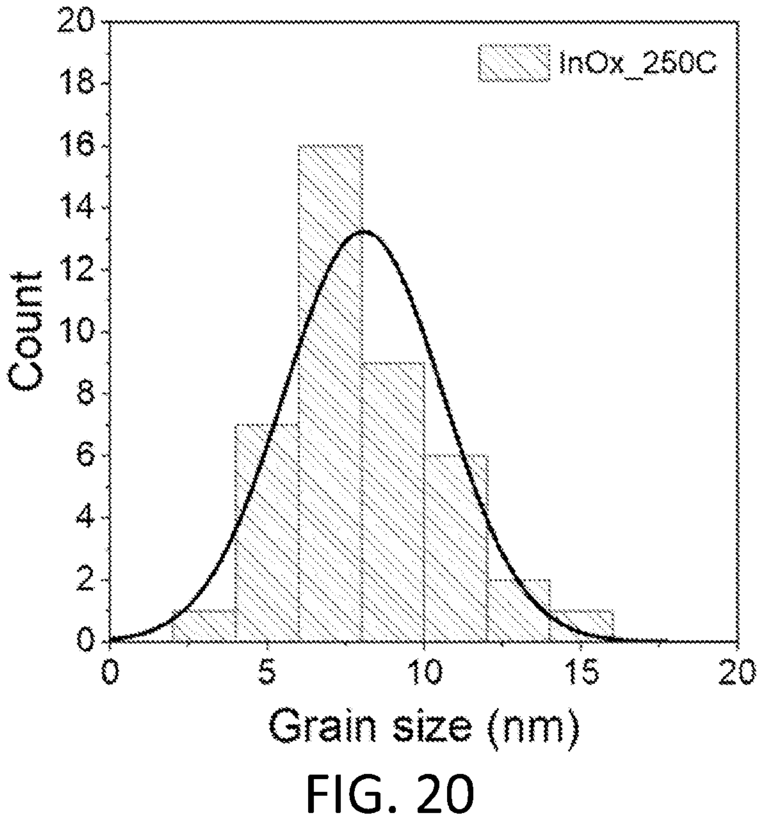
FIG. 20 shows grain size distribution for post-annealed bilayer $InO_x$ films analyzed by TEM wherein the average grain size is 8.1 nm with a standard deviation of 2.6 nm.

These ultrathin $InO_x$ films exhibit both highly crystalline and amorphous regions for both monolayer and bilayer depositions. A top-down view of the nanosheets was characterized using high-resolution TEM (HRTEM) to provide further insight into the morphology and crystalline structure of the bilayer $InO_x$ films produced via the liquid metal printing process with and without post-annealing (FIG. 19). After annealing at 250° C. for 1 hour, these films exhibit domains in varying orientations with lateral dimensions of up to 20 nm (as shown in FIG. 1(*c*)). The Moiré fringes in these TEM images also demonstrate that the overlay of two nanosheets can be deduced for both unannealed and post-annealed specimens. TEM-based grain size analysis of the post-annealed films (FIG. 20), for example, shows a range from 5 to 15 nm, with an average of 8.1±2.6 nm. These grains can be larger in their lateral dimension than the transferred film thickness, a property typically associated with highly ordered materials produced by methods such as pulsed laser deposition (PLD). The enlarged view in the inset displays well-defined lattice fringes, corresponding to the (400) lattice plane of cubic $In_2O_3$. The nanocrystalline feature of the nanosheet can also be confirmed by the selected area electron diffraction (SAED) pattern, which exhibits diffraction rings typical of cubic $In_2O_3$, as shown in FIG. 1(*d*).

Figure 21:
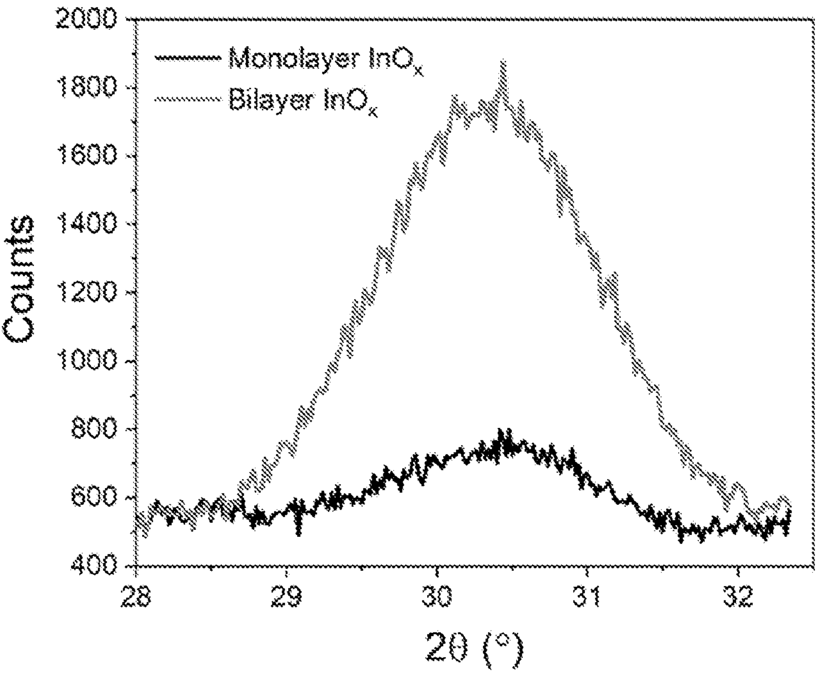
FIG. 21 shows XRD spectra for 2D liquid metal printed monolayer and bilayer 2D $InO_x$ films in as-deposited condition.
Figure 22:
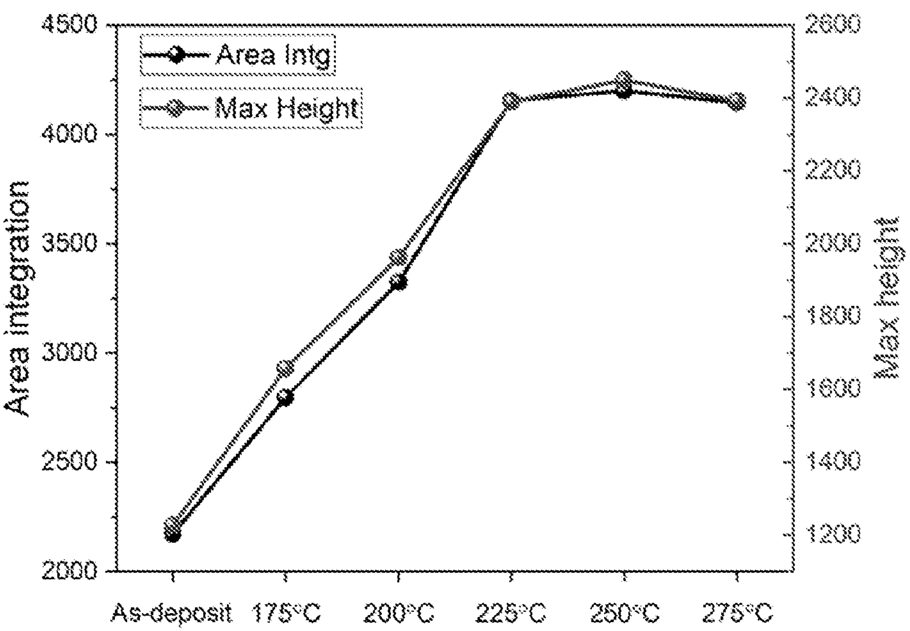
FIG. 22 shows integrated intensity and peak height for (222) XRD peak of bilayer $InO_x$ films.
Figure 23:
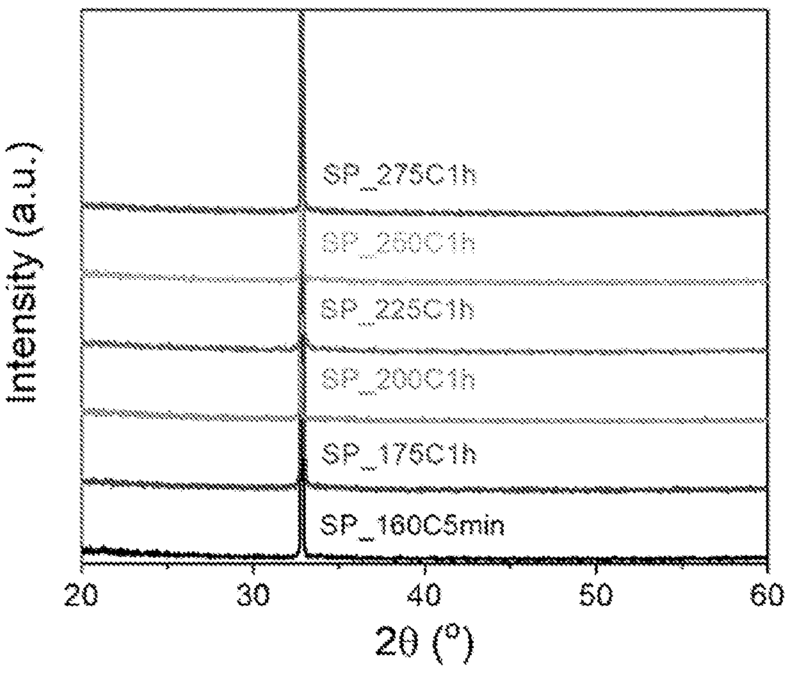
FIG. 23 shows XRD spectra for solution-processed $InO_x$ after varying post annealing temperature that exhibits amorphous phase.

X-ray diffraction (XRD) spectra of these films are dominated by a single (222) peak of cubic $InO_x$ for both the monolayer and bilayer films (FIG. 21). The average crystallite size predicted by Scherrer analysis of the (222) peak of monolayer films is similar to that of bilayer films, yielding 6.6 nm and 5.9 nm, respectively, with no significant change in crystallite size upon post-annealing. This lack of recrystallization of nanosheets separated by a van der Waals gap matches recent reports of liquid metal printed 2D indium tin oxide (ITO). With subsequent annealing, the $InO_x$ (222) peak increases in intensity (FIG. 1(*f*)), reaching its highest integrated intensity after approximately 225° C. (FIG. 22). For comparison, a control sample of sol-gel synthesized $InO_x$ produced by spin coating was measured by XRD, showing only the amorphous phase even with thermal annealing up to 275° C. (FIG. 23). The cubic phase observed in these studies also stands in contrast to recent reports of rhombohedral $In_2O_3$ formed by liquid metal printing at higher temperatures and in inert environments.

Figure 24:
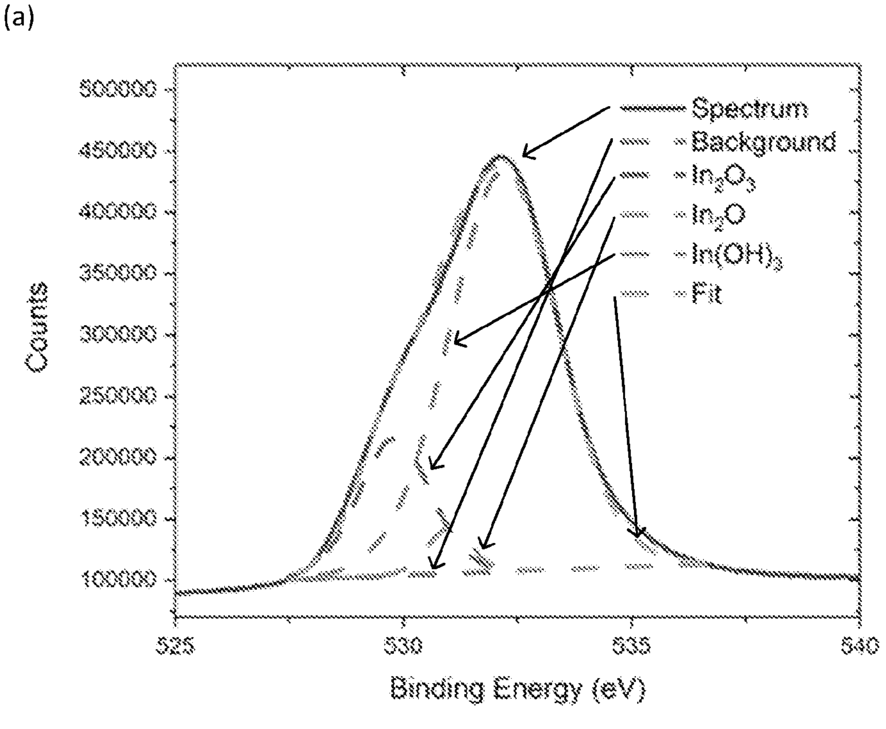
FIG. 24 shows (a) XPS O1s peak for sol-gel $InO_x$ film (5% Sn doping) processed at 200° C. from metal nitrate precursors and (b) XPS O1s peak for liquid-metal printed $InO_x$ (5% Sn doping) at 200° C.
Figure 24:
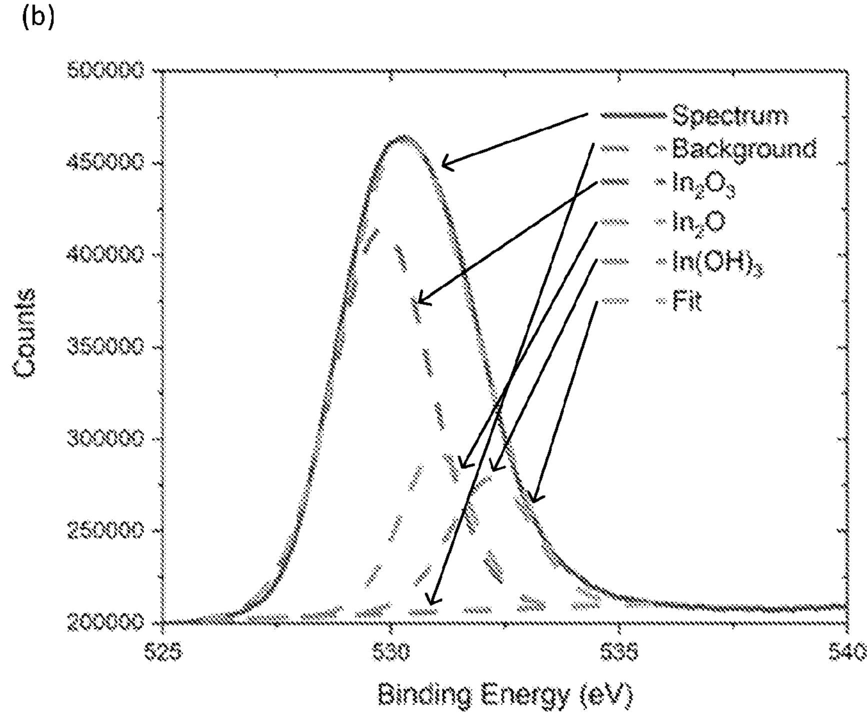

These results indicate that an advantage of liquid metal printed 2D oxides relative to predominate sol-gel formulations is the ability to achieve crystalline films as deposited and avoid hydroxide formation, a known acceptor type defect limiting the conductivity of $InO_x$. The lack of carbonaceous solvents or metal salt precursors in our liquid metal printing method eliminates the requisite formation of intermediate phases dominated by metal hydroxide bonding. This can be seen in the XPS O1s peaks for spin-coated sol-gel films (FIG. 24) which include 79% M-OH bonding compared with liquid metal printed films that show minimal hydroxide content (18% M-OH) as show in Table 2. The disclosed liquid metal printing method can provide a method to deposit these ultrathin 2D oxide semiconductors while controlling their electronic properties to achieve high mobility.

TABLE 2

Composition of sol-gel and printed 2D $InO_x$ films determined from XPS O1s fitting.

| | % $In_2O_3$ | % $In_2O$ | % $In(OH)_3$ |
|---|---|---|---|
| Sol-Gel Processed $InO_x$ | 17.82 | 3.60 | 78.58 |
| Printed $InO_x$ | 62.70 | 19.19 | 18.11 |

Figure 25:
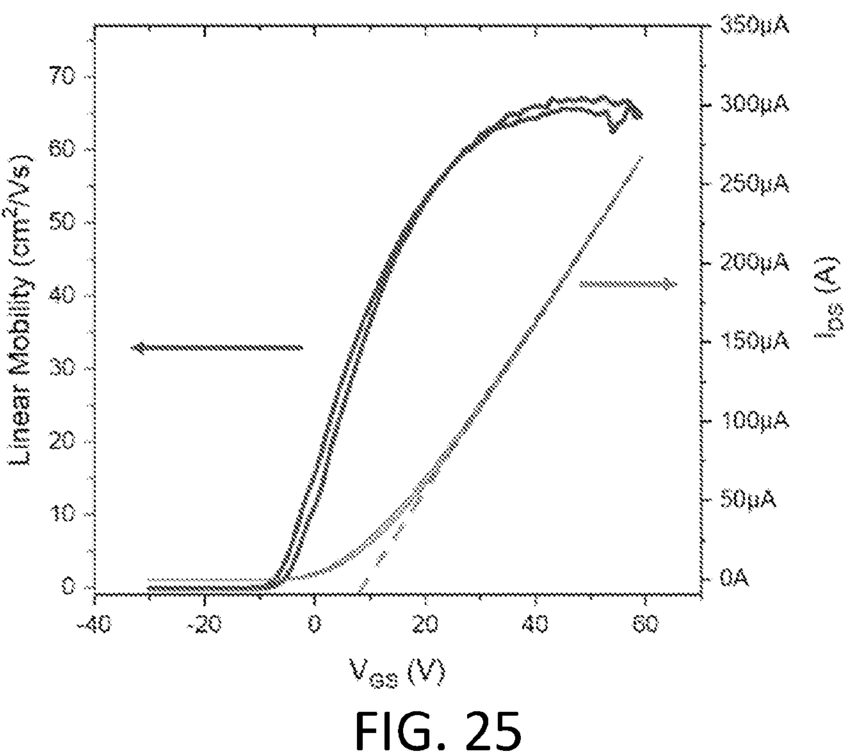
FIG. 25 shows incremental linear low-field mobility for bilayer $InO_x$ transistor post-annealed at 250° C.

The liquid metal synthesized 2D $InO_x$ films were integrated into thin-film transistors with improved switching performance exceeding those of competing low-temperature solution-processed metal oxide semiconductors. FIG. 2(*a*) shows the transfer characteristics of the champion $InO_x$ transistor, which exhibits extremely high electron mobility, as well as minimal hysteresis for forward and reverse sweeps after 250° C. post-annealing in air. The linear regime transfer curve exhibits a peak linear mobility reaching a stable value of approximately 67.1 $cm^2 V^{-1} s^{-1}$ (FIG. 25) with a threshold voltage ($V_t$) of approximately 10 V. This on-state performance is complemented by ideal current saturation as shown in the output curve in FIG. 2(*b*), indicating the absence of back-channel conduction or instability in these high mobility materials. The current saturation and low hysteresis in these $InO_x$ devices differentiate them from reports of highly conductive channels formed liquid metal 2D oxide TFTs. The low hysteresis and steep sub-threshold slope additionally suggest the potential for the disclosed liquid metal printed 2D $InO_x$ to serve as a building block for high-performance thin-film circuits in a variety of large area electronics.

Figure 16:
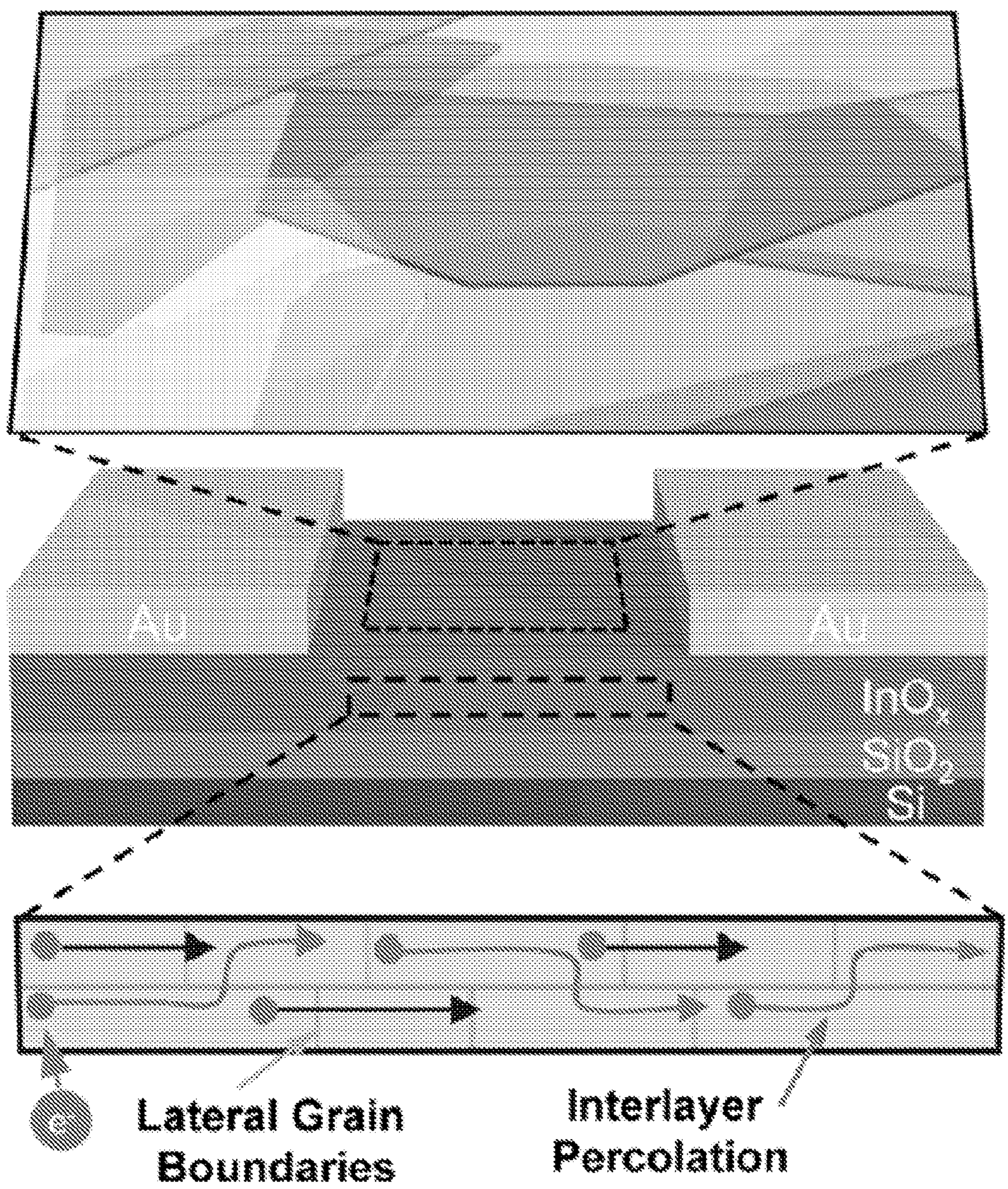
FIG. 16 shows a schematic of a device architecture with overlapped 2D bilayer grain structure leading to efficient interlayer electronic transport and high electron mobility.

The exceptionally high electron mobility in these liquid metal printed transistors exceeds even that of $In_2O_3$ transistors fabricated by ALD or DC sputtering, illustrating an advantage of the unique 2D grain morphology shown by HRTEM (FIG. 16). A highly overlapped grain morphology can enhance percolative transport in highly conductive 2D nanosheet networks, such as CVD-grown graphene films. The overlapping grain morphology is a unique 2D material feature of the $InO_x$ channels disclosed herein, since vacuum-deposited $In_2O_3$ otherwise tends towards microstructures with through-thickness grains with transport limited by grain boundary scattering. Highly vertically overlapping grain morphologies can resolve this limitation, providing more efficient, inter-grain transport.

Unlike other printable 2D semiconductors such as $MoS_2$, $WS_2$, and $WSe_2$ that consist of approximately 1-10 μm scale nanosheets, 2D oxides can allow large-scale continuous films (e.g., 1 $mm^2$-1 $cm^2$) suitable for flexible device integration. Nanosheet networks of traditional TMD 2D materials can be limited by sheet-to-sheet charge transport, resulting in measured electronic mobility 10-100× lower than the single crystal mobility as the area is scaled above the area of individual nanosheets. FIG. 2(*c*) illustrates this trend of mobility versus device area for reports of transistors with 2D semiconductor channels. This shows the favorable large area scaling of 2D oxides that maintain high mobility while allowing for printing-based-integration. Liquid metal printing can become an attractive low capital expenditure manufacturing technology for commercialization of these oxide devices, particularly if selective deposition processes can be applied to eliminate the need for subtractive etching processes.

Figure 17:
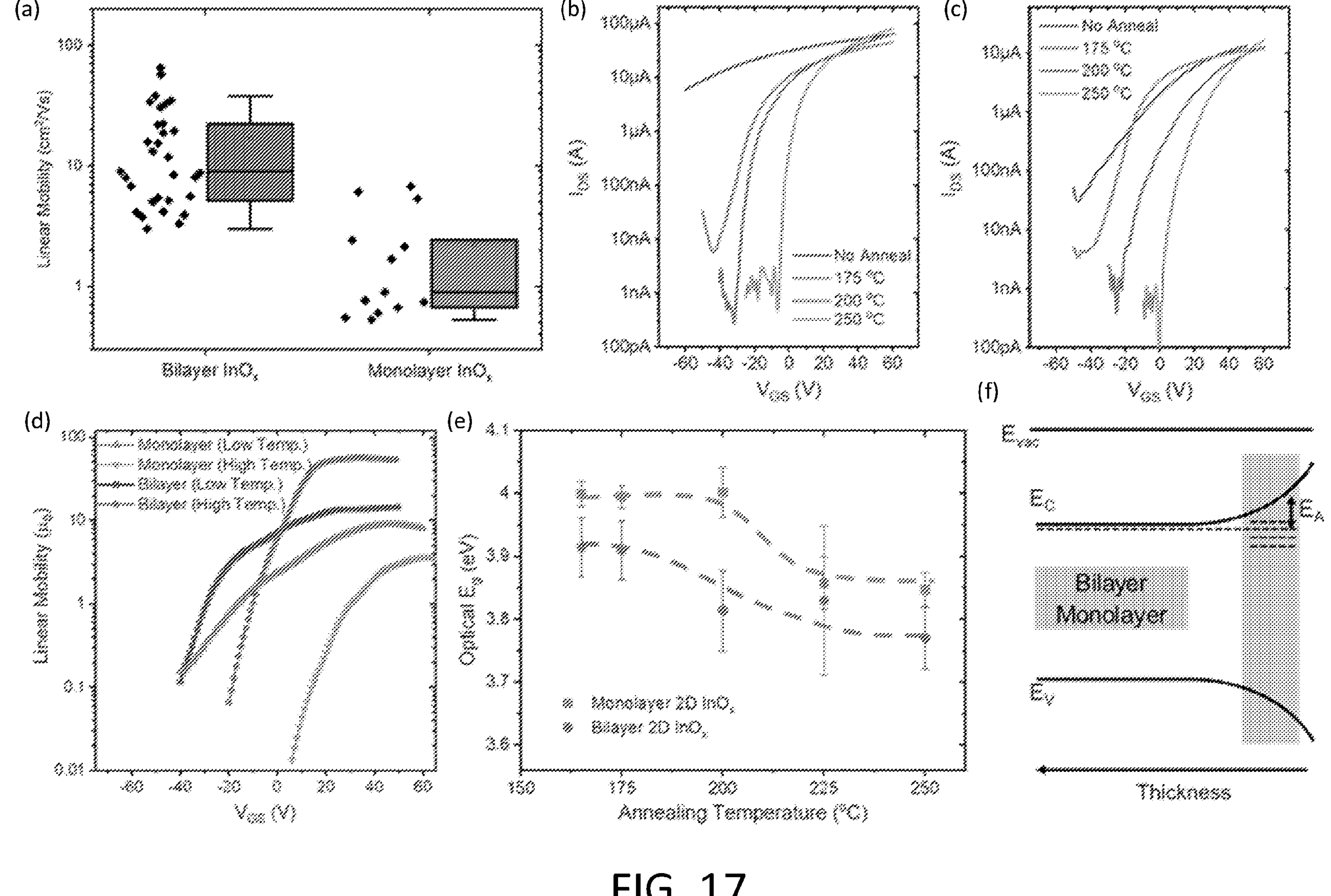
FIG. 17 shows transistor performance characteristics and optical properties versus thermal post-annealing including (a) a linear mobility comparison between bilayer and monolayer $InO_x$ transistors; representative transfer curves for bilayer (b) and monolayer (c) printed $InO_x$ transistors on $SiO_2$ dielectrics, post-annealed in air at temperatures from 150° C. to 250° C.; (d) incremental linear mobility versus gate voltage for monolayer and bilayer $InO_x$ transistors with low and high temperature post-annealing; (e) an optical bandgap of monolayer and bilayer 2D $InO_x$ films extracted from UV-absorption with error bars of one standard deviation (SD); and (f) a band diagram illustrating quantum confined band structure for monolayer and bilayer $InO_x$.
Figure 26:
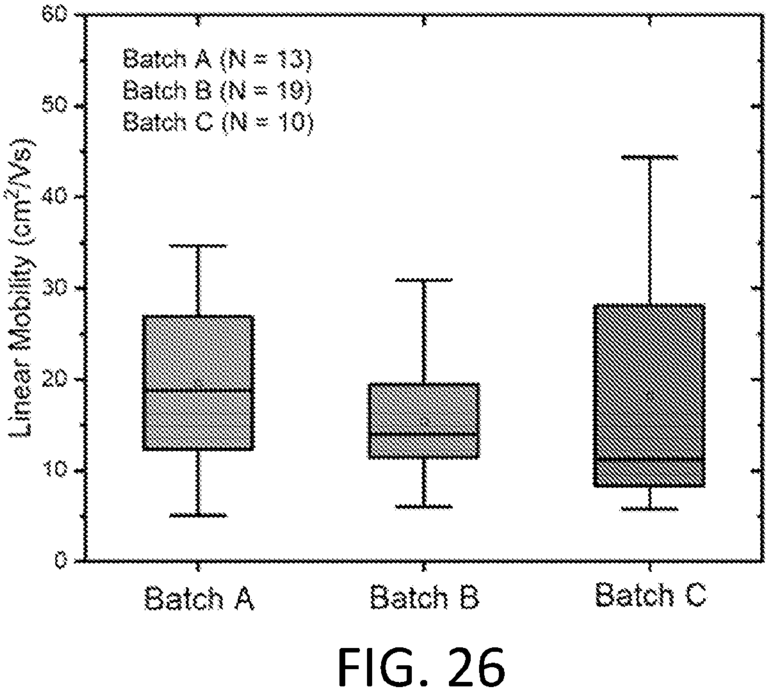
FIG. 26 shows batch-to-batch performance comparison for bilayer $InO_x$ transistors such that the box spans±twice the standard error, the whisker denotes the 10th and 90th percentiles, and the small square denotes the mean and the middle line denotes the median.
Figure 27:
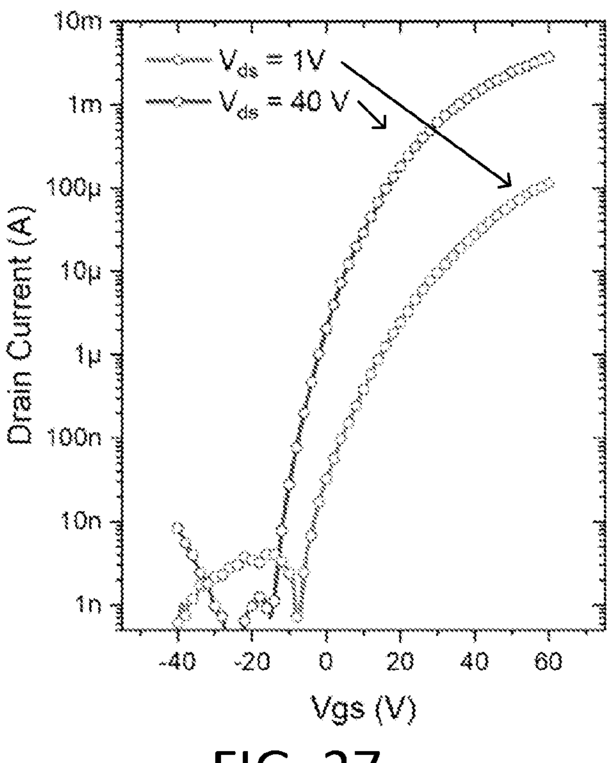
FIG. 27 shows a transfer curve for a bilayer transistor fabricated with 165° C. deposition temperature and no post-annealing.
Figure 28:
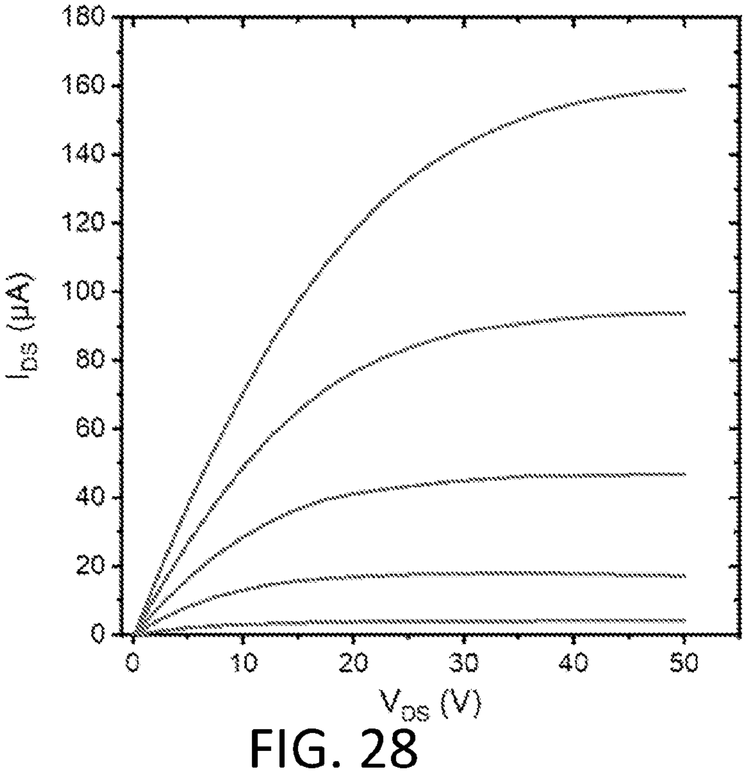
FIG. 28 shows output curves for bilayer transistor fabricated with 165° C. deposition temperature and no post-annealing.

Liquid metal printed 2D $InO_x$ transistors deposited in a single printing step over large area substrates (>30 $cm^2$) achieve high mobility for both monolayer and bilayer channels. FIG. 17(*a*) illustrates a comparison between post-annealed (250° C.) bilayer and monolayer devices from multiple batches, which exhibit average low-field linear mobility of 17 $cm^2 V^{-1} s^{-1}$ and 2.3 $cm^2 V^{-1} s^{-1}$, respectively. Table 3 reports the performance statistics for a single sample (N=13), showing $\mu_{lin}$ of 19.6±13.1 $cm^2 V^{-1} s^{-1}$, a $\mu_{sat}$ of 14.4±11.7 $cm^2 V^{-1} s^{-1}$, and a Vth of −12.8±4.8 V. Multiple subsequent device batches demonstrated similar performance, with average linear mobility of 15-19 $cm^2 V^{-1} s^{-1}$ and champion devices above 35 $cm^2 V^{-1} s^{-1}$ (FIG. 26). Low-temperature processed bilayer devices exhibit peak mobility up to 37 $cm^2 V^{-1} s^{-1}$ (Table 3) as well as high on-currents (FIG. 27) and improved current saturation (FIG. 28), even with ≤175° C. annealing. These processing conditions are within the limits of flexible substrates such as polyethylene. Compared with the highest performing bilayers, monolayers exhibit lower peak mobility ($\mu_0$~3.0 $cm^2 V^{-1} s^{-1}$) but have more positive turn-on voltages. The enhanced transport in bilayer films can also be justified as a result of the nanocrystalline grain structure observed by TEM, which produces significant overlap area between the vertically overlaid nanosheets.

TABLE 3

Performance summary for bilayer liquid metal printed $InO_x$ transistors on a single substrate (area approximately 6 $cm^2$). N = 13

| | $I_{on}/I_{off}$ | $V_{th}$ (V) | $\mu_{lin}$ ($cm^2$/Vs) | $\mu_{sat}$ ($cm^2$/Vs) | SS (V/dec) |
|---|---|---|---|---|---|
| Mean | $7.4 \cdot 10^5$ | −12.8 | 19.6 | 14.4 | 1.16 |
| Standard Deviation | $1.5 \cdot 10^6$ | 4.8 | 13.1 | 11.7 | 0.41 |
| Peak | $5.1 \cdot 10^6$ | −5.4 | 37.9 | 39.3 | 0.77 |

Post-annealing processes after the initial 2D oxide film transfer control electronic transport for the $InO_x$ films of varying thickness. Bilayer and multilayer 2D $InO_x$ transistors exhibit high on-current after deposition, but post-annealing processes can be used read the free-carrier concentration and allow effective gating. FIG. 17(*b*) and FIG. 17(*c*) illustrate transfer curves for bilayer and monolayer $InO_x$ transistors with various post-annealing temperatures, reaching optimal characteristics with high $I_{on}/I_{off}$ near 200° C. post-annealing. Sufficient thermal post-annealing was observed to shift the turn-on voltage (Von) from a depletion mode operation to enhancement mode operation and yield a steeper subthreshold slope. Thermal post-annealing also enhances the low-field electronic mobility of the $InO_x$ transistors (FIG. 17(*d*)), which is consistent with the higher crystalline fraction of annealed samples compared with the as-deposited thin films. Similar to the crystallinity, the mobility begins to reach its peak at 200-225° C. For predominant circuit applications, enhancement mode operation with Von near 0 V is desirable. The free-carrier concentration of $InO_x$ channels also can be controlled through back-channel passivation layers and doping to form ternary channel materials with improved bias-stress stability and uniformity. These dopants and passivation materials have been printed with liquid metals, offering an opportunity for multilayered architectures that can leverage interfacial polarization effects known to induce 2D electron gases (2DEGs) in $In_2O_3$. These material design strategies, in combination with improvements to the liquid metal printing process, can reduce device-to-device variability.

Figure 29:
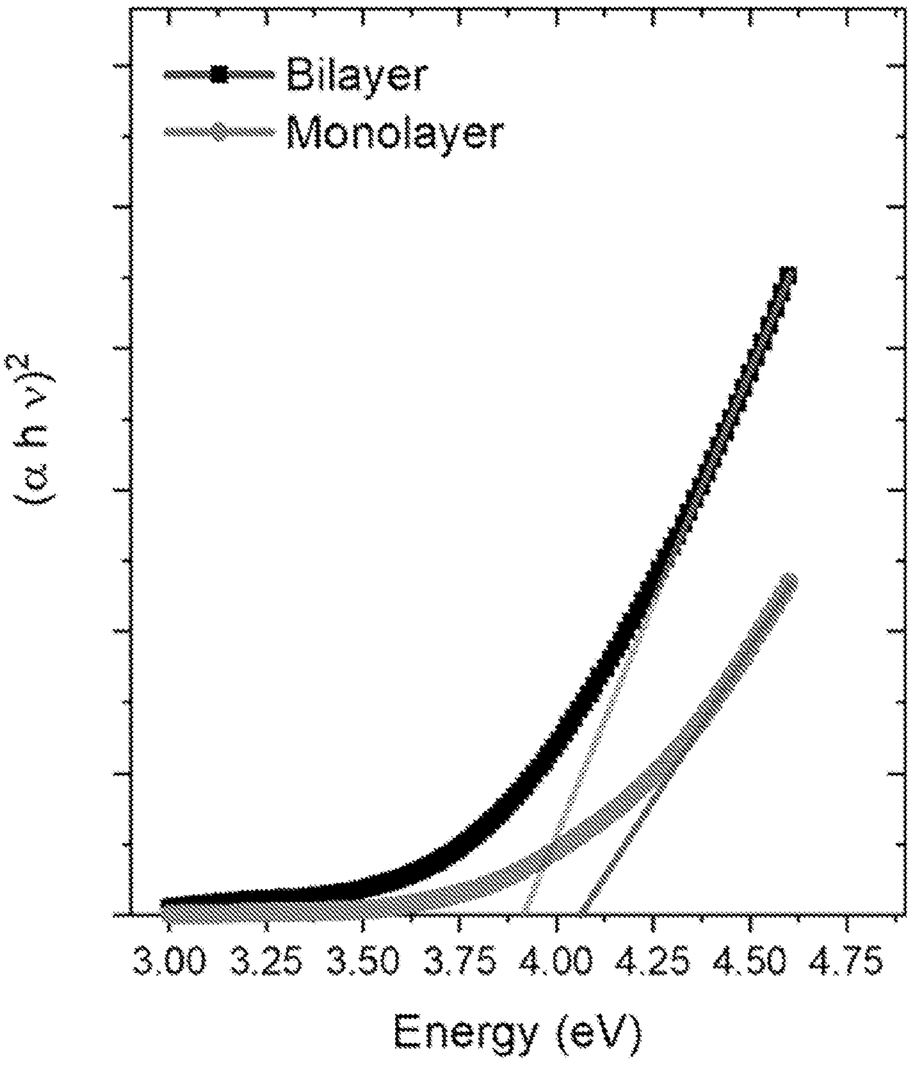
FIG. 29 shows Tauc plot fits for monolayer and bilayer $InO_x$ films without post-annealing.

Measurements of the optical properties of these $InO_x$ films demonstrates the relationship between their 2D nature and resultant quantum confinement for modulating their electronic structure, as well as their ultra-transparency. $InO_x$ naturally has lower optical absorption than would be predicted from its fundamental bandgap of approximately 2.92 eV due to the presence of dipole-forbidden optical transitions, which can effectively raise the bandgap by more than 0.8 eV by forcing direct transitions from well below the valence band maximum (VBM). Optical transmittance measurements revealed an average transmittance of 99.2% and 98.9% for monolayer and bilayer $InO_x$ for the visible wavelength range of 400-800 nm. Tauc analysis of these 2D $InO_x$ films suggests a significant widening in the optical bandgap ($\Delta E_g$) for the thinnest 2D $InO_x$ films, with an offset of approximately 90-150 meV between monolayer (2.2 nm) and bilayer (4.9 nm) $InO_x$ (FIG. 29). The Bohr radius of $In_2O_3$ is estimated to be approximately 2.35 nm (assuming ε=8.9, $m_e$*=0.3 $m_0$, and $m_h$*=0.6 m), suggesting that the blue-shifted absorption of monolayer films can be attributed to significant quantum confinement effects. FIG. 17(*e*) illustrates the trend of $E_g$ versus post-annealing, as extracted from direct bandgap fits of the Tauc plots of absorption, showing a redshift after post-annealing for both monolayers and bilayers. This is consistent with a lower free-carrier concentration and a diminishing Burstein-Moss effect. The Burstein-Moss shift may also explain why these 2D $InO_x$ films exhibit a smaller $\Delta E_g$ than would be expected based on the theory for 1-dimensional infinite quantum wells (QW), which would predict $\Delta E_g$~250-300 meV based on these thickness measurements:

$$\Delta E_G = \frac{h^2}{8L^2}\left(\frac{1}{m_e^*} + \frac{1}{m_h^*}\right)$$

Electrical characterization shows bilayer films exhibit a higher free-carrier concentration ($n_0$) than monolayer films, which should effectively increase their measured optical bandgap, mitigating the $\Delta E_g$ otherwise induced by quantum confinement. These observations also match the characteristics of $InO_x$ transistors, suggesting a lower activation energy ($E_a$) for transport in bilayer films that exhibit less quantum confinement induced bandgap widening compared with monolayer films (FIG. 17(*f*)). For both cases of monolayer and bilayer $InO_x$, however, the activation energy can be effectively modulated to tune the turn-on voltage for various applications requiring enhancement mode operation for circuit level integration.

Figure 18:
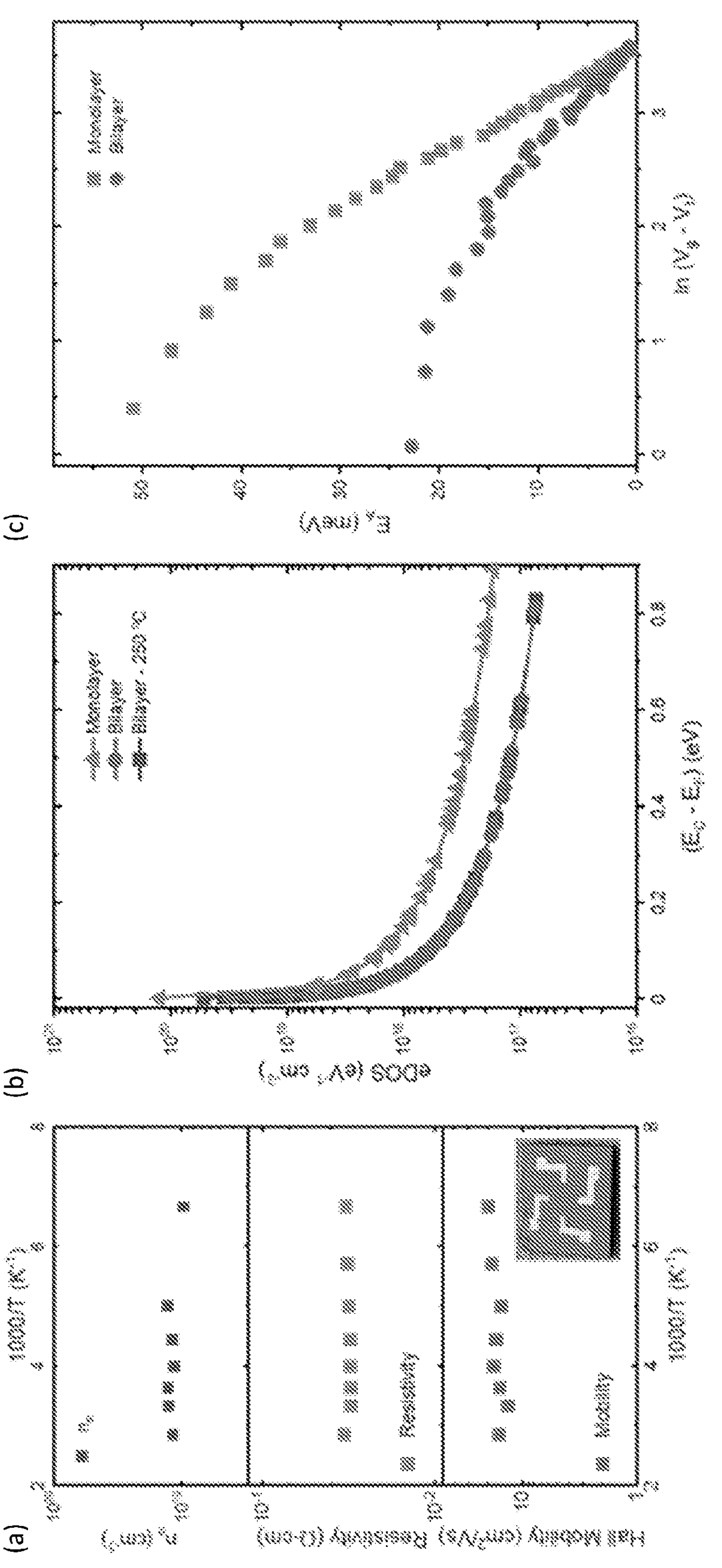
FIG. 18 shows variable temperature Hall transport measurements and electronic density of states for 2D $InO_x$ including (a) temperature-dependent carrier concentration, resistivity, and Hall Mobility of liquid metal printed bilayer $InO_x$ films; (b) measured electronic density of states (eDOS) as a function of activation energy ($E_A$=$E_c$−$E_F$) for 2D printed $InO_x$; and (c) activation energy as a function of gate voltage for bilayer and monolayer $InO_x$ transistors.

Variable temperature Hall measurements were performed to characterize the electronic transport in large area 2D $InO_x$ films of approximately 7×7 mm (FIG. 18(*a*)). Measurements of temperature-dependent resistivity illustrate the low activation energy of the highly conductive bilayer $InO_x$ films, consistent with a trap-neutral level in proximity to the conduction band energy and the observed carrier concentration of approximately $1 \cdot 10^{19}$ $cm^{-3}$. Hall measurements of these films show room-temperature mobility of approximately 12.9 $cm^2 V^{-1} s^{-1}$. To fully understand the impact of post-annealing and quantum confinement on transport in the liquid metal printed 2D $InO_x$, the electronic density of states (eDOS) was extracted using temperature-dependent transfer measurements of monolayer and bilayer thin-film transistors from 20 to 100° C. The temperature-dependent measurements allowed for an extraction of the eDOS (FIG. 18(*b*)) based on the thermally activated low-field drain conductance. Monolayer and bilayer films show distinct differences, with bilayer films exhibiting higher band tail slope but lower band edge concentration ($4 \cdot 10^{19}$ $cm^{-3}$ for bilayers vs. $1.4 \cdot 10^{20}$ $cm^{-3}$ for monolayers). These characteristics and the lower deep state concentration for bilayers are consistent with their higher mobility and improved subthreshold slope. A comparison of the printed 2D $InO_x$ eDOS also shows a higher band edge concentration $5 \cdot 10^{20}$ $cm^{-3}$ after 250° C. annealing, compared with $4 \cdot 10^{19}$ $cm^{-3}$ for the sample annealed at 175° C. Similarly, the $InO_x$ channels annealed at 250° C. exhibit a steeper band tail slope consistent with their transition to a phase with higher crystalline fraction.

The disclosed method also allows comparison of the activation energy as a function of gate voltage for monolayer and bilayer films. This thermal activation energy $E_A$ determined from the temperature-dependent measurements effectively describes the energy difference between the Fermi level and the delocalized states in the conduction band ($E_A = E_C - E_F$), as depicted in FIG. 17(*f*). FIG. 18(*c*) shows the lower activation energy for transport in bilayer films compared to monolayer films, which is consistent with the higher free-carrier concentration and the overlapping grain morphology discussed above. This behavior also corresponds well with the expected impact of quantum confinement, which would tend to raise the conduction band edge, as shown in FIG. 17(*f*) and force otherwise degenerate conductors into a semiconducting state.

The liquid metal printed 2D oxide transistors reported here demonstrate ultrahigh performance leveraging control of the electronic structure of nanoscale $InO_x$ films as seen through the extracted eDOS. The 2D $InO_x$ channels exhibit improved performance for low-temperature, vacuum-free processed materials suitable for flexible electronics applications as well as high-performance circuits in active interposers. Combined with the transparency and known mechanical flexibility of these ultrathin films, the ultrahigh mobility electronic performance can be used in flexible electronics. Applications include wearable sensors, neuromorphic computing, and lightweight display technology.

Regarding the dual-sided liquid metal printing process for $InO_x$, a silicon die with 100 nm of thermally grown $SiO_2$ was attached via thermal tape to each platen of a pneumatic thermal press preheated to 165° C. A 0.5 g quantity of 99.995% purity indium metal (Luciteria) was placed in the center of the upward-facing die. The distance between the platens was decreased until the indium droplet contacted both dies. The pressure on the dies was then ramped up to 400 psi in 2 seconds. After 5 seconds, the pressure was released at the same rate. The dies were removed from the hot press within one minute. To remove any metal from the sample surface, each die was placed on a hot plate at 165° C. and a heat resistant silicone squeegee was scraped over the surface. The samples were then cleaned with an ethanol-wetted lint-free cloth. Monolayer films were deposited using $SiO_2$ wafers as both the donor and target substrates. Both the donor and target substrates had resulting monolayer films adhered after the liquid metal printing process. Bilayer films were deposited in a single step using low adhesion, plastic surfaces as the donor substrates to transfer both the front and back oxide films to the target $SiO_2$ substrate.

2D $InO_x$ transistors were fabricated in a top contact, bottom gate architecture. A 10 minute wet etch in 18% HCl was used to pattern the $InO_x$ semiconductors (1000×500 μm). An adhesive Kapton shadow mask was used to define 1×1.5 mm source-drain electrodes with channel lengths from 50-500 μm. An Anatech LTD Hummer 6.2 sputtering system was utilized to deposit 80 nm thick gold electrodes.

A semiconductor parameter analyzer (Agilent E5260A) was used for all transistor characterization. The electronic density of states (eDOS) was extracted from temperature-dependent measurements of low-field drain conductance from 23° C. to 120° C. All other transfer and output characteristics shown here were captured at room temperature in air. The yield of liquid metal printed $InO_x$ semiconductor regions that were active and modulated by an applied gate voltage was approximately 88% across multiple batches. Incremental linear and saturation mobility were computed using the gradual channel approximation. Variable temperature Hall measurements (150 K-350 K) were performed with a 2D $InO_x$ film deposited onto $SiO_2$ wafers and patterned into a Van der Pauw geometry with Au contacts. These samples were measured under vacuum (MMR Technologies) using a Joule Thomson stage and a 7200 gauss permanent magnet.

X-ray diffraction (XRD) analysis was performed on 2D $InO_x$ films deposited on Si wafers with 100 nm of thermally grown $SiO_2$ using a Rigaku D/MAX 2000 diffractometer with Cu Kα radiation at scanning rates of either 1° or 0.1° per min. The $InO_x$ nanosheets were characterized using a FEI Tecnai F20 transmission electron microscope (TEM) at an accelerating voltage of 200 kV. The 2D $InO_x$ films were directly printed onto TEM grids (carbon type-B 200-mesh Cu grids, Ted Pella). The printing process for the TEM samples entailed briefly and gently touching the liquid metal interface. Additionally, the cross-section of the nanosheets, prepared by the focused ion beam (FIB) lift-out technique using a scanning electron microscope (SEM) dual-beam system (Thermo Scientific Helios 5CX Dual Beam SEM/FIB), was observed via TEM. A carbon layer with a thickness of approximately 20 nm was coated on the sample surface before Pt deposition in order to enhance the contrast and visibility of the $InO_x$ films. XPS spectra were collected using a Kratos Axis Supra XPS at $10^{-9}$ Torr. A UV-Vis spectrophotometer (DeNovix DS-11 FX+) was used to observe the absorbance spectrum of the 2D $InO_x$ films from 190 nm to 840 nm on glass and quartz substrates. $InO_x$ bilayer film thicknesses were also measured with a high precision stylus profilometer (Tencor D500) with 0.4 Å vertical resolution and 5.0 Å repeatability, using the 40-60 nm combined step heights available after Au electrode deposition.

Second Example 2D oxides can enable nanoscale control over electronic transport in multilayer, superlattice materials that have traditionally been fabricated only by slow and expensive vacuum deposition methods, such as molecular beam epitaxy (MBE). Past studies have shown that superlattices with periodic layers of transition metal oxides such as $In_2O_3$, ZnO, $SrTiO_3$, and $Al_2O_3$ can yield novel electronic properties, such as enhanced thermoelectricity, ferroelectricity, photoluminescence, and tunable refractive index decoupled from electrical conductivity. These properties of oxide superlattices are unavailable in bulk, doped materials. These advantages have led to applications in new devices such as resonant tunnel junctions and synaptic transistors for neuromorphic computing. For flexible electronics, the superlattice approach also can enhance the mechanical strain tolerance of TCOs through the control of film stress and fracture when using compliant nanoscale organic interlayers.

Many of the useful properties of low-temperature processed metal oxides, such as their exceptional flexibility, are related to their amorphous state. However, one of the challenges this amorphous nature introduces is that cationic extrinsic doping is rendered ineffective, having a negligible influence on carrier concentration even for heavily doped ternary alloys. For example, Sn doping in $InO_x$ has been observed to only weakly influence ITO conductivity when the film remains in the amorphous state, but provides large increases in conductivity, as expected, after crystallization at elevated temperatures. Despite the limited influence of doping, however, amorphous and nanocrystalline $InO_x$ can still achieve high conductivity because of the resilient structure of its conduction band, which has proven insensitive to scattering effects induced by structural disorder, as demonstrated through various computational and experimental studies. The superlattice modulation doping scheme disclosed herein can control and enhance the electronic properties of amorphous TCOs.

A high-speed and scalable liquid metal printing method was used to fabricate transparent conducting superlattices that leverage modulation doping to enhance the conductivity of both amorphous and nanocrystalline $InO_x$. The modulation doping scheme can enhance the mobility, carrier concentration, and the optical transparency of these low-temperature processed TCO films. This approach increases the electron concentration of films comprised of 2D $InO_x$ layers, resulting in enhancements to the conductivity, which can exceed 600 S $cm^{-1}$. Such conductivity levels do not exist for scalable, printed TCOs processed at low temperatures (180° C.)) without vacuum equipment.

Figure 42:
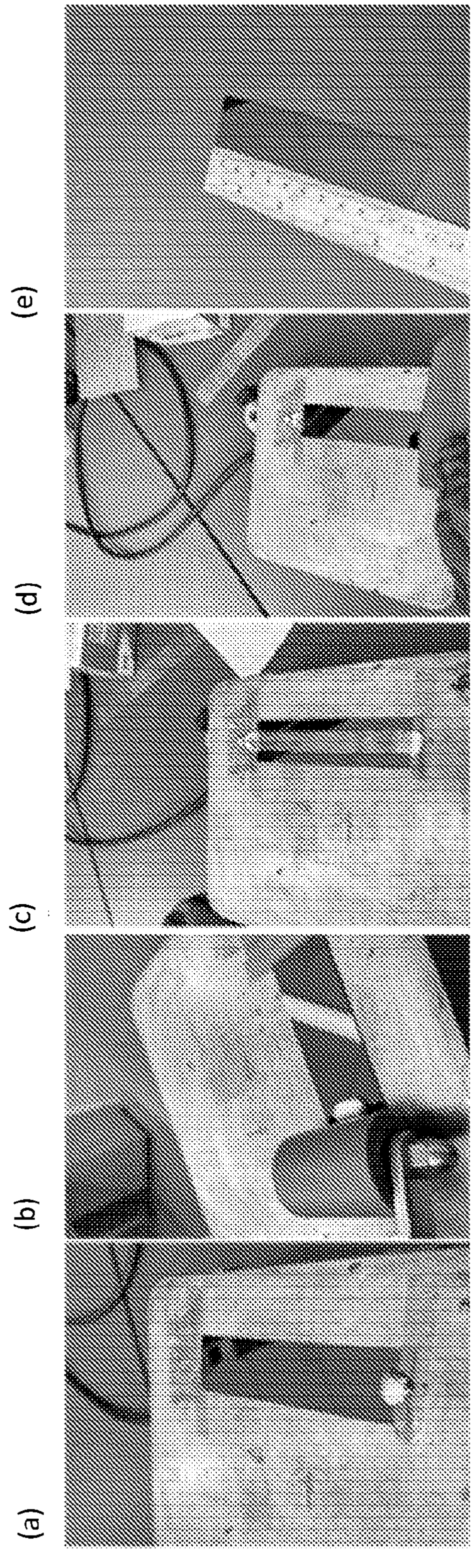
FIG. 42 shows pictures of a $SiO_2$ substrate on an aluminum top hot plate with an indium droplet (a) and a silicone roller (b); (c) the substrate with residual liquid metal droplets after the CLMP deposition process; (d) the substrate after wiping with a silicone squeegee; and (e) the substrate next to a ruler to indicate the size of the film.

2D oxide films were deposited on wafers, glass, and plastic substrates in air from liquid metal droplets using a 4 cm wide silicone roller (diameter of 3.2 cm) at temperatures from 100 to 300° C. with an applied contact force of ≈50 N at a speed of ≈10 cm $s^{-1}$ (confirmed by frame-by-frame analysis from video). The substrate was heated on an aluminum top hot plate during the continuous liquid metal 2D oxide printing (CLMP) deposition process and secured at the edges with kapton tape. The roller was briefly preheated by rolling for ≈10 s on the hot plate before completing the CLMP deposition. Immediately after the rolling process, the sample was wiped with a silicone squeegee to remove any residual microscale liquid metal droplets, as shown in FIG. 42. The roll-to-roll (R2R) compatibility of both the rolling and squeegee wiping processes are noted, which are highly similar to the mechanisms of high speed roll-to-roll screen printers. The starting materials for the liquid metal printing process were pure indium (Luciteria, 99.995%) and pure gallium (Luciteria, 99.99%). An atmospheric plasma treatment (Plasma-Etch 1000 W atmospheric plasma system supplied with 40 LPM compressed dry air) was applied for ≈2 seconds between layers of 2D oxides to induce adhesion of subsequent layers. A balance was used to record the normal force applied to the substrate by the silicone roller during the printing process.

Figure 43:
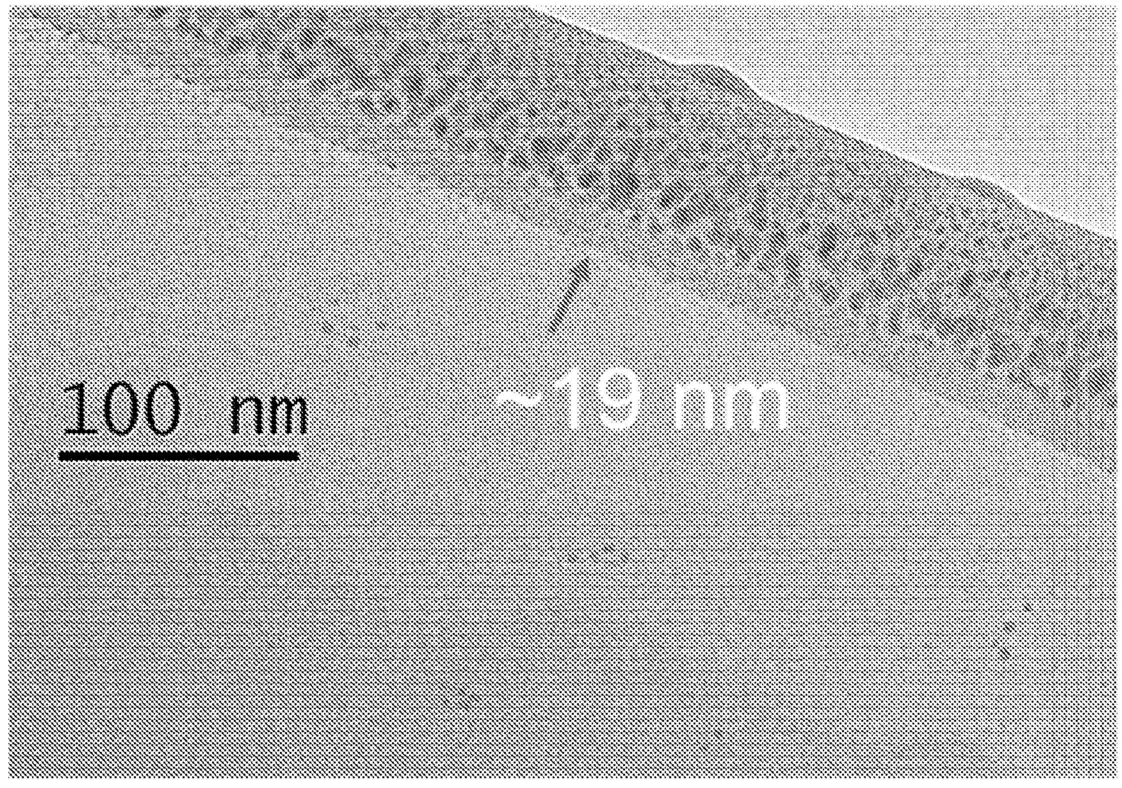
FIG. 43 shows a cross-sectional TEM of IIGIIG film printed at 220° C.

X-ray diffraction (XRD) analysis was performed on CLMP $InO_x$ and superlattice ($InO_x/GaO_x$) films deposited on Si wafers with 100 nm of thermally grown $SiO_2$ using a Rigaku MiniFlex diffractometer with Cu Kα radiation using a scanning rates of 0.5° per min. The 2D $InO_x$ films were characterized using a FEI Tecnai F20 transmission electron microscope (TEM) at an accelerating voltage of 200 kV. The 2D $InO_x$ films were directly printed onto TEM grids (carbon type-B 200-mesh Cu grids, Ted Pella) by CLMP method. The printing process for the TEM samples entailed removing any excess liquid metal using an adhesive kapton tape. Additionally, the cross-section of the nanosheets, prepared by the focused ion beam (FIB) lift-out technique using a scanning electron microscope (SEM) dual-beam system (Thermo Scientific Helios 5CX Dual Beam SEM/FIB), was observed via TEM. X-ray photoelectron spectroscopy (XPS) spectra were collected using a Kratos Axis Supra XPS at $10^{-9}$ Torr. A UV-Vis spectrophotometer (DeNovix DS-11 FX+) was used to observe the absorbance spectrum of the 2D $InO_x$ films from 190 nm to 840 nm on glass and quartz substrates. Film thicknesses were measured by wet etching a step profile and measuring with an Alphastep D-500 high resolution stylus profilometer. Thickness measurements of sub 10 nm single layer and bilayer films were corroborated by ellipsometry and multilayer film thicknesses were also corroborated with cross-sectional TEM imaging (FIG. 43).

Room temperature Hall measurements (293 K) were performed with the pure $InO_x$ and with $InO_x/GaO_x$ superlattice films deposited onto $SiO_2$ wafers (500 nm), patterned by wet etching into a Van der Pauw geometry with Ag paste contacts. The TCO films prepared for Hall measurements were ≈7×7 mm in size. These samples were measured at atmospheric pressure (MMR Technologies) with a 7200 gauss permanent magnet. Conductivity measurements were performed at room temperature in air on large area printed films using a four point probe and DMM (Keithley 2750). Bending resilience measurements were performed on $InO_x$/$InO_x/GaO_x$ superlattice films deposited onto 75 μm thick PEN substrates at 200° C. The films were patterned into 1×1.5 mm pads, and Au contacts were deposited via sputtering to expose a channel area of 500 μm by 1 mm. The films were measured after the substrate was bent to a radius of 7.4 mm until 1000 bending cycles were achieved.

Figure 30:
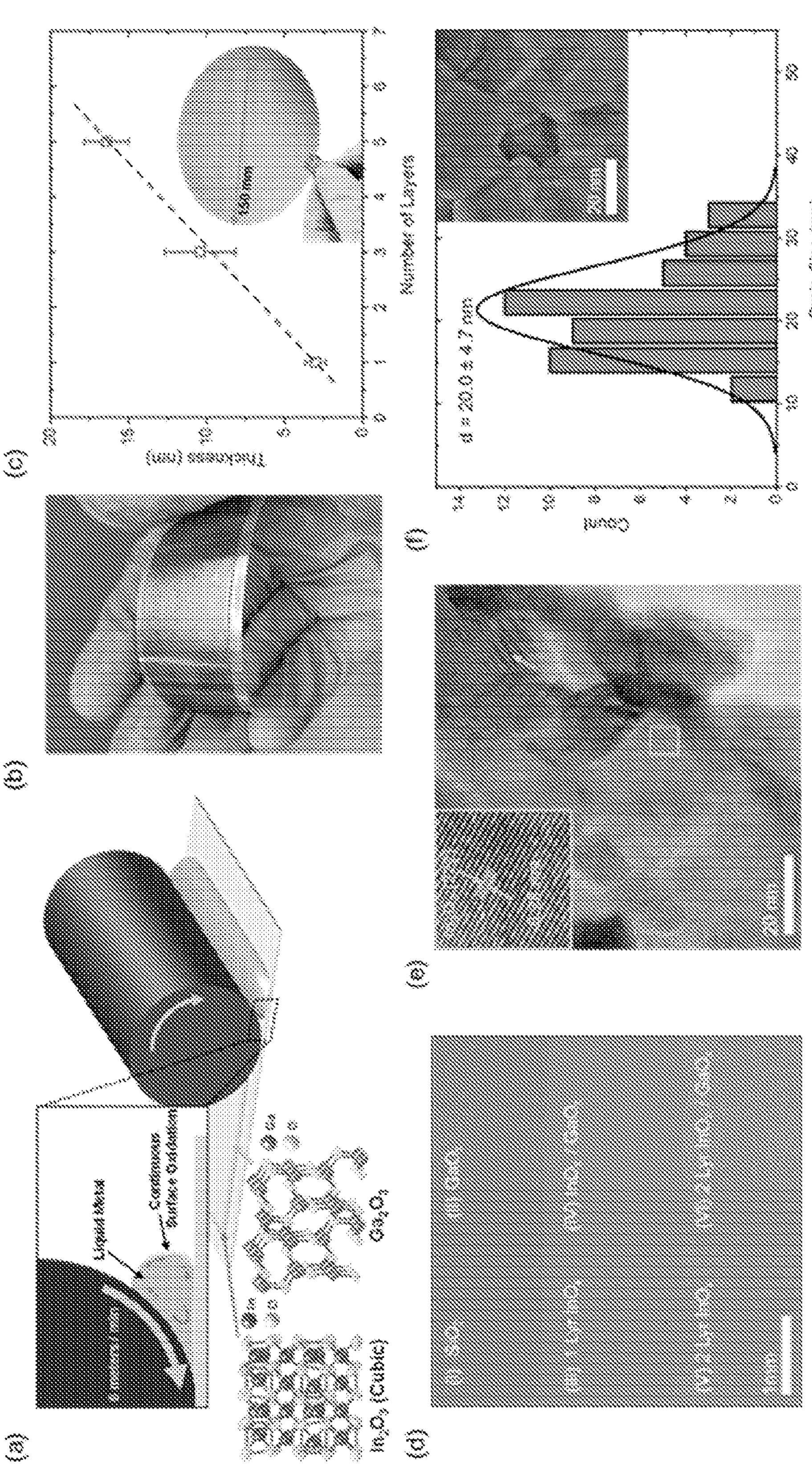
FIG. 30 shows (a) a schematic for roller-based high-speed liquid metal printing with inset showing Cabrera-Mott surface oxidation forming a 2-4 nm thick oxide skin in milliseconds; (b) patterned TCOs printed on flexible polyimide substrate; (c) measured thickness versus layer count for $GaO_x$ printed at 180° C., wherein the inset shows large area printed $GaO_x$ films on $SiO_2$; (d) large area scanning optical microscopy of a multilayer superlattice film printed with offset depositions to highlight uniformity and color contrast; (e) HRTEM images of a printed 2D superlattice consisting of two layers of $InO_x$ capped by one layer of $GaO_x$; and (f) grain size distribution from multiple HRTEM images of $InO_x$/$GaO_x$ superlattice with an inset showing a shaded HRTEM image of nanocrystalline grain morphology.
Figure 31:
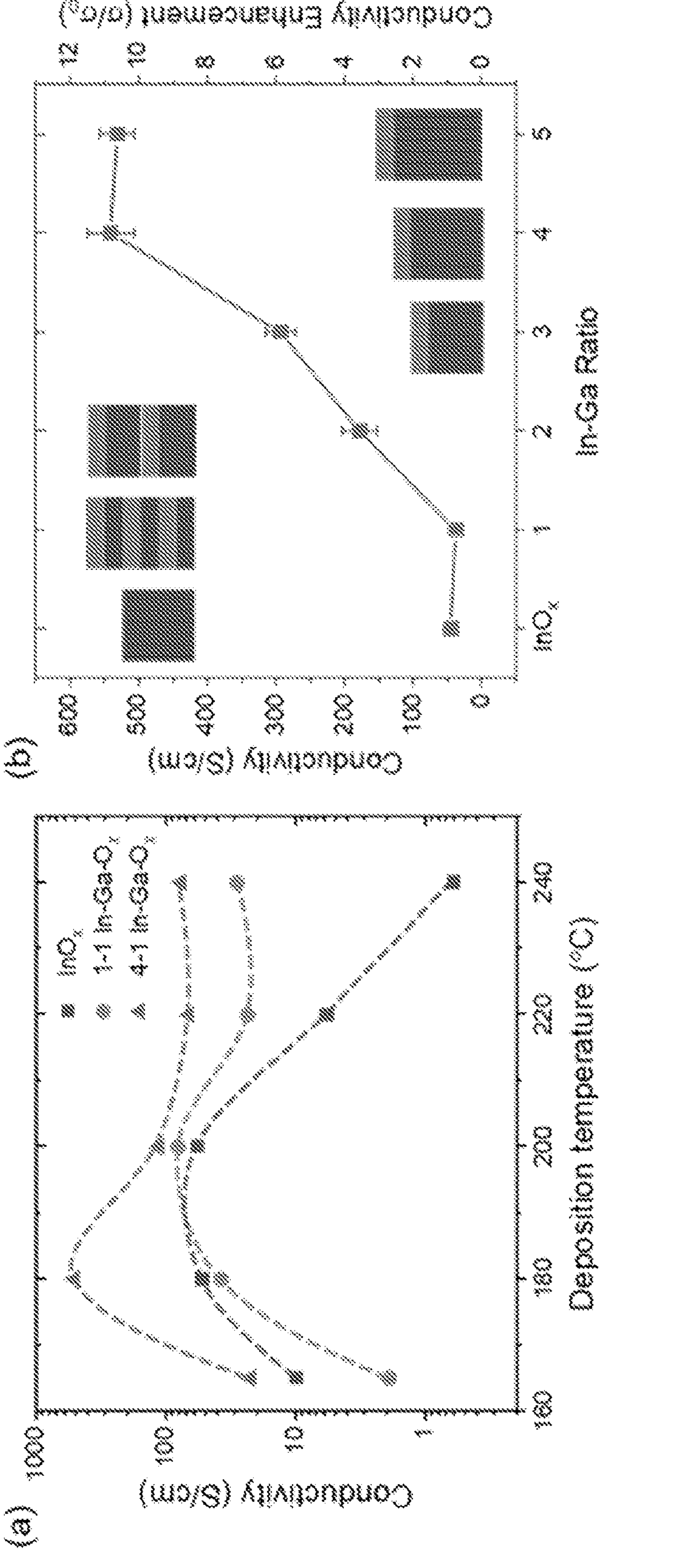
FIG. 31 shows conductivity vs. deposition temperature for CLMP 2D $InO_x$ (square) and superlattice TCOs (circle, triangle) and (b) conductivity versus composition for films printed at 180° C. with varying ratios of $InO_x$ to $GaO_x$ layers. The right axis shows conductivity enhancement compared to pure $InO_x$. Error bars represent the standard deviation of approximately 15 measurements.

Film thickness data presented in FIG. 30 presents average thickness with error bars equal to the standard deviation. Materials characterization by methods such as XRD and XPS were performed on one sample at each conditions (film composition, temperature, etc.). Conductivity data presented in FIG. 31 is plotted as a median value with error bars equivalent to ±1 standard deviation. The normalization performed in FIG. 31(*b*) for the right axis value comes from dividing by the intrinsic conductivity of a four layer pure $InO_x$ film.

Figure 36:
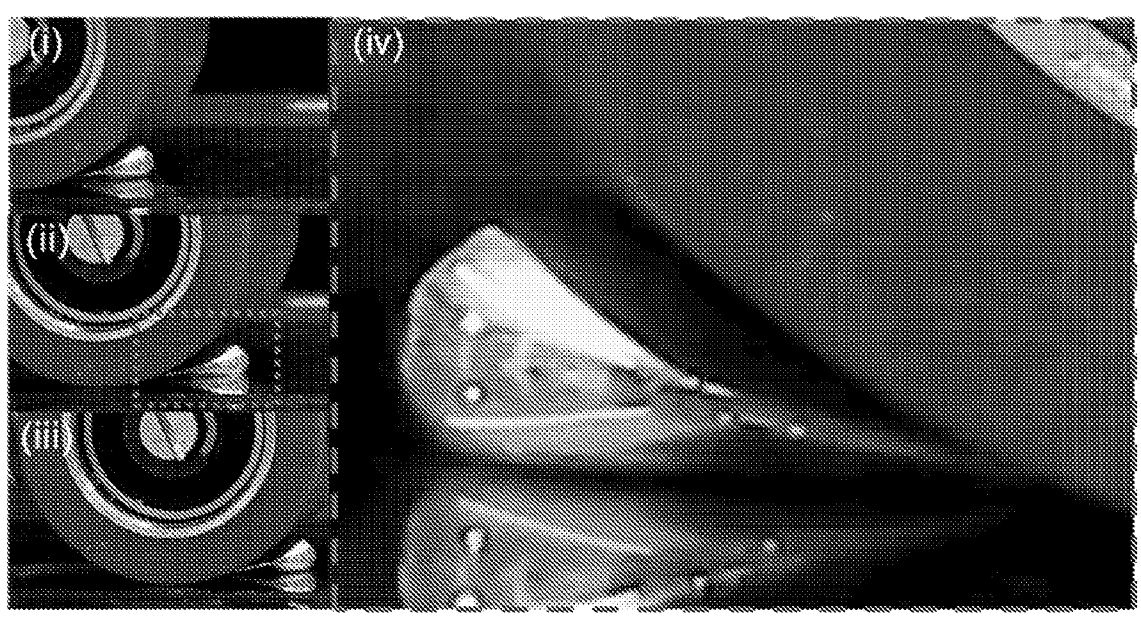
FIG. 36 shows images of continuous liquid metal printing process for rolling transfer of 2D oxides to flexible and rigid substrates showing molten liquid metal droplet advanced using a silicone roller.

2D oxides were processed from a rapid liquid metal printing approach that utilizes the solid oxide skin spontaneously rapidly formed via Cabrera Mott oxidation. The continuous liquid metal printing (CLMP) method transforms droplet wise "touch printing" into a high-speed process suitable for R2R deposition of films of highly continuous nanosheets deposited over 10-100 $cm^2$ areas. As depicted in the schematic in FIG. 30(*a*), the CLMP method utilizes a compliant rubber roller (FIG. 36) to uniformly press a liquid metal meniscus at 1-20 cm $s^{-1}$ at a line pressure of ≈6 N $cm^{-1}$. This continuous rolling process transfers the 2D surface oxide to a target substrate such as glass, silicon, or plastic (FIG. 30(*b*)) where it is held in place by van der Waals force. This process can generate multilayer superlattices consisting of periodically alternating layers of $InO_x$ and $GaO_x$. For a superlattice structure, $GaO_x$ is chosen because it is expected to form a type-I heterointerface known to induce higher electron concentrations in $InO_x$. The heterointerface of $InO_x/GaO_x$ yields a 10× improvement to the saturation mobility of low-temperature spin coated sol-gel $In_2O_3$ transistors as well as a surprising, temperature-independence of the electron mobility during low-temperature measurements. $GaO_x$ also is suitable for high-speed liquid metal induced deposition because of metallic Ga's low melting temperature ($T_m$=37° C.). Multilayers can be deposited via multiple printing steps to build up thicker films (FIG. 30(*c*)), using a 2 second atmospheric pressure air plasma treatment in between each cycle to ensure uniform adhesion of the subsequent layers. FIG. 30(*c*) also illustrates the exceptional uniformity of the CLMP process, which can deposit pinhole free layers across a 150 mm substrate in <3 seconds, without post-annealing processes. FIG. 30(*d*) shows a large area scanning microscope image of a single film patterned by CLMP with multiple overlapping $InO_x$ and $GaO_x$ layers, indicating the high macroscopic areal uniformity that can be achieved.

Superlattice films comprising two layers of $InO_x$ capped with one layer of $GaO_x$ were characterized by HRTEM, as shown in FIG. 30(*e*). The 2D films exhibit large $InO_x$ crystallites with lateral dimensions from 10-30 nm despite their thickness of just 3.5 nm per layer. The HRTEM images of these multilayer films also exhibit Moiré fringes, as highlighted in FIG. 30(*e*), a feature characteristic of these 2D oxides that indicates the overlay of crystallites during the CLMP process. HRTEM analysis also shows amorphous regions ($GaO_x$) overlapping the $InO_x$ crystallites. An analysis of the grain size from a range of HRTEM images of the superlattice films (FIG. 30(*f*)) shows an average grain size of ≈20.0±4.7 nm. This platelike grain morphology is expected to aid intergrain and interlayer transport, enhancing conductivity. The grain size observed by HRTEM in these CLMP films is substantially larger than the grain size exhibited by ultrathin sputtered $In_2O_3$ or high quality sol-gel $In_2O_3$. One possible hypothesis to explain this result is the elimination of any residual organic species in the solvent-free processing of TCOs by CLMP. XPS analysis showed significantly higher C and N content in sol-gel $InO_x$ films that was likely related to the limited sol-gel precursor decomposition at low-temperatures.

Figure 32:
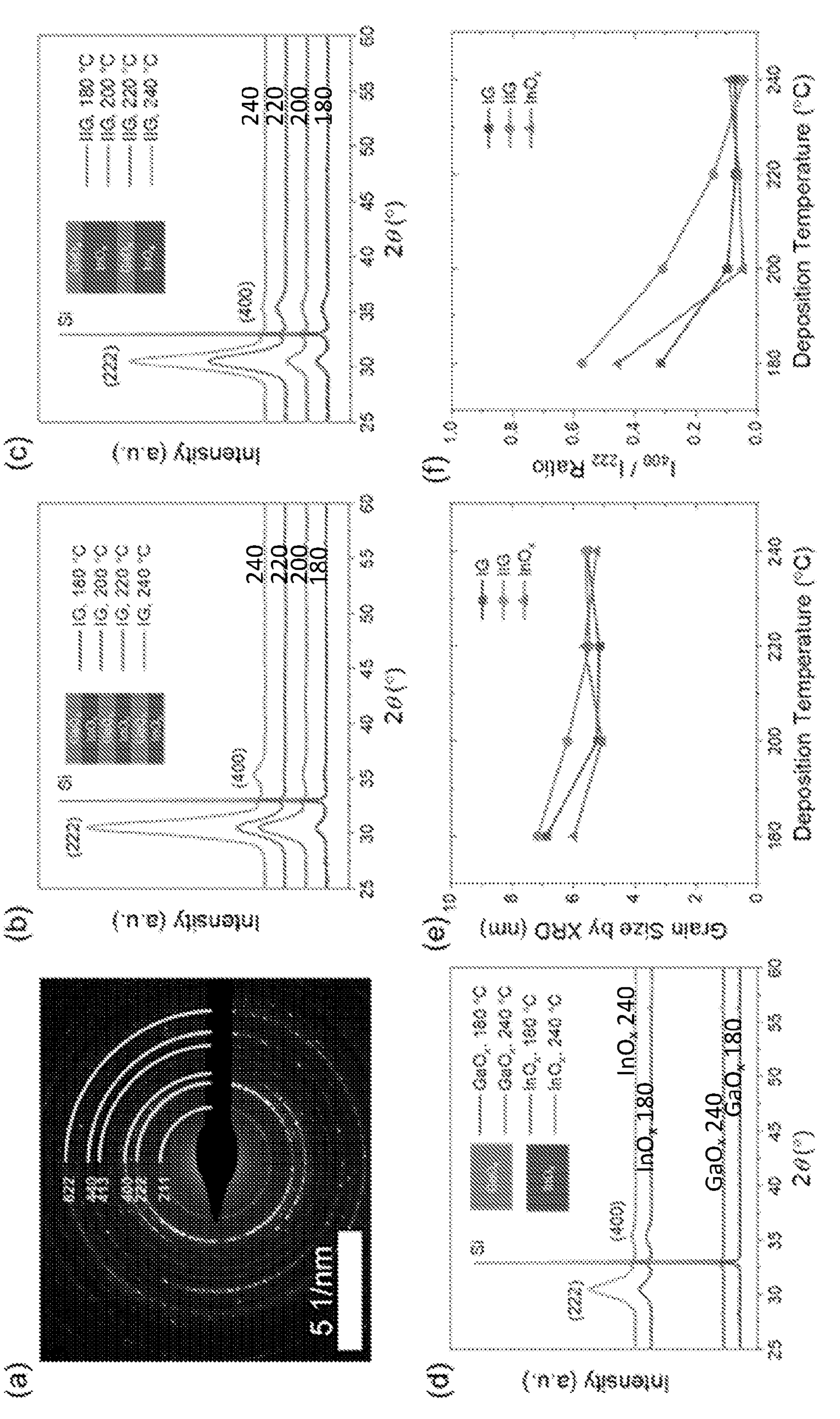
FIG. 32 shows (a) selected area electron diffraction (SAED) pattern for superlattice films; X-ray diffraction (XRD) spectra for superlattice films composed of 1-1 (b) and 2-1 (c) ratios of $InO_x$—$GaO_x$; (d) pure $InO_x$ and pure $GaO_x$ XRD spectra at 180° C. and 240° C.; (e) Scherrer equation extracted grain size for the primary $InO_x$ (222) peak of superlattice and pure $InO_x$ films as a function of deposition temperature; and (f) ratio of the (400) peak intensity to the (222) peak intensity for pure $InO_x$ and superlattice $InO_x/GaO_x$ films as a function of deposition temperature.

Selected area electron diffraction (SAED) analysis from the superlattice films (FIG. 32(*a*)) shows peaks that can be indexed to the cubic phase of $In_2O_3$, with the strongest peak being the typical (222) orientation of $InO_x$. X-ray diffraction (XRD) characterization confirms that 2D $InO_x$ films formed by CLMP are crystalline in their as deposited state but the $GaO_x$ films printed by this method have been observed to be amorphous across the entire range of deposition temperatures. FIGS. 32(*b*) and 32(*c*) illustrates the XRD spectra for $InO_x/GaO_x$ superlattice films as a function of deposition temperature from 180 to 240° C. The superlattice films exhibit the characteristic (222) and (400) peaks of cubic $InO_x$, as do the pure $InO_x$ films (FIG. 32(*d*)). At low deposition temperatures ranging from 80 to 240° C., only the amorphous phase of $GaO_x$ was observed by XRD for these films. The intensity of the (222) and (400) peaks grows monotonically at higher deposition temperatures, which agrees with observations of increases in crystallinity with post-annealing of liquid metal printed $InO_x$ films formed at 165° C.

FIG. 32(*e*) also illustrates an interesting trend in the grain size extracted from the (222) XRD peak by the Scherrer Debye equation, which decreases from ≈7.2 nm in the case of the superlattice films printed at low temperatures (180° C.) to ≈5.2 nm for films printed at 240° C.) The decrease in the average grain size with increasing deposition temperature runs counter to the trend typically observed for vacuum-deposited films, for which higher deposition temperatures provide additional thermal energy for grain growth. This trend could be a result of the nucleation and growth kinetics of Cabrera-Mott surface oxidation.

The texture of these films, as indicated by the relative intensities of the (400) and (222) peaks (FIG. 32(*f*)), shows preferential orientation along the (222) direction, which is often observed in cubic $In_2O_3$. The texture of these films is influenced by the deposition temperature and the layer configuration with higher deposition temperatures favoring grain growth along the (222) orientation, which is similar to sputtered $InO_x$ films. Oxygen content and slower growth can preference the (222) grain growth for sputtered $InO_x$ films. This corresponds well with observations that higher deposition temperatures leading to more rapid Cabrera Mott surface oxidation and more stoichiometric $In_2O_3$ formation may also lead to preference for crystallization along the (222) plane. The most conductive films fabricated have greater contributions from the (400) orientation, which is similar to the texture reported for highly conductive sputtered $In_2O_3$.

Figure 33:
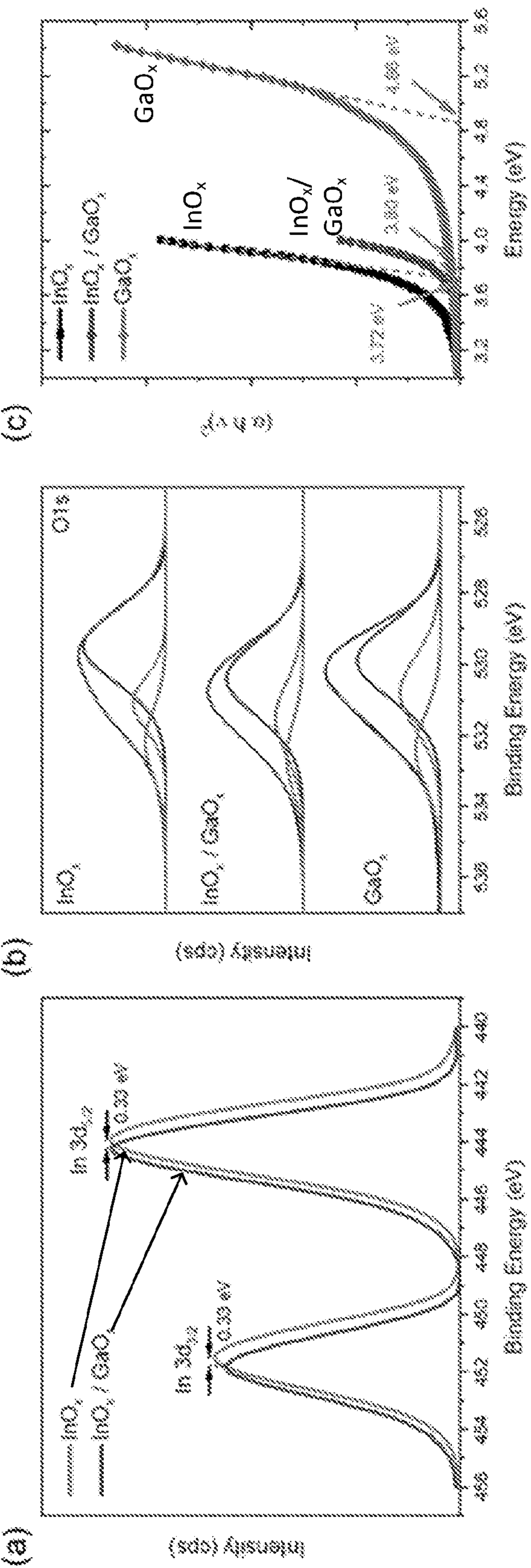
FIG. 33 shows (a) XPS In 3d core level spectra for pure $InO_x$ and $InO_x/GaO_x$ superlattice printed at 180° C.; (b) O1s spectra of $GaO_x$, $InO_x$, and $InO_x/GaO_x$ multilayers fit with subpeaks corresponding to M-O stoichiometric, M-O oxygen deficient, and M-OH; and (c) direct bandgap Tauc plot of absorption versus photon energy for pure 2D $InO_x$, pure $GaO_x$, and modulation doped $InO_x$ approximately 15 nm thick.

XPS studies reveal details about the composition and electronic structure of 2D $InO_x$ and $GaO_x$ in these TCO superlattices. FIG. 33(*a*) shows the XPS In $3d_{3/2}$ and In $3d_{5/2}$ core level spectra for both pure $InO_x$ films and modulation doped $InO_x$ capped by 2D $GaO_x$. The positions for the In 3d peaks of pure $InO_x$ closely match those of liquid metal printed $InO_x$ films. Both the In $3d_{3/2}$ and In $3d_{5/2}$ peaks shift 0.33 eV higher in binding energy after adding the $GaO_x$ modulation doping layer. This shift in the In 3d peaks is consistent with the shift reported for modulation doping observed by XPS in tin oxide films. The increase in binding energy is also similar to the shift induced by degenerate extrinsic doping of Sn in 2D ITO.

FIG. 33(*b*) shows the O1s spectra for the printed 2D $GaO_x$, $InO_x$, and $InO_x/GaO_x$ heterostructures. These spectra are decomposed into sub peaks (Table 4) corresponding to stoichiometric M-O bonding (530) eV), oxygen deficient M-O bonding (531 eV), and metal hydroxide M-OH bonding (532 eV). CLMP $InO_x$ is dominated by stoichiometric M-O bonding and an oxygen deficient M-O bonding, with a minor contribution from surface hydroxide states. The modulation doped sample's O1s signal is expected to include contributions from the underlying $InO_x$ as well as the 3.5 nm $GaO_x$ capping layer, showing the increase in the high binding energy oxygen deficient peak relative to pure $InO_x$ films. The high percentage of oxygen deficient bonding in the pure $GaO_x$ associated with oxygen vacancies is consistent with other reports of low-temperature liquid metal printed $GaO_x$ films. Based on measurements of the conductivity of superlattices formed with $GaO_x$ deposited at lower temperatures (down to 40° C.), it is expected that the defective, substoichiometric chemistry of CLMP $GaO_x$ enhances its effectiveness for modulation doping 2D $InO_x$.

TABLE 4

O1s XPS peak decomposition of $InO_x$, $GaO_x$, and $InO_x/GaO_x$ films (~12 nm thick).

| | Stoichiometric M—O [%] | O-Deficient M—O [%] | Hydroxide M—OH [%] |
|---|---|---|---|
| $InO_x$ | 66 | 19 | 15 |
| $GaO_x$ | 56 | 27 | 16 |
| $InO_x/GaO_x$ Heterostructure | 67 | 23 | 13 |

Figure 37:
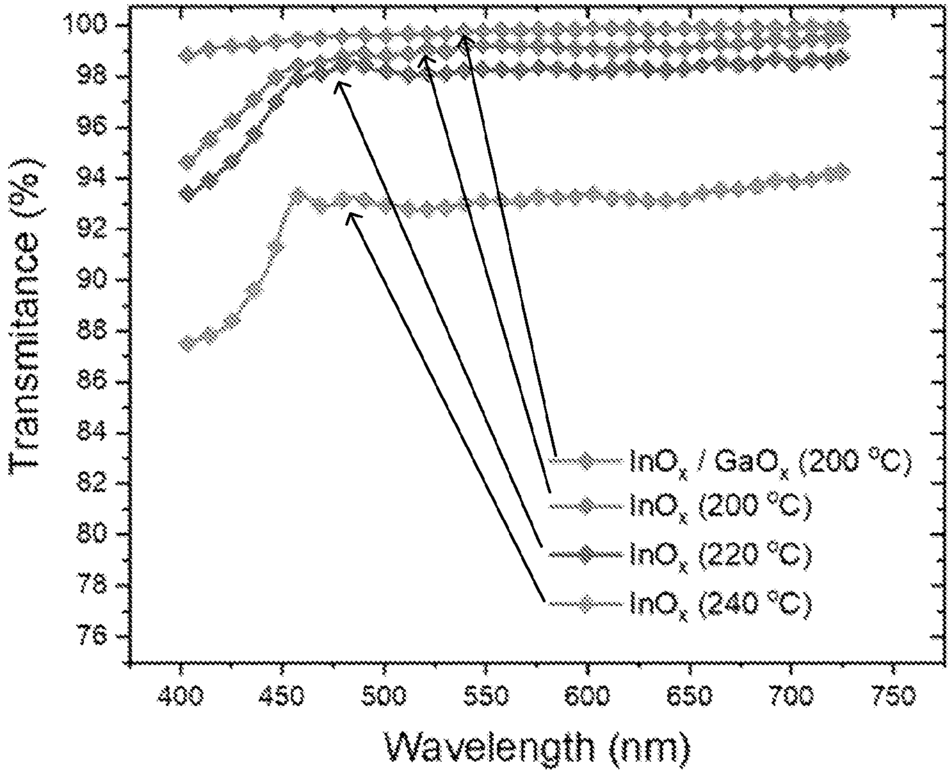
FIG. 37 shows transmittance across visible range (400-800 nm) for pure $InO_x$ films with various deposition temperatures as well as a superlattice film with four layers of $InO_x$ and one layer of $GaO_x$.

A benefit of implementing defect modulation doping is the ability to improve optical transmittance through control of the Burstein Moss shift in these 2D TCOs. UV absorption spectroscopy measurements of 14 nm $InO_x$ films with and without 3 nm capping layers of $GaO_x$ (FIG. 33(*c*)) reveal that adding the $GaO_x$ leads to a reduction in absorption and a blue shift in the optical bandgap by ≈80 meV, as determined from a Tauc plot extraction of the direct bandgap transition. This blue shift is consistent with the role of $GaO_x$ as a modulation doping layer, which induces a higher free electron concentration in the $InO_x$ layers. This is contrary to the conventional assumption that adding additional layers should increase the optical absorption. As FIG. 37 illustrates, the modulation doping increases the optical transmittance in the visible range to above 99%, essential for boosting the figure of merit of TCO films for various optoelectronic device applications.

The CLMP 2D oxides demonstrate exceptionally high conductivity in their as deposited state considering the rapid total processing time (<2 seconds) and low process temperatures. Similar to many vacuum processed oxide films, the conductivity of these materials depends critically on the oxygen stoichiometry, which varies with the deposition temperature. Conductivity can be optimal in the range of 180-200° C. for the modulation doped layers as well as pure $InO_x$. The most conductive pure $InO_x$ films reach a conductivity of ≈60 S $cm^{-1}$ in the range of 180-200° C. In comparison, the most conductive superlattice TCOs reach above 600 S $cm^{-1}$ at a deposition temperature of 180° C., a mark that is similar to the conductivity of sputtered films. From XRD studies, the crystallinity is greater when deposited at higher temperatures (220-240° C.). Based on XPS studies, these high temperature deposited films are also expected to be more stoichiometric with fewer oxygen vacancies, matching the trend of substantially lower conductivity for these films. Modulation doped films, as shown in FIG. 31(*a*), exhibit substantially greater conductivity for higher deposition temperatures because the modulation doping mechanism can overcome the reduction in intrinsic vacancy defect concentration.

Figure 34:
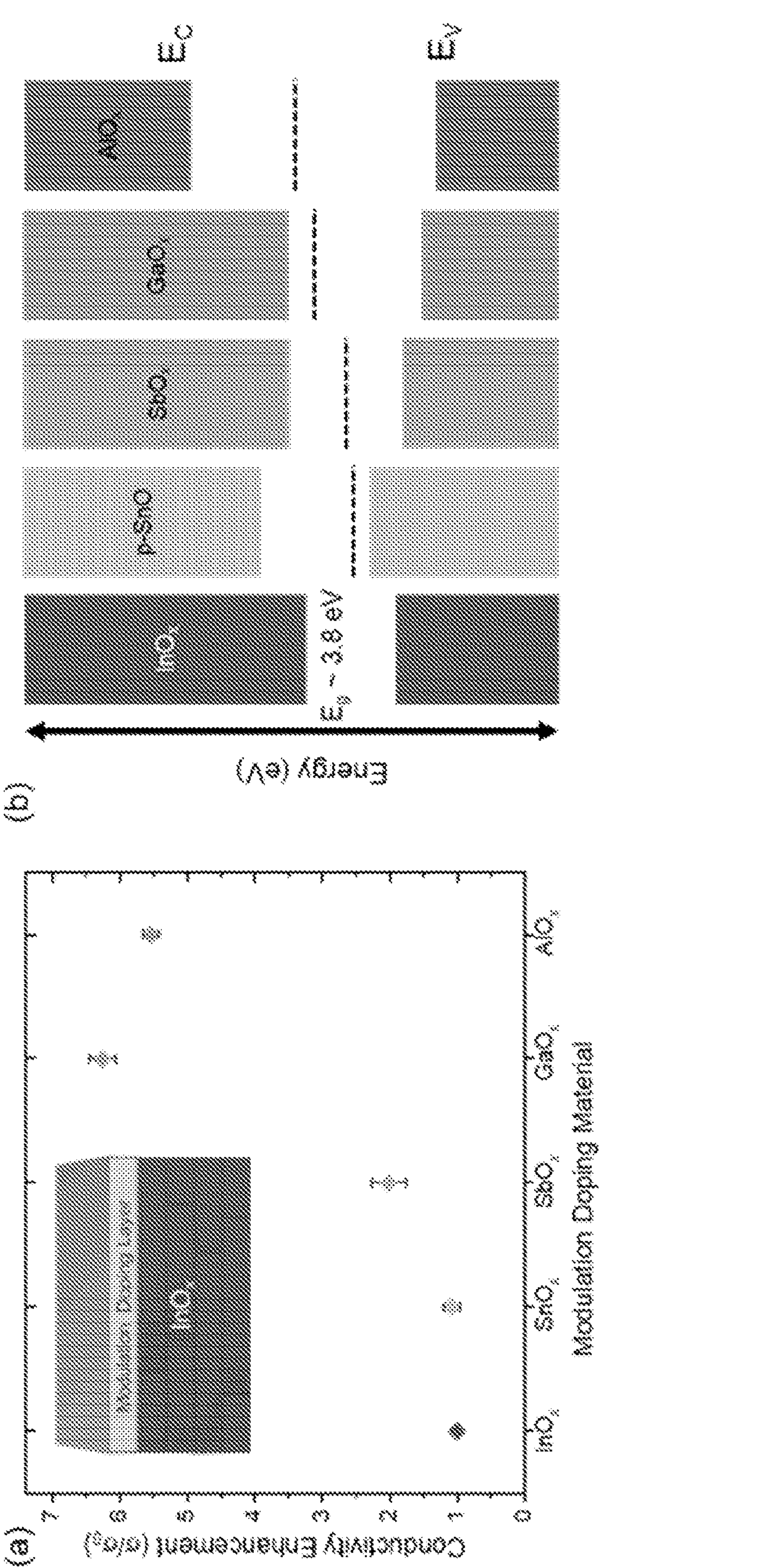
FIG. 34 shows (a) conductivity enhancement for superlattice TCOs coated with various liquid metal printed 2D oxide layers compared to pure $InO_x$ having error bars representing the standard deviation of approximately 15 measurements and (b) energy band diagrams (before contact) indicating the expected conduction band alignment for $InO_x$ with $AlO_x$, $GaO_x$, $SbO_x$, and SnO.
Figure 38:
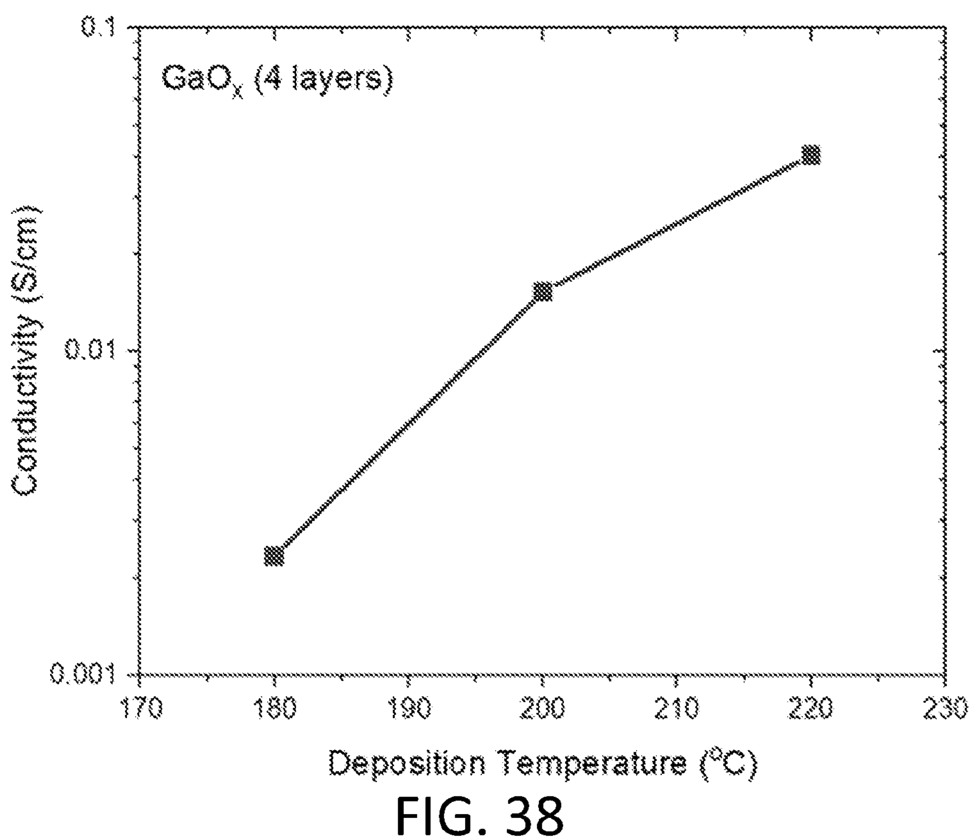
FIG. 38 shows conductivity versus temperature for liquid metal printed pure four layer $GaO_x$ films approximately 14 nm thick.
Figure 39:
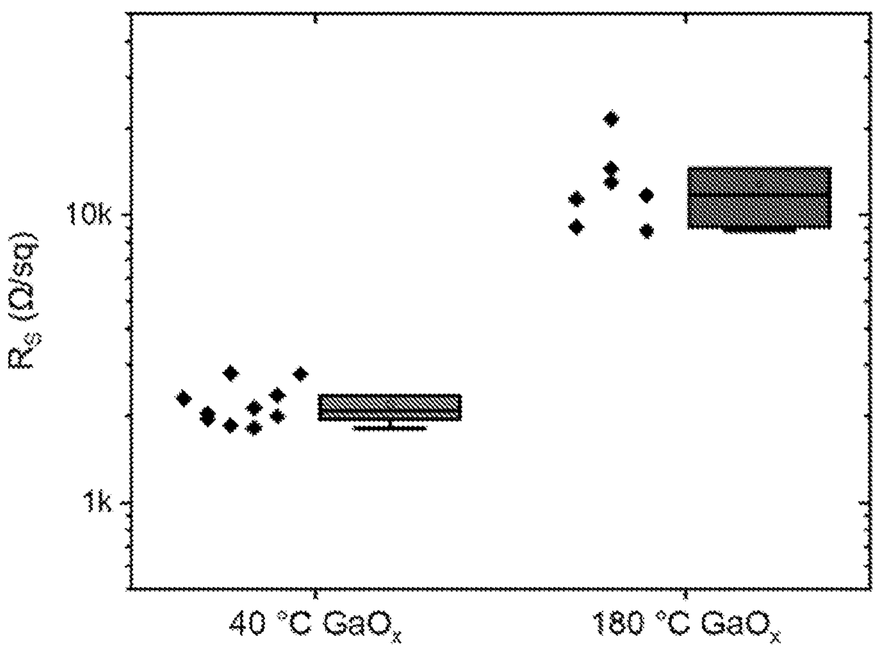
FIG. 39 shows sheet resistance of superlattice films composed of two layers of $InO_x$ with one layer of $GaO_x$ deposited at either 40° C. or 180° C. $InO_x$ was deposited at 180° C. A total thickness is approximately 11 nm for both films.

FIG. 31(*b*) shows the conductivity as a function of the ratio of $InO_x$ layers to $GaO_x$ layers. Enhancement with modulation doping is more effective for larger ratios of $InO_x$—$GaO_x$, reaching an optimal value at a ratio of 4-1. This can be understood by considering that $GaO_x$ is, itself, substantially less conductive than $InO_x$, with a conductivity of ≈0.01 S $cm^{-1}$ (FIG. 38), which could limit interlayer transport across the vertically overlapping grains. Electronic transport in 2D $InO_x$ studies have shown that this overlap can produce higher electron mobility, which explains the trend that stacking $InO_x$ layers can improve transport. To further understand the mechanism of the modulation doping, the CLMP was used to fabricate films capped by CLMP $AlO_x$, $SbO_x$, and $SnO_x$ for comparison (FIG. 34(*a*)) with the conductivity of pure $InO_x$ and films capped by $GaO_x$. Capping with $AlO_x$ shows an enhancement in conductivity comparable to $GaO_x$, but $SbO_x$ and $SnO_x$ have a substantially lower enhancement. This can be understood by considering the equilibrium band diagrams of these materials (FIG. 34(*b*)). Liquid metal printed $SnO_x$ (p-type) and $SbO_x$ are expected to have a lower lying Fermi level ($E_F$) compared to $AlO_x$ and $GaO_x$, which could suggest why their traps would not contribute to enhancing the $InO_x$ free carrier concentration. One possible mechanism to explain the enhanced conductivity is that $GaO_x$ and $AlO_x$ layers could induce Fermi-level pinning at the interface with $InO_x$. The $GaO_x$ layer, for example, is observed to be highly substoichiometric by XPS analysis, indicating a high concentration of oxygen vacancy defects expected to result in an $E_F$ closer to its conduction band based on recent computational studies. The importance of defects in the $GaO_x$ layer is demonstrated by measurements showing that more oxygen-deficient $GaO_x$ deposited at 40° C. results in substantially more conductive superlattices (two layers $InO_x$+one layer $GaO_x$) compared with $GaO_x$ deposited at 180° C. (FIG. 39). Modulation doping is also particularly successful in inducing high carrier concentration in these combinations of 2D $InO_x$ and wide bandgap $GaO_x$ because of the low processing temperatures available for both layers. The low process temperatures can avoid compensation by acceptor type defects that otherwise nullify gains in the free carrier concentration.

Figure 40:
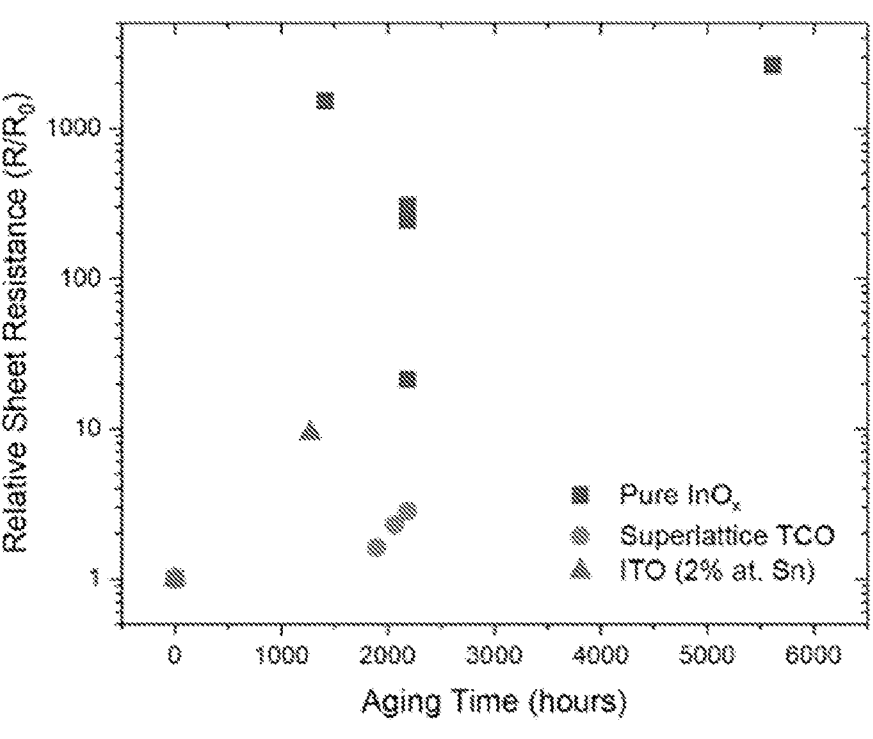
FIG. 40 is relative sheet resistance (normalized by starting sheet resistance) for aged samples of pure $InO_x$, ITO (2% at. Sn) superlattice (4-1 $InO_x$—$GaO_x$) films showing approximately 500× smaller change in conductivity with aging for approximately 2000 hours at room temperature at 35% relative humidity (RH). Multiple points in each series represent varying deposition temperatures from 180° C.-240° C.
Figure 41:
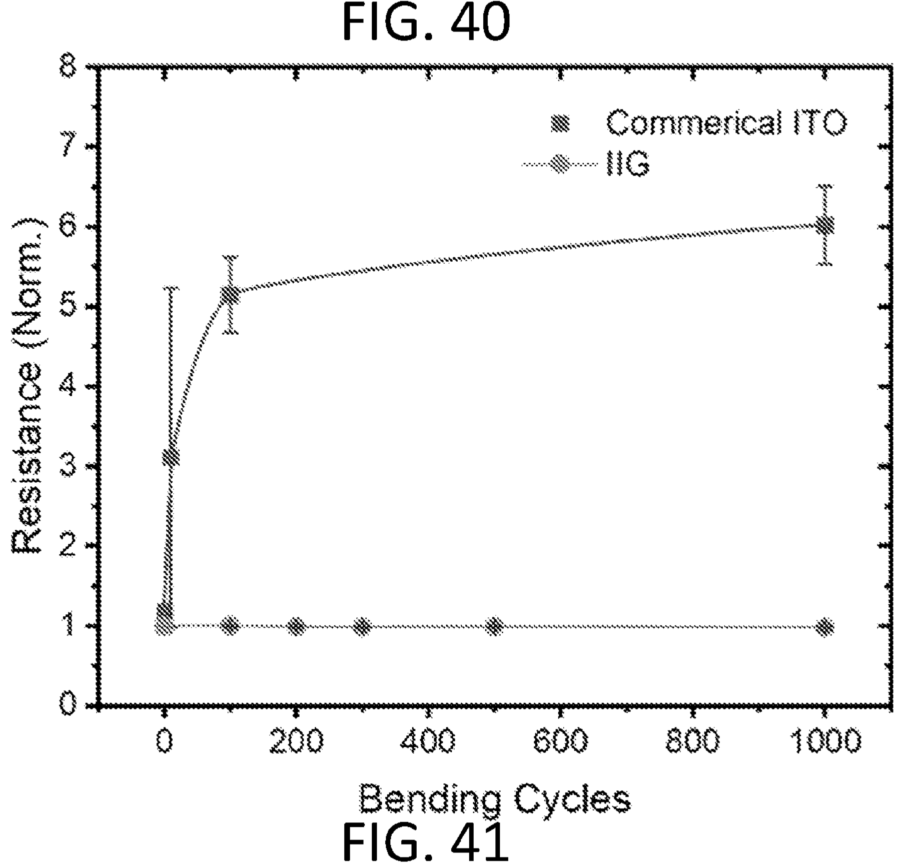
FIG. 41 shows a bending cycle comparison test at 0.5% strain (r=7.4 mm) between commercial ITO on PET and an IIG superlattice stack. Normalized resistance is computed by dividing by R0, the resistance before any bending cycles were performed.

The higher free carrier concentration induced by the $GaO_x$ heterointerface can result in substantial improvements to the long-term performance and stability of 2D TCOs. For example, comparison of printed films aged for ≈2000 h (≈3 months) at 25-35% relative humidity shows that the conductivity of the superlattice $InO_x$/$GaO_x$ TCOs is 10-100× more stable compared with that of the undoped and unpassivated pure $InO_x$ films, which degrade in conductivity by long term humid air exposure (FIG. 40). In comparison with tin-doped (2% at. Sn) ITO films printed by an equivalent CLMP process, superlattice TCOs are also 6× more stable over the course of long-term aging. This difference is likely due to the poor dopant activation of Sn in ITO that at low deposition temperatures. Additionally, the mechanical stability of the superlattice TCOs under uniaxial bending (FIG. 41) in comparison with thicker commercial ITO films on PET (≈200 nm) was examined. The disclosed superlattice TCOs (2-1 $InO_x$—$GaO_x$) printed on PEN substrates at 220° C. At a 7.4 mm bending radius, (≈0.5% strain), the disclosed 2D superlattice TCOs maintain a nearly identical sheet resistance after 1000× bending cycles whereas thicker commercial ITO has sheet resistance that increases by 500%. Thus, 2D TCOs can be a more strain tolerant material for flexible inorganic optoelectronics.

Figure 35:
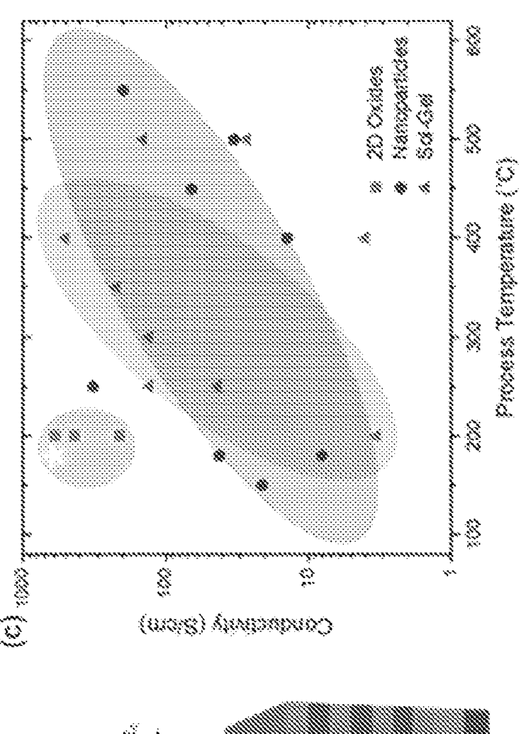
FIG. 35 shows (a) Hall mobility and carrier concentration of pure $InO_x$ and superlattice films of different $InO_x$—$GaO_x$ ratios; (b) band diagram and layer architecture illustrating electron donation in a superlattice TCO with alternating conducting $InO_x$ and $GaO_x$ modulation doping layers; and (c) performance comparison across printed transparent conductive oxides.
Figure 35:
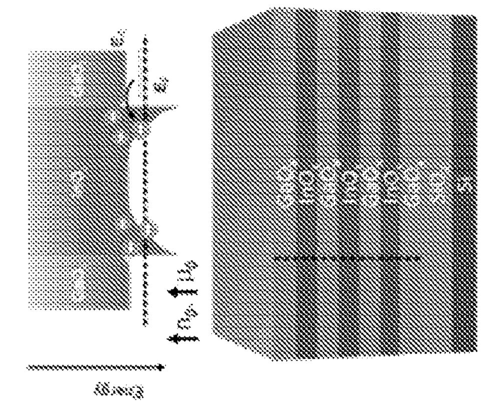
Figure 35:
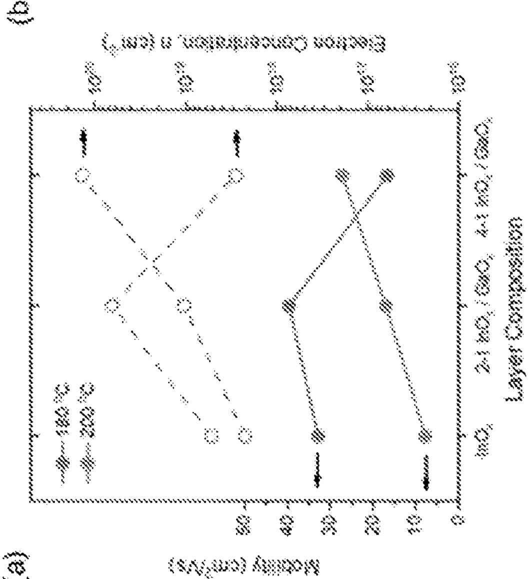

Room temperature Hall measurements (FIG. 35(*a*)) of the TCO superlattice films show the influence of modulation doping for enhancing both the carrier concentration as well as the Hall mobility ($\mu_0$). Films printed at 180 and 200° C. both exhibit the modulation doping effect, showing higher carrier concentration as a result of the $GaO_x$ heterointerface, which increase the carrier concentration by >10× to above 1020 $cm^{-3}$, consistent with observations of the Burstein Moss shift in the optical bandgap. These observations are consistent with defect modulation doping at the interface, as illustrated in FIG. 35(*b*). The Hall mobility of the undoped $InO_x$ films are 6 and 33 $cm^2$ $V^{-1}$ $s^{-1}$ while modulation doped films are enhanced to nearly 40 $cm^2$ $V^{-1}$ $s^{-1}$ even with the large increase in carrier concentration. For films processed at just 180° C. without any vacuum processing, the observed Hall mobility is improved compared with solution-processed materials based on sol-gels or nanoparticles indicating the high electronic quality of CLMP 2D oxides. This result is also consistent with liquid metal printed 2D $InO_x$ transistors with field effect mobility as high as 67 $cm^2$ $V^{-1}$ $s^{-1}$. The films with the highest carrier concentration in the range of $8\times10^{19}$-$2\times10^{20}$ have slightly lower Hall mobility in the range of 10-15 $cm^2$ $V^{-1}$ $s^{-1}$, which may indicate that these heterostructures induce additional trapped carrier scattering. These observations correspond with the trend that films with multiple layers of $InO_x$ are more conductive (FIG. 31(*b*)). Collectively, these results are consistent with defect modulation doping in amorphous and polycrystalline sputtered films.

The CLMP 2D oxides disclosed herein exhibit lower process temperatures but higher conductivity than printed TCOs formed by methods such as gravure and inkjet. The advantage of the embodiments disclosed herein is also that it can deposit highly crystalline but ultrathin 2D oxide layers. Liquid metal printing method allows crystallization at much lower temperatures than sol-gel materials. One advantage of these low temperature processing methods is facilitating device applications in structures such as photodetectors or printed thin film transistors, which can benefit from the high conductivity and high transmittance of 2D oxides.

The enhanced conductivity of these films compared to printed TCOs based on sol-gels and nanoparticles in FIG. 35(*c*). An objective in this field is to produce highly conductive TCOs using a minimal thermal budget to allow use of low-cost flexible polymer substrates, which have a thermal limit around 200° C. Improving the conductivity of these films may directly translate to an increase in the performance of large area printed electronic devices such as electrochromic windows, thin film solar cells, and thin film transistors. As shown in FIG. 35(*c*), CLMP 2D oxides offer a combination of both these critical properties that has not been attained via nanoparticle or sol-gel printing techniques. This trend is observed because nanoparticle films are limited by interparticle transport, requiring high temperatures to sinter the particles and improve conductivity. Similarly, sol-gels suffer from low conductivity due to insulating residues from incomplete decomposition of metal salt precursors at low-temperatures. The integrated thermal budget in the CLMP method is smaller due to the elimination of long (≈1 h) post-annealing steps used in most printed TCO processes. This rapid low-temperature processing and high conductivity make the CLMP approach a candidate for upscaling printed inorganic electronics.

In summary, a scalable, high-speed (6 m $min^{-1}$) roller-based continuous liquid metal printing (CLMP) method for fabricating 2D oxide superlattices on both rigid and flexible substrates is disclosed. A modulation doping method to enhance conductivity by stacking 2D oxides into multilayer superlattices with amorphous $GaO_x$ also is disclosed. With $InO_x/GaO_x$ superlattices, a 100× enhancement in conductivity is achieved while achieving visible range transmittance >98%. This represents a high conductivity for printed TCOs at plastic-compatible temperatures and a rapid and scalable method of TCO deposition that does not require post-annealing. These capabilities establish 2D oxides as a promising set of electrode materials for flexible optoelectronics such as photodetectors and displays.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. A liquid printing method comprising:

providing a first workpiece, wherein a surface of the first workpiece includes a dielectric;

providing a second workpiece that includes a metal; and applying the second workpiece onto the first workpiece at a first pressure such that the metal contacts the dielectric thereby forming an alloyed oxide film.

2. The method of claim 1, wherein the first workpiece and the second workpiece are substrates.

3. The method of claim 2, wherein the liquid printing occurs at a temperature of approximately 40° C. to 450° C.

4. The method of claim 2, wherein the liquid printing forms a monolayer film.

5. The method of claim 2, wherein the liquid printing forms a bilayer film.

6. The method of claim 2, wherein the liquid printing forms a multilayer film.

7. The method of claim 2, wherein the alloyed oxide film is nanocrystalline.

8. The method of claim 2, wherein the metal has a purity of at least 99%.

9. The method of claim 2, wherein the first pressure is from 10 psi to 10,000 psi.

10. The method of claim 2, wherein a duration of the applying at the first pressure is from 1-10 seconds.

11. The method of claim 2, wherein a speed of a spreading meniscus for the metal is from 0.1 cm/s to 60 cm/s.

12. The method of claim 2, wherein the first workpiece and/or the second workpiece is heated to above a melting point of the metal.

13. The method of claim 2, wherein the first workpiece and/or the second workpiece is heated to from 100° C. to 250° C.

14. The method of claim 2, wherein the first workpiece and/or the second workpiece is heated to at least 165° C. before the applying.

15. The method of claim 2, further comprising:

separating the first workpiece from the second workpiece after the applying; and removing the metal from the first workpiece and/or the second workpiece after the applying.

16. The method of claim 2, further comprising patterning the alloyed oxide film.

17. The method of claim 2, wherein the second workpiece is a plastic film.

18. The method of claim 17, wherein the plastic film is a polyimide, polyethylene naphthalate, or polyethylene terephthalate.

19. The method of claim 2, wherein a surface of the second workpiece further includes the dielectric, and wherein the dielectric is $SiO_2$.

20. The method of claim 2, wherein the metal includes In and the alloyed oxide film is an $InO_x$ film.

21. The method of claim 20, wherein the $InO_x$ film is from 94% to greater than 99% transmissive.

22. The method of claim 20, wherein the $InO_x$ film has a grain size from 6 nm to 45 nm.

23. The method of claim 2, wherein the metal includes In and the alloyed oxide film is a metal-doped $InO_x$ film.

24. The method of claim 23, wherein the metal-doped $InO_x$ film is indium tin oxide (ITO).

25. The method of claim 2, wherein the metal includes Sb and the alloyed oxide film is an antimony tin oxide film.

26. The method of claim 2, wherein the metal includes Ga.

27. The method of claim 2, wherein the metal includes Zn.

28. The method of claim 2, wherein the metal includes Sn.

29. The method of claim 2, wherein the alloyed oxide film is one of InZnO, $InGaZnO_x$, $InGaSnO_x$, $SnO_x$, $InSnO_x$, $GaSnO_x$, $SbSnO_x$, or $InGaO_x$.

30. The method of claim 2, wherein the dielectric is $SiO_x$, $AlO_x$, $YO_x$, $HfO_x$, $ZrO_x$, $LaO_x$, or a rare earth, high-k dielectric.

31. The method of claim 1, wherein the dielectric is $GaO_x$, the metal is In, the second workpiece is a roller, and wherein the applying includes rolling the roller over the first workpiece.

32. The method of claim 31, wherein the liquid printing occurs at a temperature of approximately 40° C. to 300° C.

33. The method of claim 31, further comprising applying a second $GaO_x$ layer to the alloyed oxide film and applying a second alloyed oxide film to the second $GaO_x$ layer.

34. The method of claim 31, wherein the first pressure using the roller is from 0.1 N/cm of roller width to 100 N/cm of roller width.

35. The method of claim 31, wherein the metal and the first workpiece have a temperature from 40° C. to 450° C. during the applying.

36. A liquid metal printed 2D alloyed oxide film transistor formed using the method of claim 1.

37. The liquid metal printed 2D alloyed oxide film transistor of claim 36, wherein the alloyed oxide film is $InO_x$.

38. The liquid metal printed 2D alloyed oxide film transistor of claim 37, wherein the 2D alloyed oxide film transistor has one or more arrays with a total area of at least 20 $cm^2$.

* * * * *